US009747962B2

(12) United States Patent
Nagatsuka et al.

(10) Patent No.: US 9,747,962 B2
(45) Date of Patent: Aug. 29, 2017

(54) SEMICONDUCTOR DEVICE, ELECTRONIC COMPONENT, AND ELECTRONIC DEVICE

(71) Applicant: SEMICONDUCTOR ENERGY LABORATORY CO., LTD., Atsugi-shi, Kanagawa-ken (JP)

(72) Inventors: Shuhei Nagatsuka, Kanagawa (JP); Tomoaki Atsumi, Kanagawa (JP); Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 15/125,658

(22) PCT Filed: Mar. 5, 2015

(86) PCT No.: PCT/IB2015/051600
§ 371 (c)(1),
(2) Date: Sep. 13, 2016

(87) PCT Pub. No.: WO2015/136414
PCT Pub. Date: Sep. 17, 2015

(65) Prior Publication Data
US 2017/0004865 A1 Jan. 5, 2017

(30) Foreign Application Priority Data
Mar. 14, 2014 (JP) .................. 2014-051500

(51) Int. Cl.
*G11C 7/22* (2006.01)
*G11C 11/405* (2006.01)
(Continued)

(52) U.S. Cl.
CPC .................. *G11C 7/22* (2013.01); *G11C 5/14* (2013.01); *G11C 11/405* (2013.01);
(Continued)

(58) Field of Classification Search
CPC ........... G11C 7/22; G11C 5/14; G11C 11/405; G11C 11/465; G11C 27/005;
(Continued)

(56) References Cited

U.S. PATENT DOCUMENTS 8,488,394 B2  7/2013 Nagatsuka et al.
8,605,477 B2 * 12/2013 Takemura ............. G11C 11/404
                                                             365/149

(Continued)

FOREIGN PATENT DOCUMENTS

JP   2011-129898 A   6/2011
JP   2011-129899 A   6/2011
(Continued)

OTHER PUBLICATIONS

International Search Report (Application No. PCT/IB2015/051600) Dated Jun. 9, 2015.
(Continued)

*Primary Examiner* — Tan T. Nguyen
(74) *Attorney, Agent, or Firm* — Fish & Richardson P.C.

(57) ABSTRACT

A semiconductor device which can write and read multilevel data is provided. A node connecting a source or a drain of an OS transistor and a gate of an OS transistor can hold the distribution of a plurality of potentials. A circuit configuration is employed in which the potential of the node is changed by capacitive coupling to control a conduction state of the OS transistor whose gate is connected thereto so that the potential of a gate of a Si transistor is changed. The potential of the gate of the Si transistor is changed positively in accordance with the potential change by capacitive coupling and is changed negatively in accordance with another transistor. In accordance with a change in value of current flowing through the Si transistor is detected, written data is read.

12 Claims, 34 Drawing Sheets

(51) Int. Cl.
  *H01L 29/786* (2006.01)
  *G11C 11/56* (2006.01)
  *G11C 27/00* (2006.01)
  *H01L 27/06* (2006.01)
  *H01L 27/12* (2006.01)
  *G11C 5/14* (2006.01)
  *H01L 27/108* (2006.01)
  *H01L 27/1156* (2017.01)
  *H01L 27/088* (2006.01)

(52) U.S. Cl.
  CPC .......... *G11C 11/565* (2013.01); *G11C 27/005* (2013.01); *H01L 27/0688* (2013.01); *H01L 27/1225* (2013.01); *H01L 29/786* (2013.01); *H01L 27/088* (2013.01); *H01L 27/108* (2013.01); *H01L 27/1156* (2013.01)

(58) Field of Classification Search
  CPC ............. H01L 27/0688; H01L 27/1225; H01L 27/108; H01L 29/786
  USPC ...... 365/189.11, 63, 72, 149, 189.03, 230.05
  See application file for complete search history.

(56) References Cited

U.S. PATENT DOCUMENTS

| | | | |
|---|---|---|---|
| 8,614,916 B2 | 12/2013 | Nagatsuka et al. | |
| 8,637,861 B2 | 1/2014 | Yamazaki et al. | |
| 8,675,394 B2* | 3/2014 | Matsubayashi | G11C 16/0433 257/300 |
| 8,748,880 B2 | 6/2014 | Yamazaki et al. | |
| 8,837,232 B2 | 9/2014 | Nagatsuka et al. | |
| 9,305,630 B2 | 4/2016 | Kurokawa | |
| 2011/0121284 A1 | 5/2011 | Yamazaki et al. | |
| 2011/0121288 A1 | 5/2011 | Yamazaki et al. | |
| 2011/0249484 A1* | 10/2011 | Takemura | G11C 11/404 365/72 |
| 2012/0033488 A1 | 2/2012 | Nagatsuka et al. | |
| 2012/0033510 A1 | 2/2012 | Nagatsuka et al. | |
| 2012/0113707 A1* | 5/2012 | Takemura | G11C 11/404 365/149 |
| 2012/0294070 A1* | 11/2012 | Matsuzaki | G11C 11/404 365/149 |
| 2014/0043093 A1* | 2/2014 | Yamazaki | H03K 3/012 327/437 |
| 2014/0269063 A1* | 9/2014 | Nagatsuka | G11C 16/24 365/185.05 |
| 2014/0286073 A1* | 9/2014 | Onuki | G11C 11/403 365/63 |
| 2015/0001529 A1 | 1/2015 | Kurokawa | |
| 2015/0023114 A1 | 1/2015 | Kurokawa | |
| 2015/0243332 A1* | 8/2015 | Koyama | G11C 5/063 365/72 |
| 2016/0064400 A1* | 3/2016 | Kurokawa | H01L 29/7869 257/43 |

FOREIGN PATENT DOCUMENTS

| | | |
|---|---|---|
| JP | 2012-256400 A | 12/2012 |
| JP | 2012-256401 A | 12/2012 |
| JP | 2015-028829 A | 2/2015 |
| JP | 2015-038797 A | 2/2015 |
| KR | 2012-0092667 A | 8/2012 |
| KR | 2012-0106761 A | 9/2012 |
| KR | 2013-0098312 A | 9/2013 |
| WO | WO-2011/062041 | 5/2011 |
| WO | WO-2011/062057 | 5/2011 |
| WO | WO-2012/017844 | 2/2012 |

OTHER PUBLICATIONS

Written Opinion (Application No. PCT/JP/IB2015/051600) Dated Jun. 9, 2015.

* cited by examiner

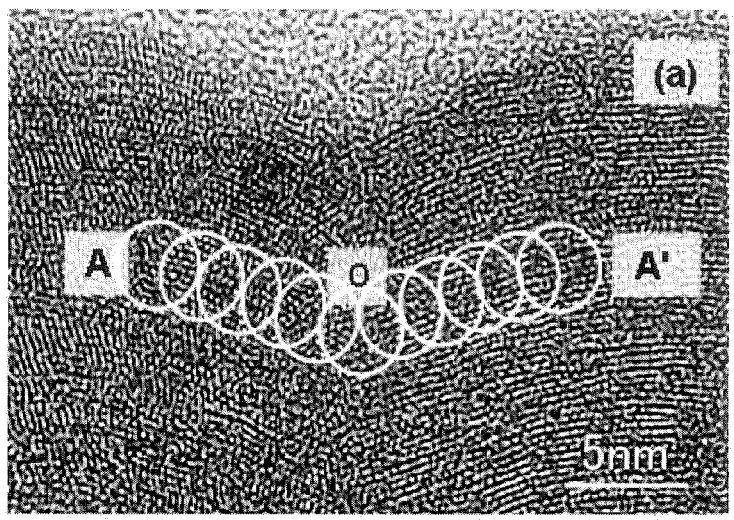
FIG. 13A
FIG. 13B
FIG. 13C
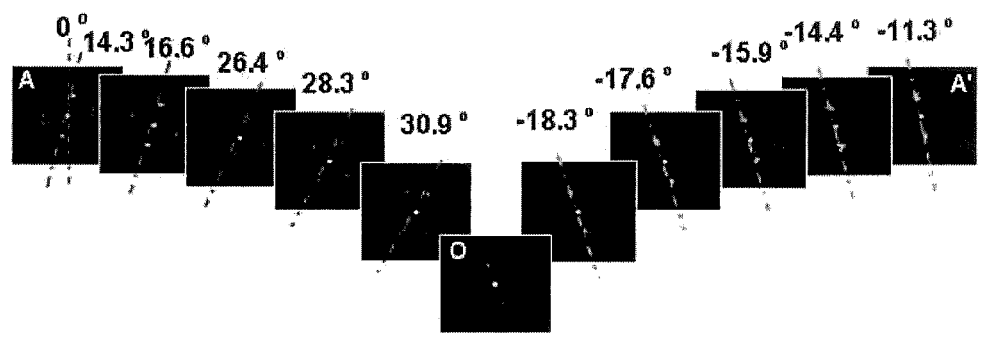

CAAC-OS nc-OS

□ proportion of non-CAAC  ☰ proportion of CAAC as-sputtered

450°C after heat treatment

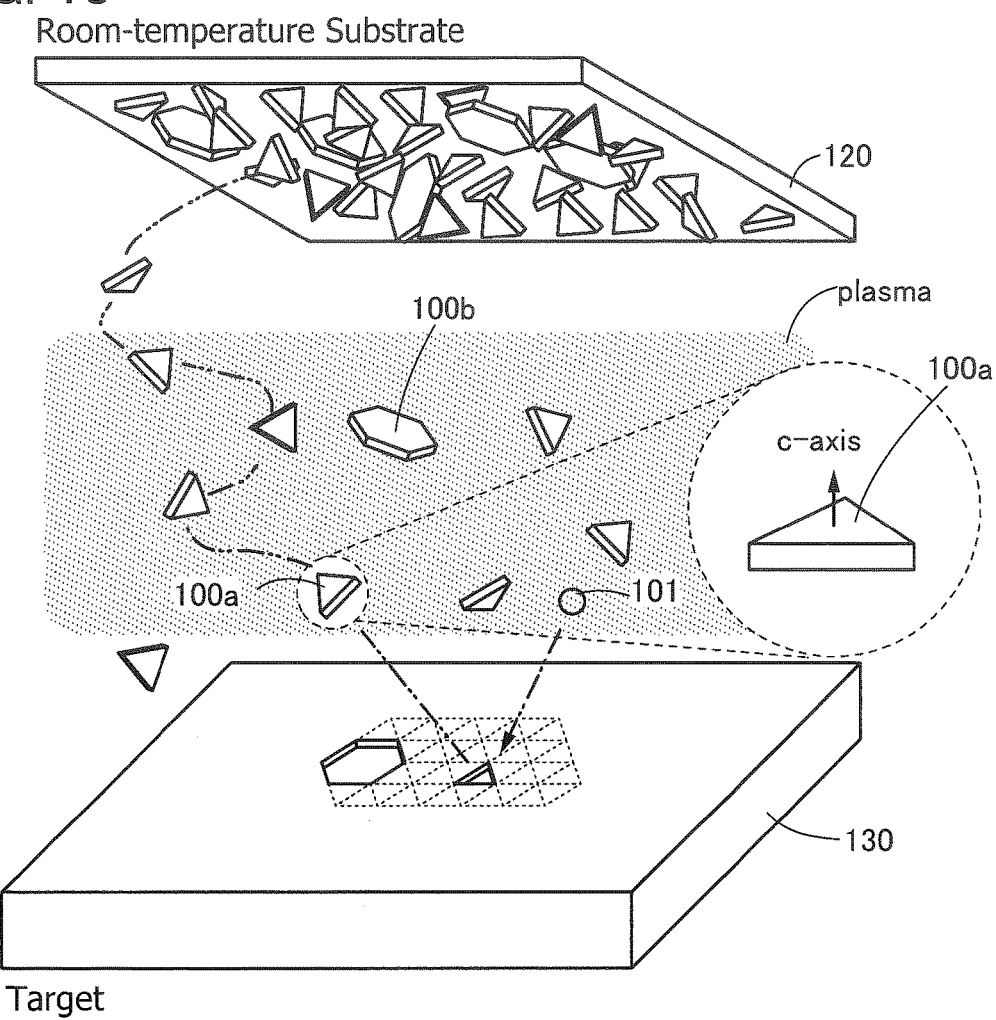

Heated Substrate

Heated Substrate

InGaZnO₄

FIG. 23A
FIG. 23B
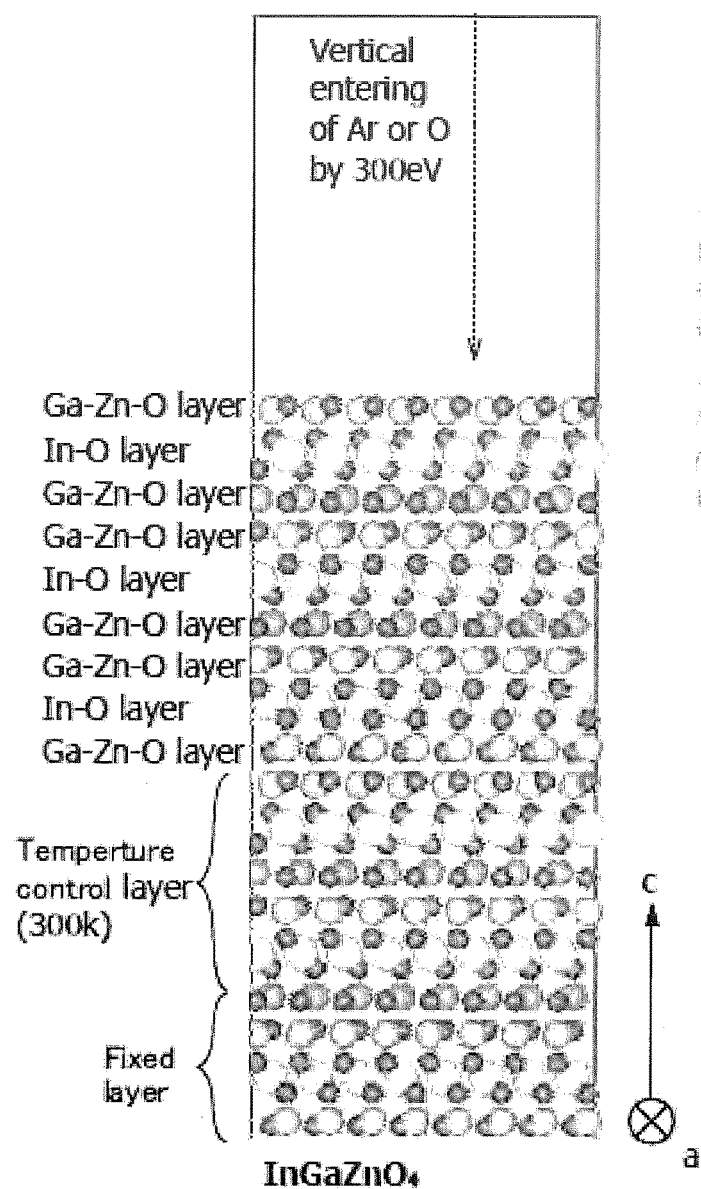
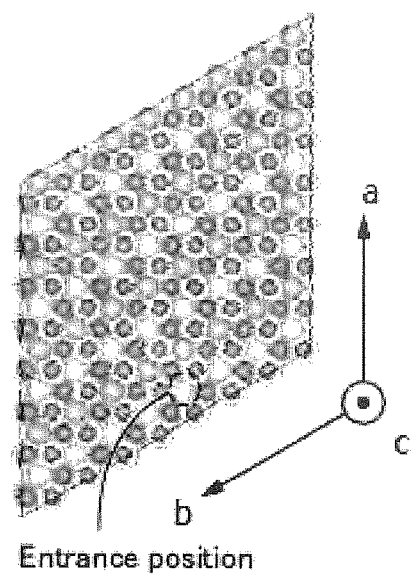

FIG. 24A
FIG. 24B
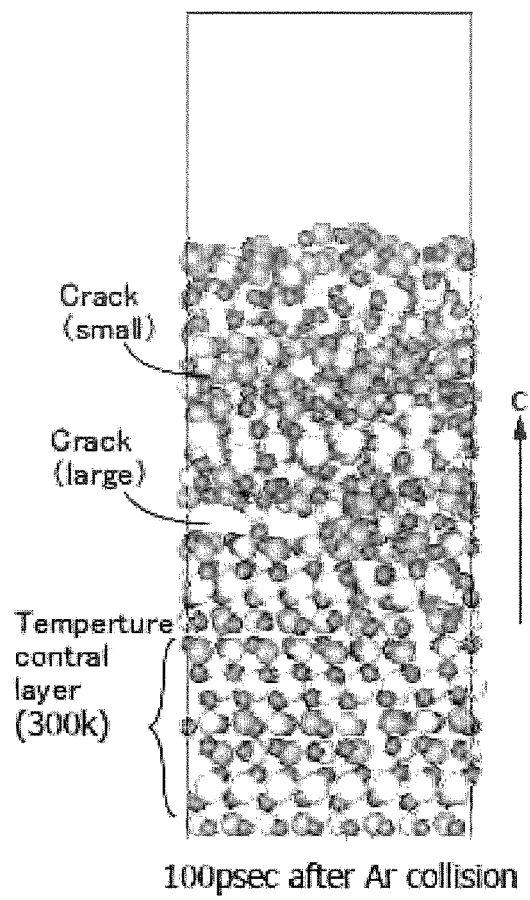
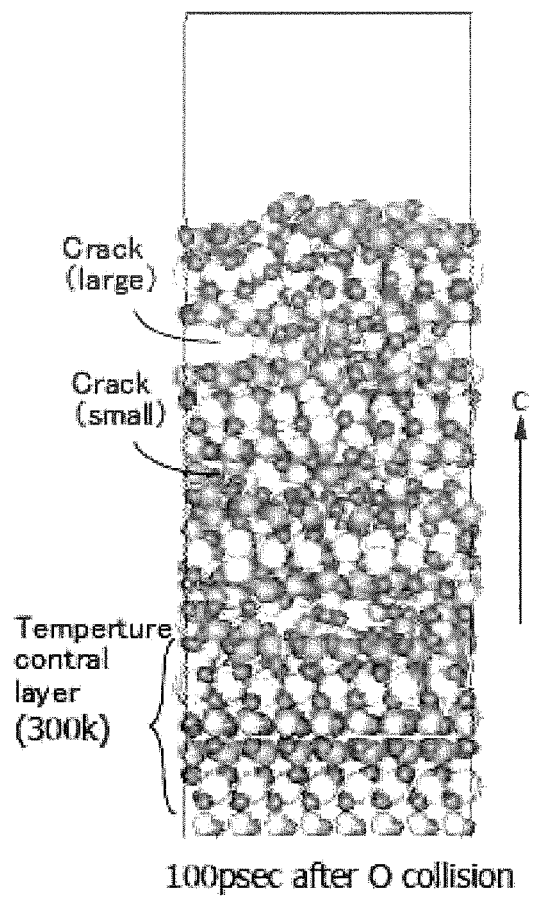

Zinc reaches vicinity of
sixth layer (Zn-O layer)
from third layer (Zn-O layer)

Trajectories of atoms
0-0.3psec after Ar entrance

Zinc does not reach
fifth layer (In-O layer)
from third layer (Zn-O layer)

Trajectories of atoms
0-0.3psec after O entrance

CAAC-OS film

Target

SEMICONDUCTOR DEVICE, ELECTRONIC COMPONENT, AND ELECTRONIC DEVICE

TECHNICAL FIELD

One embodiment of the present invention relates to a semiconductor device, an electronic component, or an electronic device.

Note that one embodiment of the present invention is not limited to the above-described technical field. The technical field of the invention disclosed in this specification and the like relates to an object, a method, or a manufacturing method. In addition, one embodiment of the present invention relates to a process, a machine, manufacture, or a composition of matter (a composition of matter). Therefore, specific examples of the technical field of one embodiment of the present invention disclosed in this specification include a semiconductor device, a display device, a light-emitting device, a power storage device, a memory device, a method for driving any of them, and a method for manufacturing any of them.

BACKGROUND ART

A semiconductor device capable of holding data that includes a transistor whose semiconductor layer is formed using silicon (Si) and a transistor whose semiconductor layer is formed using an oxide semiconductor (Oxide Semiconductor: OS) has attracted attention (see Patent Document 1).

In recent years, with an increase in the amount of data manipulated, a semiconductor device having a large storage capacity has been required. In such a situation, the semiconductor device disclosed in Patent Document 1 has a structure in which electric charge is held using a transistor whose semiconductor layer includes an oxide semiconductor (OS transistor) to read the data.

REFERENCE

Patent Document

[Patent Document 1] Japanese Published Patent Application No. 2012-256400

SUMMARY OF THE INVENTION

Problems to be Solved by the Invention

In order to increase the amount of data stored in one memory cell, that is, to achieve data multiplication, it is effective to expand the distribution of potentials which are switched by holding of electric charge.

However, when a potential is increased to expand the potential distribution, resistance to high voltages (also referred to as voltage resistance) in a transistor for reading potentials arises as a problem.

As the transistor for reading potentials, a transistor whose semiconductor layer contains silicon (Si transistor) is used. When the voltage resistance of the Si transistor is taken into consideration, the upper limit of potentials for expanding the potential distribution is a few V.

An object of one embodiment of the present invention is to provide a semiconductor device or the like having a novel structure.

Alternatively, an object of one embodiment of the present invention is to provide a semiconductor device or the like having a novel structure capable of expanding the potential distribution for data multiplication. Alternatively, an object of one embodiment of the present invention is to provide a semiconductor device or the like having a novel structure in which the potential distribution can be expanded for data multiplication without need for high voltage resistance of a Si transistor for reading data.

Note that the objects of the present invention are not limited to the above objects. The above objects do not disturb the existence of other objects. Note that the other objects are the ones that are not described above and will be described below. The other objects not described above will be apparent from and can be derived from the description of the specification, the drawings, and the like by those skilled in the art. Note that one embodiment of the present invention is to solve at least one of the aforementioned objects and the other objects.

Means for Solving the Problems

One embodiment of the present invention is a semiconductor device including a first transistor, a second transistor, a third transistor, a fourth transistor, and a capacitor. A gate of the first transistor is electrically connected to a first wiring. One of a source and a drain of the first transistor is electrically connected to a second wiring. A gate of the second transistor is electrically connected to the other of the source and the drain of the first transistor. One of a source and a drain of the second transistor is electrically connected to a third wiring. A gate of the third transistor is electrically connected to a fourth wiring. One of a source and a drain of the third transistor is electrically connected to the other of the source and the drain of the second transistor. The other of the source and the drain of the third transistor is electrically connected to a fifth wiring. A gate of the fourth transistor is electrically connected to the other of the source and the drain of the second transistor. One of a source and a drain of the fourth transistor is electrically connected to a sixth wiring. The other of the source and the drain of the fourth transistor is electrically connected to a seventh wiring. One electrode of the capacitor is electrically connected to the gate of the second transistor. The other electrode of the capacitor is electrically connected to an eighth wiring. The first wiring has a function of transmitting a first signal. The second wiring has a function of transmitting a second signal. The third wiring has a function of transmitting a first potential. The fourth wiring has a function of transmitting a third signal. The fifth wiring has a function of transmitting a second potential. The sixth wiring has a function of supplying current in accordance with a potential of the gate of the fourth transistor. The seventh wiring has a function of supplying current in accordance with a potential of the gate of the fourth transistor. The eighth wiring has a function of transmitting a fourth signal. The first signal has a function of bringing the first transistor into a conduction state to supply a potential of the second signal to the gate of the second transistor. The first signal has a function of bringing the first transistor into a non-conduction state so that the potential of the second signal is held in the gate of the second transistor. The fourth signal has a function of lowering a potential of the gate of the second transistor and changing the conduction state of the second transistor to supply the first potential to the gate of the fourth transistor. The third signal has a function of bringing the third transistor into the conduction state to supply the second potential to the gate of the fourth transistor. A semiconductor layer of each of the first transistor, the second transistor, and the third transistor includes an oxide semiconductor. A semiconductor layer of the fourth transistor includes silicon.

Note that other embodiments of the present invention will be described in the following embodiments with reference to the drawings.

EFFECT OF THE INVENTION

According to one embodiment of the present invention, a semiconductor device or the like having a novel structure can be provided.

Alternatively, a semiconductor device or the like having a novel structure capable of expanding the potential distribution for data multiplication can be provided. Alternatively, one embodiment of the present invention can provide a semiconductor device or the like having a novel structure in which the potential distribution can be expanded for data multiplication without need for high voltage resistance of a Si transistor for reading data.

Note that the effects of the present invention are not limited to the above effects. The above effects do not disturb the existence of other effects. Note that the other effects are the ones that are not described above and will be described below. The other effects not described above will be apparent from and can be derived from the description of the specification, the drawings, and the like by those skilled in the art.

BRIEF DESCRIPTION OF DRAWINGS

FIGS. 13A to 13C are high-resolution cross-sectional TEM images and a local Fourier transform image of an oxide semiconductor.

FIG. 18 is a schematic view illustrating a deposition model of an nc-OS and a pellet.

FIGS. 23A and 23B show a structure of $InGaZnO_4$ before collision of an atom, and the like.

FIGS. 24A and 24B illustrate a structure of $InGaZnO_4$ and the like after an atom collides.

BEST MODE FOR CARRYING OUT THE INVENTION

Figure 1:
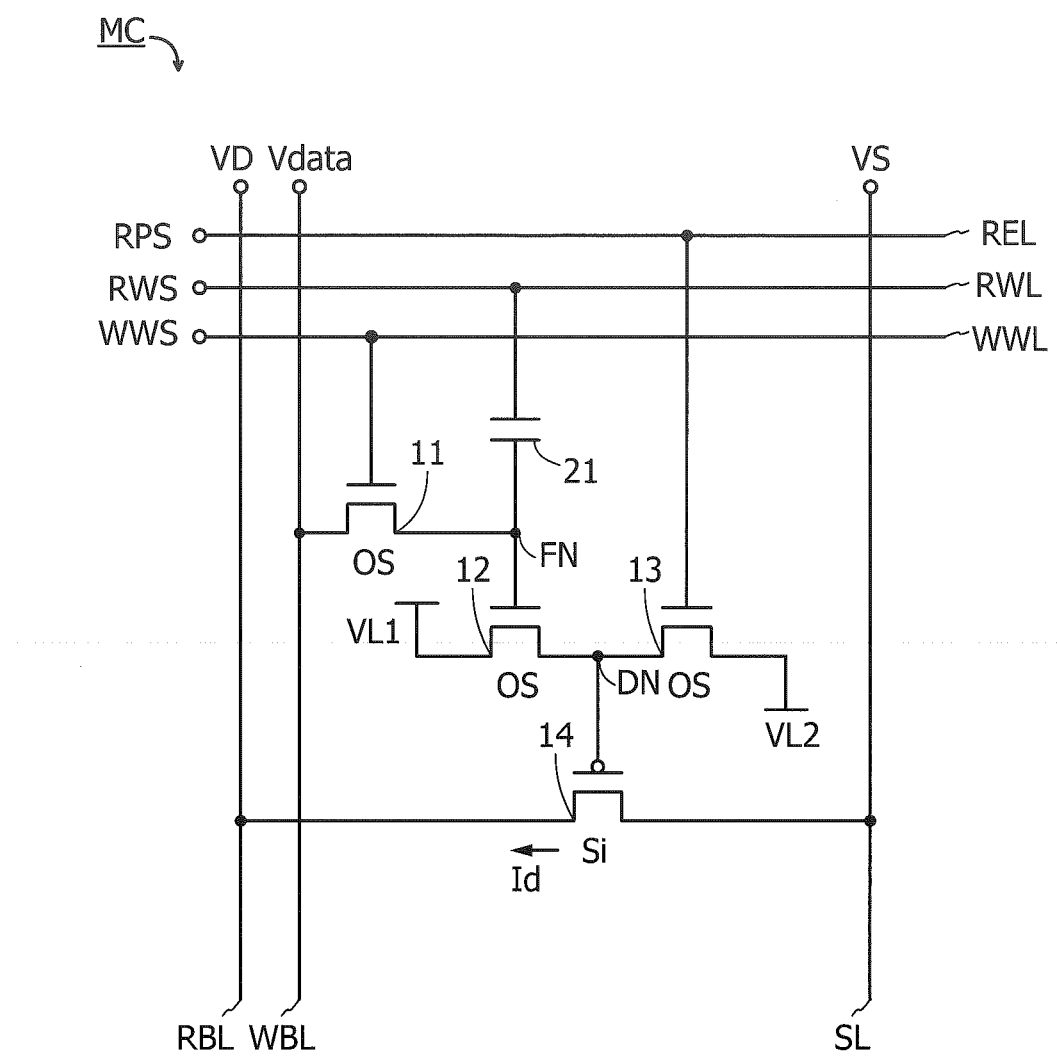
FIG. 1 is a circuit diagram illustrating one embodiment of the present invention.

Hereinafter, embodiments will be described with reference to drawings. However, the embodiments can be implemented with various different modes, and it will be readily appreciated by those skilled in the art that modes and details can be changed in various ways without departing from the spirit and scope. Thus, the present invention should not be interpreted as being limited to the following description of the embodiments.

In addition, in the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, the following can be included: variation in signal, voltage, or current due to noise or variation in signal, voltage, or current due to difference in timing.

In addition, in this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, operating conditions, and the like of the transistor, it is difficult to define which is a source or a drain. Thus, a portion that functions as a source or a portion that functions as a drain is not referred to as a source or a drain in some cases, in which case one of the source and the drain is referred to as a first electrode, and the other of the source and the drain is referred to as a second electrode.

Note that in this specification, ordinal numbers such as "first", "second", and "third" are used in order to avoid confusion among components, and thus do not limit the number of the components.

Note that in this specification, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Note that in this specification, terms for describing arrangement, such as "over" and "under", are used for convenience for describing the positional relation between components with reference to drawings. Furthermore, the positional relation between components is changed as appropriate in accordance with a direction in which each component is described. Thus, there is no limitation on terms used in this specification, and terms can be changed appropriately depending on the situation.

Note that the layout of circuit blocks in a block diagram in a drawing specifies the positional relation for description. Even when a drawing shows that different functions are achieved in different circuit blocks, an actual circuit block may be configured so that the different functions are achieved in the same circuit block. The functions of circuit blocks in diagrams are specified for description, and even in the case where one circuit block is illustrated, blocks might be provided in an actual circuit block so that processing performed by one circuit block is performed by a plurality of circuit blocks.

In this specification, "parallel" indicates that the angle formed between two straight lines is greater than or equal to $-10°$ and less than or equal to $10°$, and accordingly also includes the case of greater than or equal to $-5°$ and less than or equal to $5°$. In addition, "perpendicular" indicates that the angle formed between two straight lines is greater than or equal to $80°$ and less than or equal to $100°$, and accordingly also includes the case of greater than or equal to $85°$ and less than or equal to $95°$.

In addition, in this specification, trigonal and rhombohedral crystals are included in a hexagonal crystal system.

(Embodiment 1)

In this embodiment, a circuit configuration and operation of a memory cell included in a semiconductor device according to one embodiment of the invention to be disclosed will be described with reference to FIG. 1.

Note that a semiconductor device refers to a device including a semiconductor element. Note that the semiconductor device includes a driver circuit or the like for driving a circuit including a semiconductor element. Note that a semiconductor device includes a memory cell, and in some cases, further includes a driver circuit, a power supply circuit, or the like provided over another substrate.

<Circuit Configuration Examples of Memory Cell>

FIG. 1 is a circuit diagram showing an example of a memory cell MC.

The memory cell MC shown in FIG. 1 includes a transistor 11, a transistor 12, a transistor 13, a transistor 14, and a capacitor 21. Note that a plurality of the memory cells MC is actually provided in a matrix, though not illustrated in FIG. 1.

A gate of the transistor 11 is connected to a wiring WWL. In addition, one of a source and a drain of the transistor 11 is connected to a wiring WBL. In addition, the other of the source and the drain of the transistor 11 is connected to a gate of the transistor 12. In addition, the other of the source and the drain of the transistor 11 is connected to one electrode of the capacitor 21.

The gate of the transistor 12 is connected to the other of the source and the drain of the transistor 11. In addition, the gate of the transistor 12 is connected to the one electrode of the capacitor 21. In addition, one of a source and a drain of the transistor 12 is connected to a wiring VL1. In addition, the other of the source and the drain of the transistor 12 is connected to a gate of the transistor 14. In addition, the other of the source and the drain of the transistor 12 is connected to one of a source and a drain of the transistor 13.

A gate of the transistor 13 is connected to a wiring REL. In addition, one of a source and a drain of the transistor 13 is connected to the other of the source and the drain of the transistor 12. In addition, the one of the source and the drain of the transistor 13 is connected to the gate of the transistor 14. In addition, the other of the source and the drain of the transistor 13 is connected to a wiring VL2.

The one electrode of the capacitor 21 is connected to the other of the source and the drain of the transistor 11. In addition, the one electrode of the capacitor 21 is connected to the gate of the transistor 12. In addition, the other electrode of the capacitor 21 is connected to a wiring RWL.

Note that in FIG. 1, a node between the transistor 11, the transistor 12, and the capacitor 21 is referred to as a node FN. In addition, in FIG. 1, a node between the transistor 12, the transistor 13, and the capacitor 21 is referred to as a node DN.

The above-described transistors 11 to 13 are transistors whose semiconductor layers contain oxide semiconductors (OS transistors). The OS transistor has an extremely smaller off-state current than a transistor whose semiconductor layer contains silicon (Si transistor). In addition, the OS transistor has a better resistance to high voltages (voltage resistance) than the Si transistor.

Thus, in the memory cell structure of FIG. 1, the transistor 11 is brought into the non-conduction state, whereby electric charge can be held in the node FN which is in the electrically floating state. In addition, in the holding of electric charge, potentials supplied to the node FN can be increased utilizing excellent voltage resistance of the OS transistor, which expands the distribution of potentials which can be held. Therefore, the number of data stored in one memory cell can be increased, that is, data multiplication can be achieved.

For example, in the case where distribution of 8-level potentials can be held at a voltage of 2.5 V, distribution of 32-level potentials can be held at a voltage of 10 V. In the memory cell structure of FIG. 1, the transistor 12 whose gate is connected to the node FN is also an OS transistor. Thus, in the case where the transistor 12 is an OS transistor, the transistor can have better voltage resistance than a Si transistor.

In the case of reducing the transistor size in order to reduce the area of a memory cell, a gate insulating film of a Si transistor needs to be thinned in accordance with the scaling law; however, the voltage resistance is decreased accordingly. Whereas in the case of an OS transistor, there is no need to thin a gate insulating film when the transistor size is reduced to reduce the area of a memory cell. Thus, a transistor with favorable voltage resistance between a source and a drain and favorable voltage resistance between a gate and the source or the drain can be used. Therefore, it is further preferable that a transistor with favorable voltage resistance be used as each of the transistors 11 and 12 among the OS transistors.

In addition, the transistor 13 in the structure of FIG. 1 is an OS transistor but may be a Si transistor. Alternatively, an OS transistor with favorable switching characteristics is preferable. In order to make the transistor 13 to have favorable switching characteristics, the gate insulating film of the transistor is made thinner than that of the transistor 11 or 12.

Note that in the circuit diagrams of the drawing, in order to indicate an OS transistor, characters, OS are shown besides. In addition, the OS transistor is an n-channel transistor unless otherwise specified. Therefore, in each of the transistors 11 to 13, when a signal supplied to a gate is at H level, conduction is made between a source and a drain; and when the signal is at L level, no conduction is made.

The gate of the transistor 14 is connected to the other of the source and the drain of the transistor 12. In addition, the gate of the transistor 14 is connected to the one of the source and the drain of the transistor 13. In addition, the one of the source and the drain of the transistor 14 is connected to a wiring RBL. In addition, the other of the source and the drain of the transistor 14 is connected to a wiring SL.

The transistor 14 is explained as a p-channel transistor. In the transistor 14, as a node DN which is a potential of the gate gets H level, a current Id flowing between the source and the drain is reduced; and as it gets L level, the current Id is increased.

The above-described transistor 14 is a Si transistor. A Si transistor has higher field-effect mobility (also simply referred to as mobility) than an OS transistor. Thus, in the transistor 14, the current Id flowing between the source and the drain can be large.

Note that in the circuit diagrams of the drawing, in order to indicate a Si transistor, characters, Si are shown besides.

The wiring WWL is a wiring having a function of receiving a write word signal WWS. The write word signal WWS is a signal for bringing the transistor 11 into the conduction state so that the potential of the wiring WBL can be supplied to the node FN. The write word signal WWS is a signal for turning off the transistor 11 so that electric charge corresponding to the potential supplied to the node FN can be held.

The wiring WBL is a wiring having a function of receiving a data signal Vdata. The data signal Vdata is a signal for storing multilevel data in the memory cell MC. The multilevel data is $2^k$-level data in the case of k-bit (k is a natural number of 2 or more) data. Specifically, 8-bit corresponds to 256-level data, and the data signal Vdata is a signal having any one of 256-level potentials.

The wiring RWL is a wiring having a function of receiving a read word signal RWS. The read word signal RWS is a signal for supplying a potential in data reading so that the potential of the node FN can be gradually switched utilizing capacitive coupling of the capacitor 21. In addition, the read word signal RWS is a signal for supplying a fixed potential in data writing.

As described above, in the memory cell structure in FIG. 1, the transistors 11 and 12 are transistors with favorable voltage resistance. Thus, the number of potentials of the wiring WWL, the wiring WBL, and the wiring RWL can be increased, so that the range of potentials the node FN can have is extended and thus the potential distribution can be expanded. Note that a potential supplied to the wiring WWL, the wiring WBL, the wiring RWL, and the node FN is explained as Vos.

The wiring VL1 is a wiring having a function of receiving a potential V1. In addition, the wiring VL2 is a wiring having a function of receiving a potential V2. It is preferable that the potential V1 be a potential larger than the potential V2.

Note that the potential V1 and the potential V2 are potentials supplied to the gate of the transistor 14. The transistor 14 is a Si transistor and has poorer voltage resistance than the OS transistor described above. For this reason, a potential supplied to the transistor 14 as the potential V1 and the potential V2 is preferably smaller than potentials of the wiring WWL, the wiring WBL, and the wiring RWL. In other words, when the potential supplied to the transistor 14 is referred to as Vsi, Vsi is a potential smaller than Vos described above.

The wiring REL is a wiring having a function of receiving a read pulse signal RPS. The reading pulse signal RPS is a signal for bringing the transistor 13 into the conduction state or the non-conduction state in order to periodically supply the potential of the wiring VL2 to the node DN in data reading. In addition, the reading pulse signal RPS is a signal for bringing the transistor 13 into the non-conduction state when data writing.

The wiring RBL is a wiring having a function of receiving a potential VD. In addition, the wiring SL is a wiring having a function of receiving a potential VS.

The potential VD is explained as a potential higher than the potential VS. Note that in FIG. 1, the transistor 14 is explained as a p-channel transistor, and the current Id flows through the transistor 14 in accordance with the potential of the node DN.

Note that in this specification, writing of data to the memory cell means that the write word signal WWS is set at H level so that the potential of the floating node FN becomes equal to the potential of the bit line BL. In addition, reading of data from the memory cell means that the read pulse signal RPS and the read word signal RWS are controlled to change the potential of the node DN, whereby the current Id is changed in accordance with the potential of the node FN.

In the structure of FIG. 1 which is one embodiment of the present invention, the node FN connecting the source or the drain of the transistor 11 and the gate of the transistor 12 can hold the distribution of a plurality of potentials. The structure of FIG. 1 is configured to read data without applying Vos of the node FN directly to the transistor 14 for reading data. The transistor 14 for reading data is supplied with Vsi which is smaller than Vos, and data reading by a Si transistor whose mobility is larger than that of an OS transistor is achieved.

<OS Transistor>

Next, an OS transistor which can be used as the transistors 11 to 13 of FIG. 1 will be described in detail. The OS transistor is a transistor with a favorable voltage resistance and an extremely small off-state current.

First, the extremely small off-state current of the OS transistor is described.

The off-state current of an OS transistor can be reduced by reducing the concentration of impurities in an oxide semiconductor to make the oxide semiconductor intrinsic or substantially intrinsic. Here, substantially intrinsic means a state where the carrier density in an oxide semiconductor is lower than $1\times10^{17}/cm^3$, preferably lower than $1\times10^{15}/cm^3$, further preferably lower than $1\times10^{13}/cm^3$. In the oxide semiconductor, hydrogen, nitrogen, carbon, silicon, and metal elements other than main components are impurities. For example, hydrogen and nitrogen contribute to formation of donor levels to increase the carrier density.

A transistor using an intrinsic or substantially intrinsic oxide semiconductor has a low carrier density and thus is less likely to have negative threshold voltage. In addition, because of few carrier traps in the oxide semiconductor, the transistor including the oxide semiconductor has small variation in electrical characteristics and has high reliability. Furthermore, a transistor including the oxide semiconductor enables to make the off-state current extremely low.

Note that the OS transistor with reduced off-state current can exhibit a normalized off-state current per μm in channel width of $1 \times 10^{-18}$ A or less, preferably $1 \times 10^{-21}$ A or less, more preferably $1 \times 10^{-24}$ A or less at room temperature (approximately 25° C.), or $1 \times 10^{-15}$ A or less, preferably $1 \times 10^{-18}$ A or less, more preferably $1 \times 10^{-21}$ A or less at 85° C.

Note that the off-state current is a current that flows between a source and a drain when a transistor is in a non-conduction state. For example, the off-state current of an n-channel transistor with a threshold voltage of about 0 V to 2 V refers to a current that flows between a source and a drain when a negative voltage is applied between a gate and the source.

The above-described transistor to which an OS transistor with an extremely small off-state current is applied is the transistor 11 shown in FIG. 1. The amount of current flowing in the transistor 11 in the non-conduction state to which the OS transistor is applied can be extremely small; thus, the amount of potential change of the node FN can be extremely small. In addition, the transistor 11 is kept being in the non-conduction state, whereby the memory cell MC can hold data.

Note that in a period for retaining data, a predetermined voltage is continuously supplied to the transistor 11 in some cases. For example, a voltage that turns off the transistor completely is kept being supplied to a gate of the transistor 11 in some cases. Alternatively, a voltage that shifts the threshold voltage of the transistor to make the transistor in a normally-off state is kept being supplied to a back gate of the transistor in some cases. In these cases, a voltage is supplied to the memory cell MC in the period for retaining data; however, little power is consumed because almost no current flows. Because of little power consumption, the memory cell MC can be regarded as being substantially nonvolatile even if a predetermined voltage is supplied to the memory cell MC.

Then, the favorable voltage resistance of the OS transistor will be described.

An oxide semiconductor is used for a semiconductor layer of the OS transistor which is to be a channel formation region. The oxide semiconductor is a semiconductor whose bandgap is larger than that of silicon. Thus, the OS transistor can be a transistor with better voltage resistance than the Si transistor.

An example of the semiconductor layer to be a channel formation region of the OS transistor can include an In—Ga—Zn-based oxide. The band gap of an In—Ga—Zn-based oxide is wider than that of silicon by approximately 1 to 2 V. Thus, the application of high voltages to the OS transistor is less likely to cause avalanche breakdown, which means high voltage resistance. Thus, the OS transistor is less likely to cause dielectric breakdown and can hold electric charge of the node to which high voltages are applied.

In addition, the OS transistor is an accumulation-type transistor in which electrons are majority carriers. In that case, an electric field extended from conductive layers serving as source and drain electrodes in contact with an oxide semiconductor layer to a channel formation region can be blocked within a short distance. For this reason, short-channel effects are unlikely to occur in the OS transistor.

Although a Si transistor requires a thin gate insulating film to prevent the short-channel effects, a gate insulating film of an OS transistor does not need to be made thin because the short-channel effects can be prevented. Therefore, the gate insulating film of the OS transistor can have a large thickness, and improvement of high voltage resistance can be achieved.

The above-described transistor to which an OS transistor which can have a thick gate insulating film is applied is the transistor 12 shown in FIG. 1. Because the transistor 12 to which an OS transistor which can have a thick gate insulating film is applied is a transistor with excellent voltage resistance, dielectric breakdown does not occur. The memory cell MC can hold data with an expanded distribution of potentials the node FN can have.

Note that the gate insulating film of the transistor 11 or 13 which is an OS transistor other than the transistor 12 may have the same thickness as that of the transistor 12. With this structure, the memory cell MC can be formed with OS transistors having the gate insulating films with the same thickness.

Note that the transistor 11 or 13 which is an OS transistor other than the transistor 12 may have a thin gate insulating film. For example, the gate insulating film of the transistor 11 or 13 may be thinner than the gate insulating film of the transistor 12. This structure can increase the amount of current flowing between the source and drain of the transistor and can improve switching characteristics.

<Voltage Resistance of OS Transistor>

Here, voltage resistance of an OS transistor is described in comparison with voltage resistance of a Si transistor.

Figure 2:
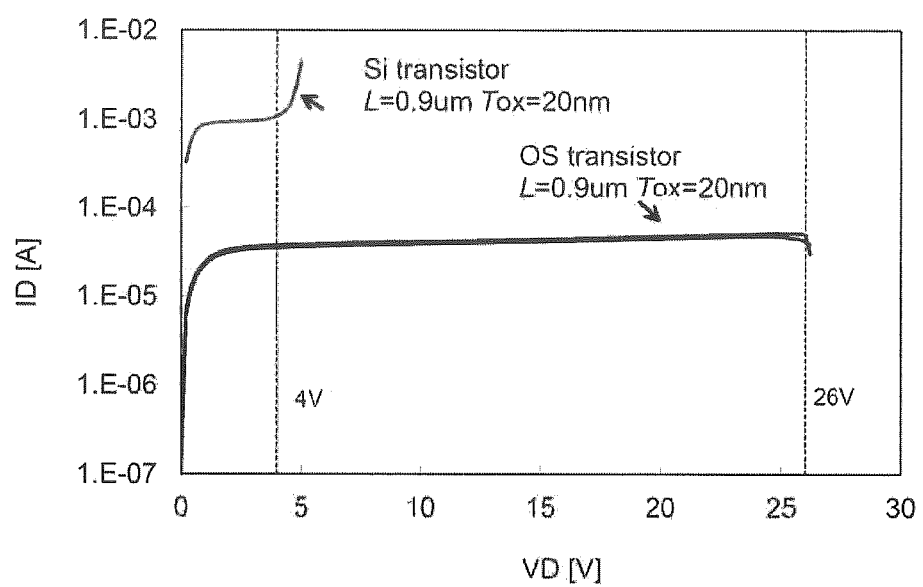
FIG. 2 a graph showing VD-ID characteristics of one embodiment of the present invention.

FIG. 2 shows a graph of VD-ID characteristics of a Si transistor and an OS transistor for explaining voltage resistance of a drain of the OS transistor. In FIG. 2, in order to compare voltage resistance between the Si transistor and the OS transistor under the same conditions, channel lengths are both 0.9 μm, channel widthes are 10 μm, and thicknesses of gate insulating films using silicon oxide are 20 nm. Note that the gate voltage is 2 V.

As shown in FIG. 2, avalanche breakdown occurs in the Si transistor at a drain voltage of approximately 4 V, whereas in the OS transistor, a constant current can flow until a drain voltage of approximately 26 V causes avalanche breakdown.

Figure 3A:
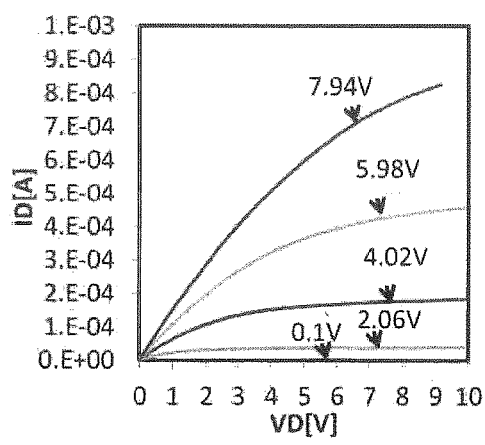
FIGS. 3A and 3B are graphs showing VD-ID characteristics of one embodiment of the present invention.
Figure 3B:
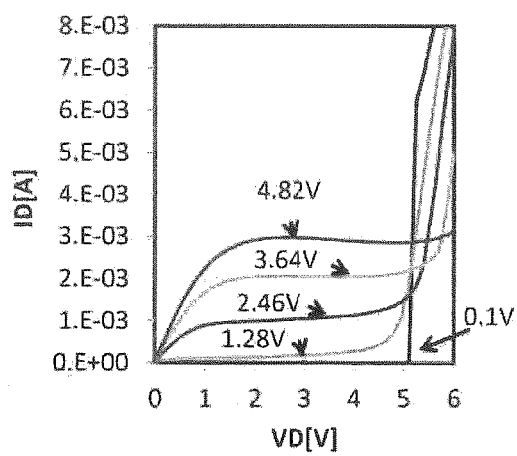

FIG. 3A shows a graph of VD-ID characteristics of an OS transistor with varying gate voltage. In addition, FIG. 3B shows a graph of VD-ID characteristics of a Si transistor with varying gate voltage. In FIG. 3A, in order to compare voltage resistance between the Si transistor and the OS transistor under the same conditions, channel lengths are both 0.9 μm, channel widths are 10 μm, and thicknesses of gate insulating films using silicon oxide are 20 nm. Note that the gate voltage changes from 0.1 V to 2.06 V, 4.02 V, 5.98 V, and 7.94 V in the OS transistor of FIG. 3A and changes from 0.1 V to 1.28 V, 2.46 V, 3.64 V, and 4.82 V in the Si transistor of FIG. 3B.

As shown in FIGS. 3A and 3B, avalanche breakdown occurs in the Si transistor at a drain voltage of approximately 4 to 5 V, whereas in the OS transistor, a constant current can flow until a drain voltage of approximately 9 V causes avalanche breakdown.

As shown in FIG. 2 and FIGS. 3A and 3B, an OS transistor has higher resistance to voltages than that of a Si transistor. The memory cell MC can thus hold data with an expanded distribution of potentials the node FN can have.

<Operation of Memory Cell>

Figure 4:
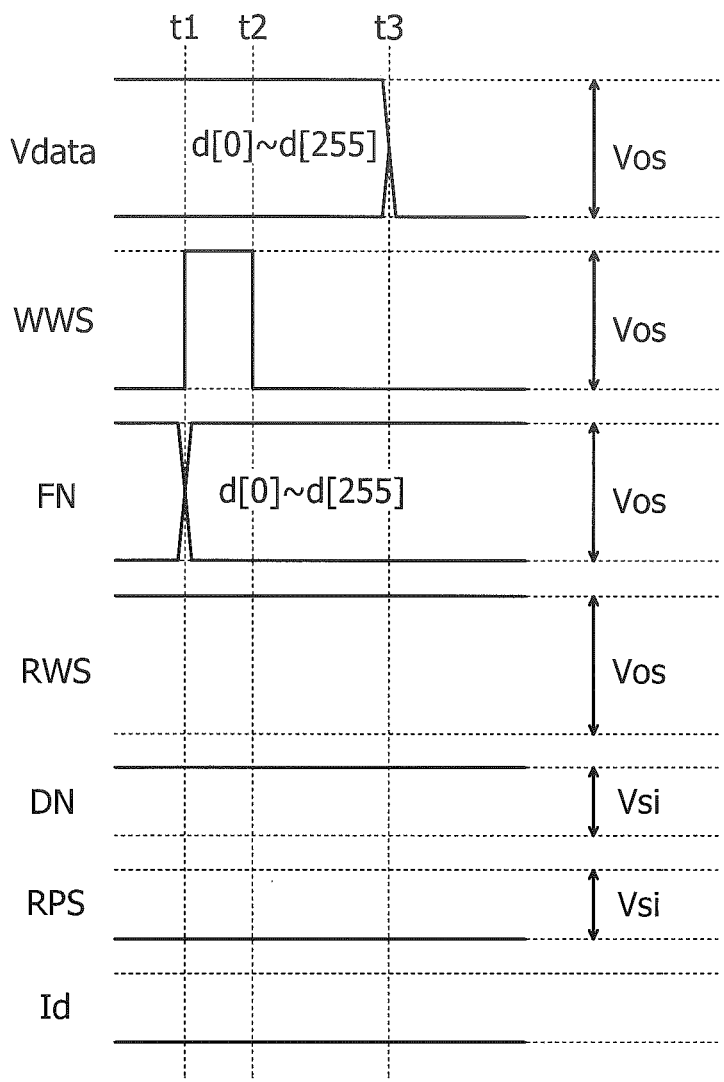
FIG. 4 is a timing chart of one embodiment of the present invention.
Figure 5:
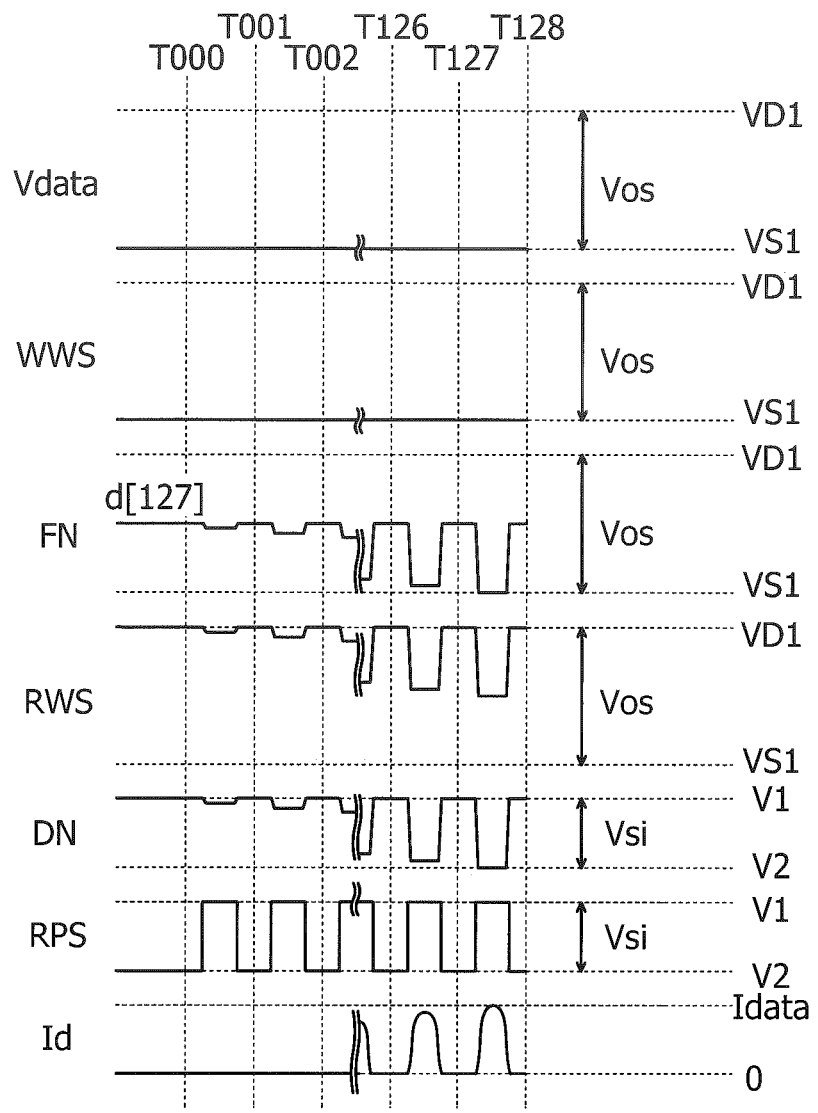
FIG. 5 is a timing chart of one embodiment of the present invention.
Figure 6:
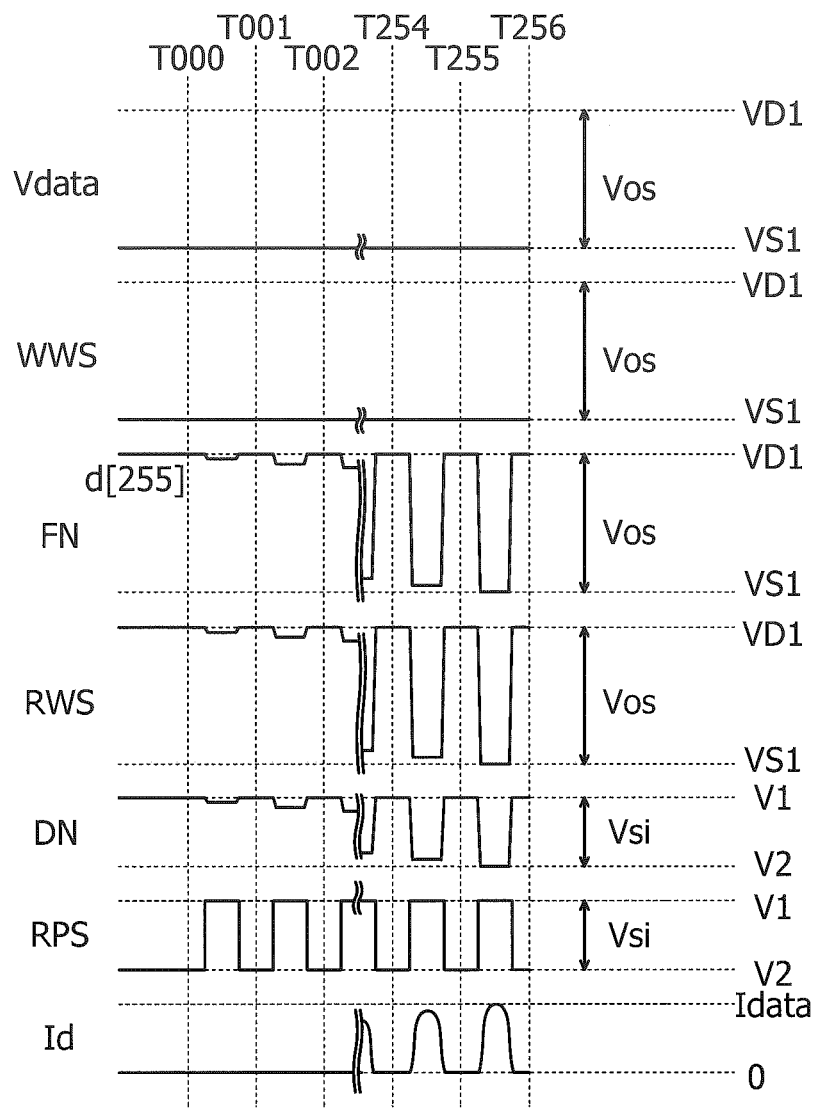
FIG. 6 is a timing chart of one embodiment of the present invention.
Figure 7:
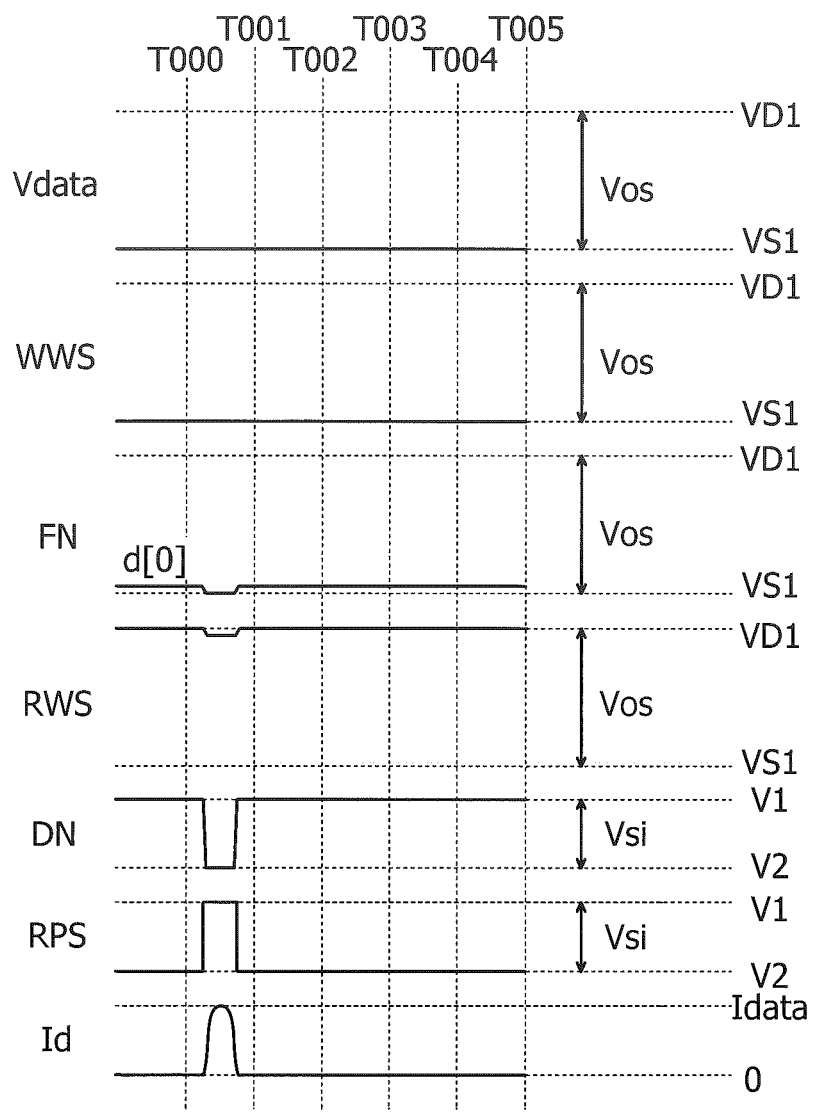
FIG. 7 is a timing chart of one embodiment of the present invention.

Next, operation of the memory cell MC shown in FIG. 1 is explained with FIGS. 4 to 7. FIG. 4 explains operation of writing data to the memory cell. FIGS. 5 to 7 explain operation of reading data. Note that data read in the explanation of FIGS. 5 to 7 are different from each other.

Note that data written to and read from the memory cell MC is explained as 8-bit data, for example. Thus, a case where the distribution of potentials written to the memory cell MC has 256 levels is explained. The distribution of potentials of a data signal can be denoted as d[0] to d[255]. The potentials of the distribution d[0] to d[255] are increased from d[0] to d[255].

In addition, timing charts of FIGS. 4 to 7 show the signals of the wiring WBL, the wiring WWL, the node FN, the wiring RWL, the node DN, and the wiring REL shown in FIG. 1 and change of the current Id flowing through the transistor 14.

Note that the data signal Vdata applied to the wiring WBL, the write word signal WWS applied to the wiring WWL, the read word signal applied to the wiring RWL, and the potential of the node FN are signals and a potential supplied to the transistors 11 and 12 with fevorable voltage resistance as described above. Thus, a potential applied to the wirings and the node can be referred to as Vos. Vos is a potential applied between the H-level potential VD1 and an L-level potential VS1.

Note that the potentials of the wiring VL1 and the wiring VL2 applied to the node DN and the potential of the read pulse signal RPS applied to the wiring REL can be referred to as Vsi which is a potential smaller than Vos. Vsi is a potential applied between the H-level potential V1 and the L-level potential V2.

Note that the current Id flowing through the transistor 14 can be defined that the amount of current is saturated at the current Idata in accordance with the change of the node DN from the state of zero where no current flows.

FIG. 4 explains data writing. The operation of the data writing can be explained with a time t1 to a time t3.

At the time t1 shown in FIG. 4, the write word signal WWS is set at H level, and any one of the potentials d[0] to d[255] of the data signal Vdata is applied to the node FN. At that time, the read word signal RWS is fixed at H level. In addition, at that time, the read pulse signal RPS is fixed at L level.

At the time t1, the node DN is preferably set at H level in advance. When the node DN is at H level, the transistor 14 can be brought into the non-conduction state, so that unnecessary flow of the current Id can be prevented surely.

Note that at the time t1, the node DN may be set at H level in the following manner: in order to set the node DN at H level in advance, a signal for bringing the transistor 12 into the conduction state is applied to the node FN. Alternatively, the node DN may be set at H level in the following manner: the potentials d[0] to d[255] of the data signal Vdata are applied to the node FN as a signal for bringing the transistor 12 into the conduction state.

Next, at the time t2 shown in FIG. 4, the write word signal WWS is set at L level, so that any one of the potentials d[0] to d[255] of the data signal Vdata applied to the node FN is held. At that time, the read word signal RWS is fixed at H level. In addition, at that time, the read pulse signal RPS is fixed at L level. The potential of the node DN and the current Id are the same as those at the time t1.

Note that the node FN is brought into the electrically floating state by setting the write word signal WWS at L level.

Next, at the time t3 shown in FIG. 4, the data signal Vdata is set at L level, and data writing is finished. At that time, the write word signal WWS and the read word signal RWS are fixed at L level and H level, respectively. In addition, at that time, the read pulse signal RPS is fixed at L level. The potential of the node DN and the current Id are the same as those at the time t1.

In this manner, the potentials d[0] to d[255] can be supplied to the node FN. The potentials d[0] to d[255] supplied to the node FN have a wide distribution of a potential like Vos as described above; however, the use of transistors having excellent voltage resistance as the transistor 11 and the transistor 12 can achieve holding charge corresponding to the potentials.

Next, FIGS. 5 to 7 explain reading of data held in the node FN. In FIGS. 5 to 7, reading operation when the potentials d[0], d[127], and d[255] are held in the node FN is explained.

FIG. 5 explains the operation of reading d[127]. In addition, FIG. 6 explains the operation of reading d[255]. In addition, FIG. 7 explains the operation of reading d[0] which is an intermediate data.

Firstly, FIG. 5 is a timing chart when d[127] written to the node FN is read, which can be explained with the operation at times T000 to T128.

In a period from the time T000 to the time T001 shown in FIG. 5, the write word signal WWS and the data signal Vdata are set at L level to change the potential of the node FN. Specifically, the potential of the read word signal RWS is changed, whereby the potential of the node FN is changed utilizing capacitive coupling in the capacitor 21.

In the reading operation in FIG. 5, the potential of the read word signal RWS is changed in accordance with the degree of the potential distribution of the data signal Vdata which is read. The example of FIG. 5 shows a case of reading 256-level data, in which case the potential of the read word signal RWS is changed in 256 levels. The potential is changed at one time only by a voltage when Vos is divided into 256.

With the potential change of the read word signal RWS for changing the potential of the node FN, the read pulse signal RPS is switched at H level one time. Thus, the transistor 13 is brought into the conduction state, whereby the potential of the node DN is changed. The degree of the potential change of the node DN depends on the amount of current flowing through the transistor 12.

In the period from the time T000 to the time T001 shown in FIG. 5, the potential of the node FN after the potential change of the read word signal RWS is large, and therefore the amount of current flowing through the transistor 12 is large. In that case, the degree of reduction in the potential of the node DN is small, and there is almost no potential change of the node DN from H level. Therefore, the transistor 14 is not brought into the conduction state and thus little current Id flows.

From the time T001 to a time T127, the potential of the read word signal RWS is gradually changed. With the potential change of the read word signal RWS, the potential of the node FN is lowered. In addition, with the potential change of the read word signal RWS, the read pulse signal RPS is switched to H level. Then, a constant amount of current flows through the transistor 13 while the amount of current flowing through the transistor 12 is reduced, so that the potential of the node DN is lowered.

In the timing chart of FIG. 5, the amount of current flowing through the transistor 12 is reduced to be in the non-conduction state in which no current flows between the time T127 and a time T128. Thus, when the transistor 13 is brought into the conduction state, the potential of the node DN is set at L level, that is, the potential V2 of the wiring VL2. As a result, the current Id flowing through the transistor 14 is saturated and becomes the current Idata.

The timing when the current Id is saturated and becomes the current Idata is detected outside, so that data held in the memory cell MC can be read. In other words, in the case where d[127] written to the node FN is read, a potential obtained by the saturation of the current Id flowing through the transistor 14 is detected outside. If the number of times of potential change of the read word signal RWS is 128, d[127] can be read as data.

Note that data is not limited to be read in accordance with the number of times of potential change of the read word signal RWS when the potential obtained by the saturation of the current Id flowing through the transistor 14 is detected outside. Data may be read in accordance with the number of pulses of the read pulse signal RPS.

In addition, FIG. 6 is a timing chart in reading d[255] written to the node FN, which can be explained by operation from the time T000 to the time T256.

In the timing chart of FIG. 6, the potential of the read word signal RWS is changed so that the potential of the node FN is gradually lowered as in FIG. 5. Then, the amount of current flowing through the transistor 12 is reduced to be in the non-conduction state in which no current flows between the time T255 and the time T256. Thus, when the transistor 13 is brought into the conduction state, the potential of the node DN is set at L level, that is, the potential V2 of the wiring VL2. As a result, the current Id flowing through the transistor 14 is saturated and becomes the current Idata.

In addition, FIG. 7 is a timing chart in reading d[0] written to the node FN, which can be explained by operation from the time T000 to the time T001.

In the timing chart of FIG. 7, the potential of the read word signal RWS is changed so that the potential of the node FN is gradually lowered as in FIG. 5. Then, the amount of current flowing through the transistor 12 is reduced to be in the non-conduction state in which no current flows between the time T000 and the time T001. Thus, when the transistor 13 is brought into the conduction state, the potential of the node DN is set at L level, that is, the potential V2 of the wiring VL2. As a result, the current Id flowing through the transistor 14 is saturated and becomes the current Idata.

The timing when the current Id is saturated and becomes the current Idata is detected outside, so that data held in the memory cell MC can be read. In other words, in the case where d[255] written to the node FN is read, a potential obtained by the saturation of the current Id flowing through the transistor 14 is detected outside. If the number of times of potential change of the read word signal RWS is 256, d[255] can be read as data. In addition, in the case where d[0] written to the node FN is read, a potential obtained by the saturation of the current Id flowing through the transistor 14 is detected outside. If the number of times of potential change of the read word signal RWS is 1, d[0] can be read as data.

In this manner, the potentials d[0] to d[255] can be supplied to the node FN. The potentials d[0] to d[255] supplied to the node FN have a wide distribution of a potential like Vos as described above; however, the use of transistors having excellent voltage resistance as the transistor 11 and the transistor 12 can achieve holding charge corresponding to the potentials. In contrast, a voltage applied to the transistor 14 can be read as Vsi which is smaller than Vos.

<Modification Example of Memory Cell>

Figure 8:
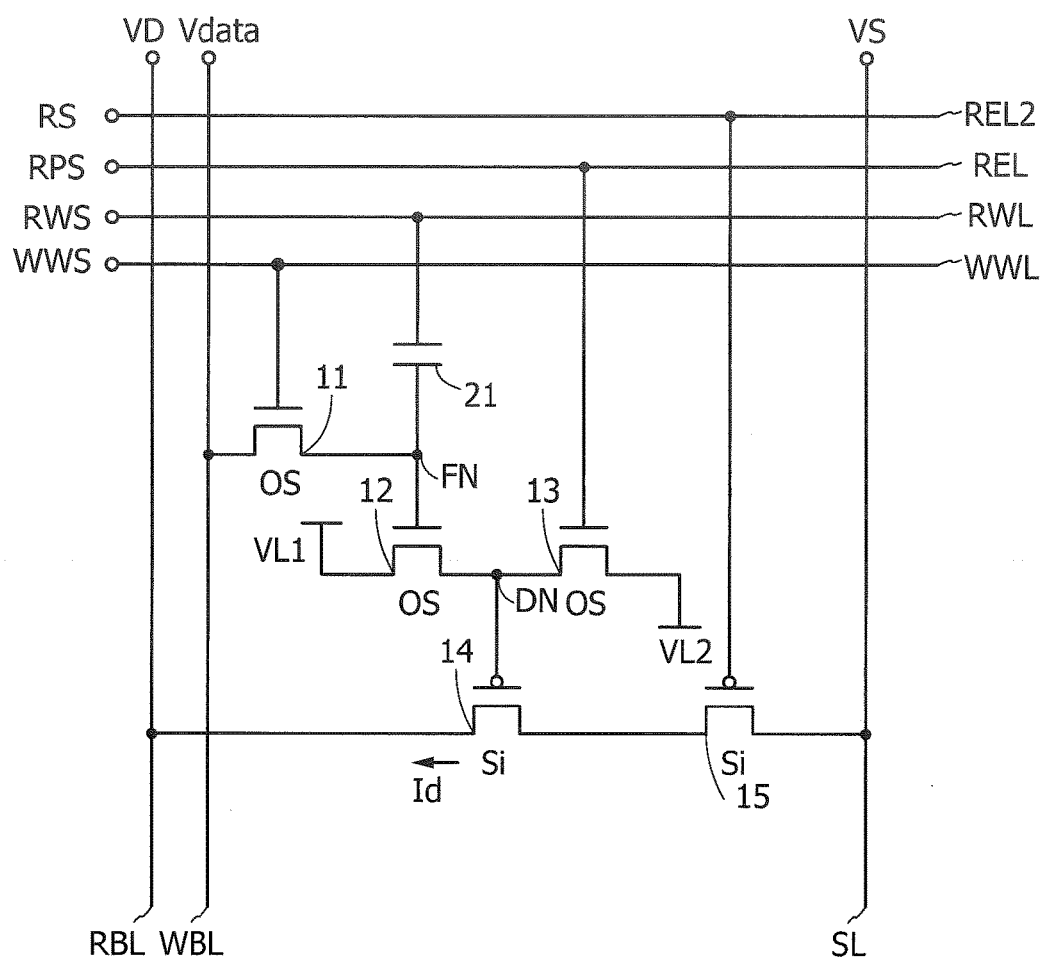
FIG. 8 is a circuit diagram showing one embodiment of the present invention.

A circuit configuration of a memory cell MC2 shown in FIG. 8 corresponds to a structure in which a transistor 15 is added to the circuit configuration of the memory cell MC shown in FIG. 1. Here, the added structure is explained. The explanation for FIG. 1 is referred to for other structures.

A gate of the transistor 15 is connected to a wiring REL2. In addition, one of a source and a drain of the transistor 15 is connected to the other of the source and the drain of the transistor 14. In addition, the other of the source and the drain of the transistor 15 is connected to the wiring SL.

The wiring REL2 is a wiring having a function of receiving a read signal RS. The read signal RS is a signal for making a conduction state between the source and the drain of the transistor 15 when data reading. The read signal RS is a signal for making a non-conduction state between the source and the drain of the transistor 15 except when data reading.

With the circuit configuration of the memory cell MC2 shown in FIG. 8, current flowing between wirings VD and VS can be reduced except when data reading.

Figure 9:
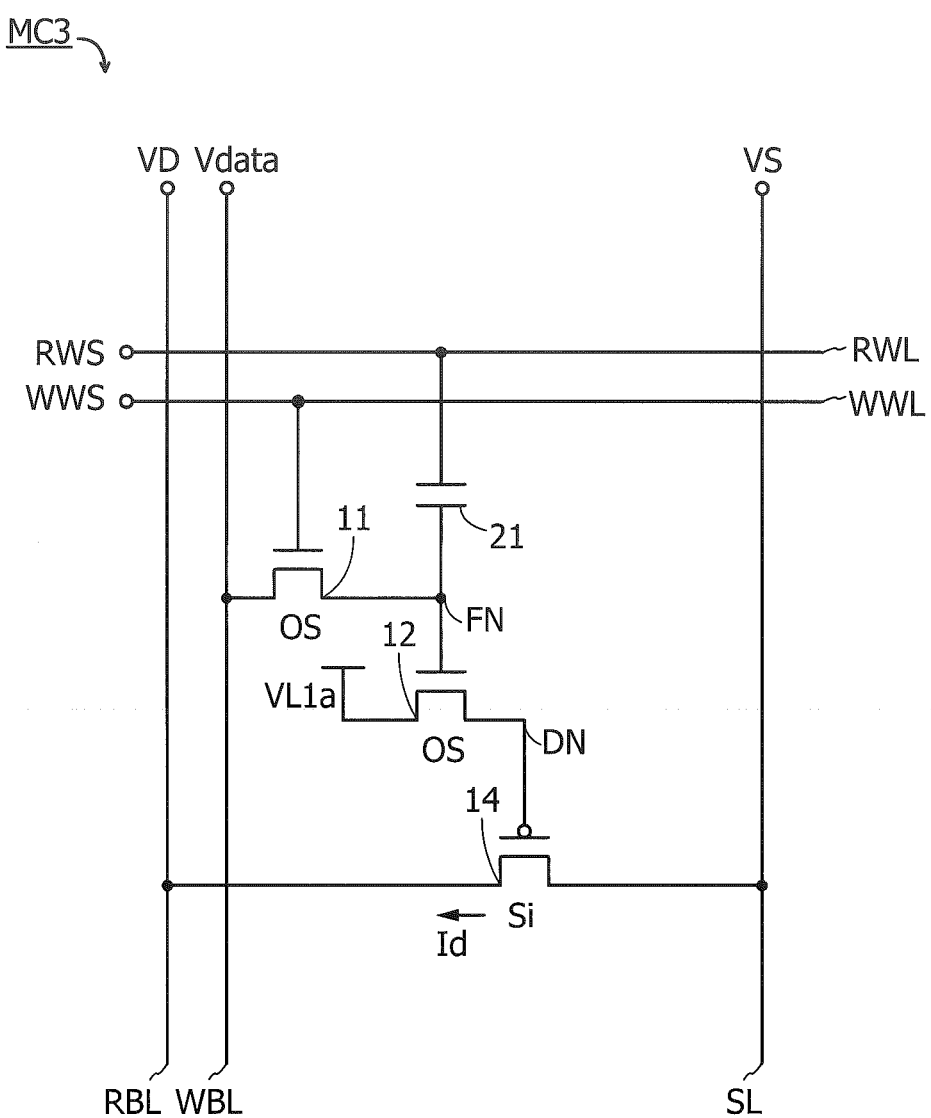
FIG. 9 is a circuit diagram showing one embodiment of the present invention.

A circuit configuration of a memory cell MC3 shown in FIG. 9, which is another structure, corresponds to a structure in which the transistor 13 and the wiring VL2 are omitted from the circuit configuration of the memory cell MC shown in FIG. 1 and a wiring VL1a which corresponds to the wiring VL1 added with a new function is added. Here, the structure added with a new function is explained. The explanation for FIG. 1 is referred to for other structures.

The wiring VL1a the wiring VL1 is a wiring having a function of receiving the potential V1 and the potential V2. The potential V1 is preferably a potential larger than the potential V2.

When data reading, the wiring VL1a supplies the potential V2 in advance to the node DN and then switches to the potential V1. After the potential of the wiring VL1a is switched to the potential V1, the potential of the node FN is changed, whereby the potential of the node DN is changed in accordance with the amount of current flowing through the transistor 12. The changed potential is converted into the current Id flowing through the transistor 14, so that data can be read outside.

In the above-described structure of FIG. 1 which is one embodiment of the present invention, as explained in FIG. 4, the node FN connecting the source or the drain of the transistor 11 and the gate of the transistor 12 can hold the distribution of a plurality of potentials. The structure of FIG. 1 is configured to read data without applying Vos of the node FN directly to the transistor 14 for reading data. As explained in FIGS. 5 to 7, the transistor 14 for reading data is supplied with Vsi which is smaller than Vos, and data reading by a Si transistor whose mobility is larger than that of an OS transistor is achieved.

The structure described above in this embodiment can be combined as appropriate with any of the structures described in the other embodiments.

(Embodiment 2)

In this embodiment, an example of a RAM (Random Access Memory) including the memory cell explained in FIG. 1 is explained. In addition, the explanation is made with reference to FIGS. 10 to 12. Note that the RAM is referred to as a memory device in some cases. The memory device includes a plurality of semiconductor devices.

<Configuration Example of RAM>

Figure 10:
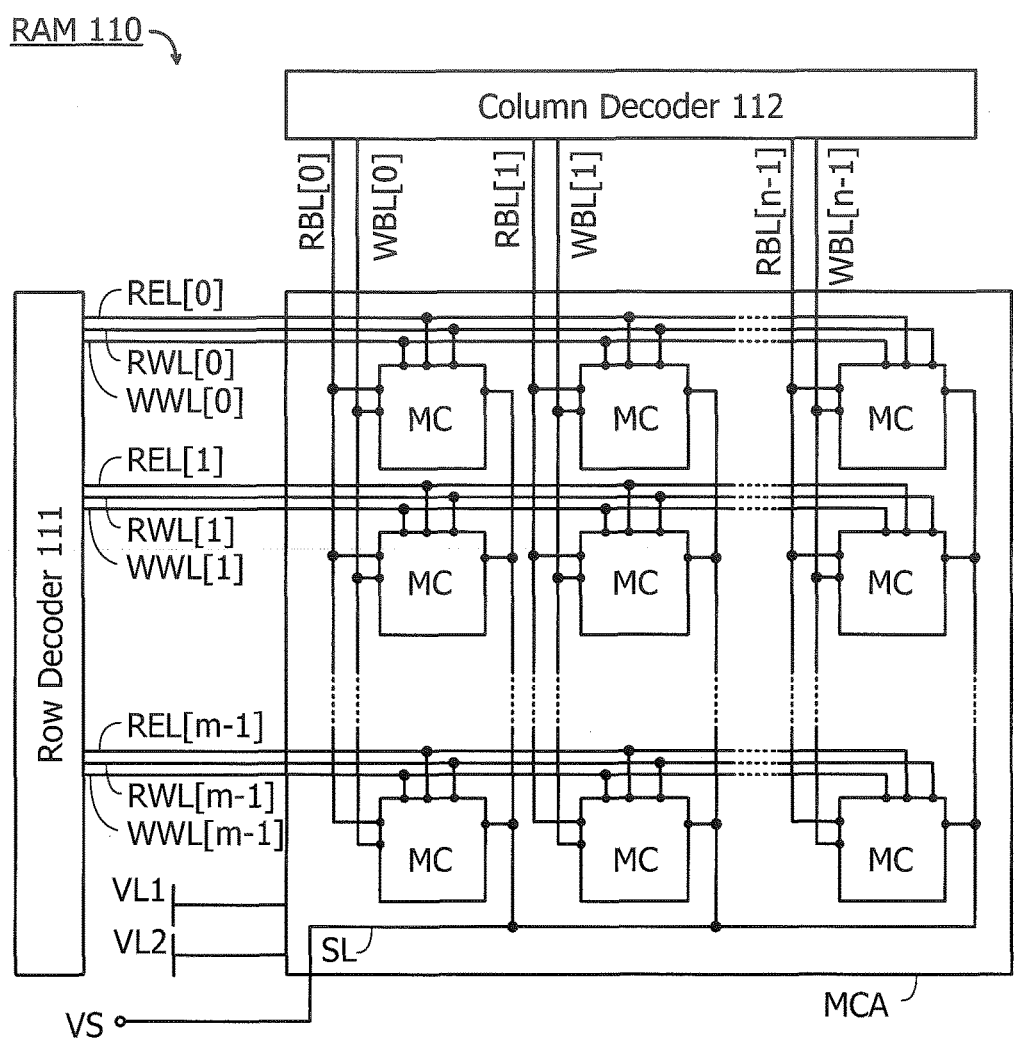
FIG. 10 is a circuit block diagram showing one embodiment of the present invention.

FIG. 10 is a block diagram showing a configuration example of a RAM including the memory cell MC explained in FIG. 1.

A RAM 110 shown in FIG. 10 includes a memory cell array MCA including a plurality of memory cells MC explained in FIG. 1, a row selection driver 111, and a column selection driver 112. Note that the RAM 110 includes the memory cells MC arranged in a matrix of m rows and n columns (m and n are each a natural number of 2 or more).

In addition, FIG. 10 illustrates wirings WWL[0] to [m−1], wirings RWL[0] to [m−1], wirings REL[0] to [m−1], wirings WBL[0] to [n−1], wirings RBL[0] to [n−1], and the wiring SL.

In the memory cell array MCA illustrated in FIG. 10, the memory cells MC explained in FIG. 1 are arranged in a matrix. In the memory cell MC explained in FIG. 1, the potential distribution can be expanded without need for voltage resistance of the Si transistor for reading data. Thus, multiplication of data stored in the memory cell MC can be achieved to increase the storage capacitance of the RAM 110.

The row selection driver 111 is a circuit having a function of supplying a write word signal to the wirings WWL[0] to [m−1] each connected to the memory cell MC, a read word signal to the wirings RWL[0] to [m−1], and a read pulse signal to the wirings REL[0] to [m−1]. The row selection driver 111 is a circuit for supplying signals to the wirings, and is simply referred to as a circuit in some cases.

The column selection driver 112 is a circuit having a function of supplying a data signal to the wiring WBL connected to the memory cell MC and the potential VD to the wiring RBL. The column selection driver 112 is a circuit for supplying signals or potentials to the wirings, and is simply referred to as a circuit in some cases.

In addition, the memory cells MC are connected to the wiring SL and supplied with the potential VS.

<Configuration Example of Row Selection Driver>

Figure 11:
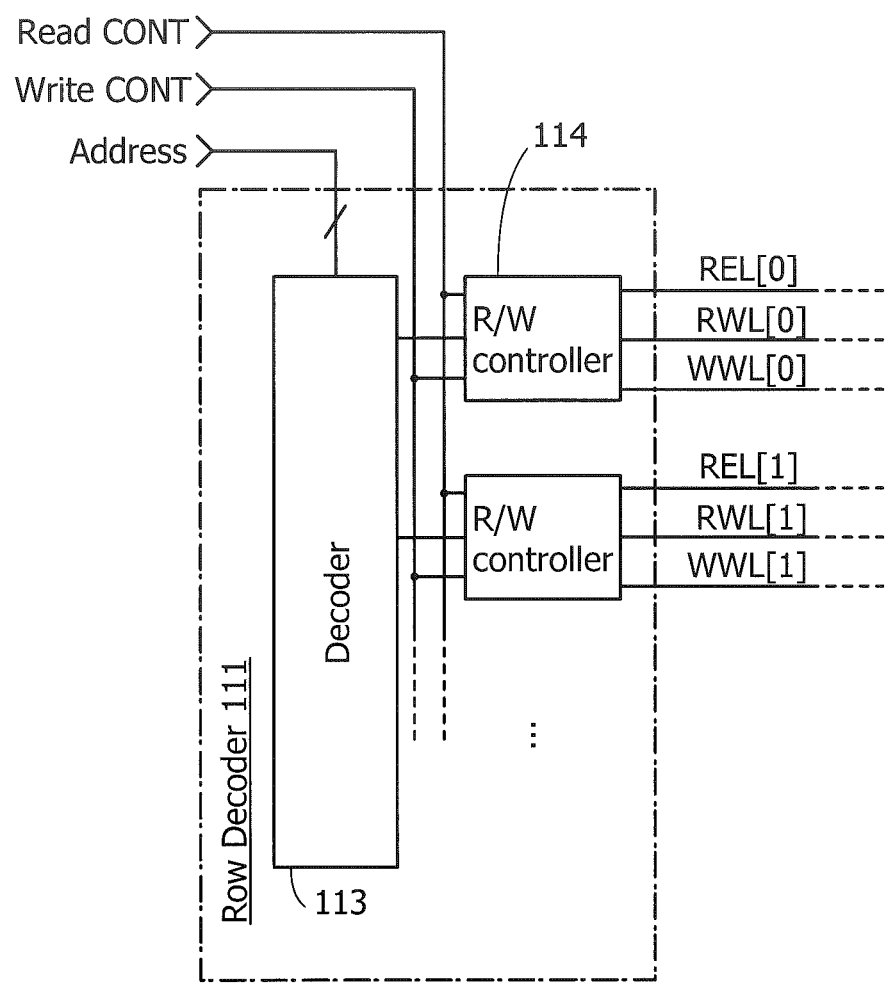
FIG. 11 is a circuit block diagram showing one embodiment of the present invention.

FIG. 11 is a block diagram showing a configuration example of the row selection driver 111 illustrated in FIG. 10.

The row selection driver 111 illustrated in FIG. 11 includes a decoder 113 and a read write control circuit 114. The read write control circuit 114 is provided in each row of the wiring WWL, the wiring RWL, and the wiring REL. In addition, the read write control circuits 114 in the rows are connected to the wirings WWL[0] to [m−1], the wirings RWL[0] to [m−1], and the wirings REL[0] to [m−1].

The decoder 113 is a circuit having a function of outputting a signal for selecting a row of the wiring WWL, the wiring RWL, and the wiring REL. Specifically, the circuit receives an address signal Address and selects the read write control circuit 114 of any of rows in accordance with the address signal Address. With the decoder 113, the row selection driver 111 can select a given row to write and read data.

The read write control circuit 114 is a circuit having a function of selectively outputting a write word signal or a read word signal and a read pulse signal to the wiring WWL, the wiring RWL, and the wiring REL in a row selected by the decoder 113.

The read write control circuit 114 receives a write control signal Write_CONT and a read control signal Read_CONT and selectively outputs signals to the wiring WWL, the wiring RWL, and the wiring REL in accordance with these signals. With the read write control circuit 114, a write word signal or a read word signal and a read pulse signal can be selectively output.

<Configuration Example of Column Selection Driver>

Figure 12A:
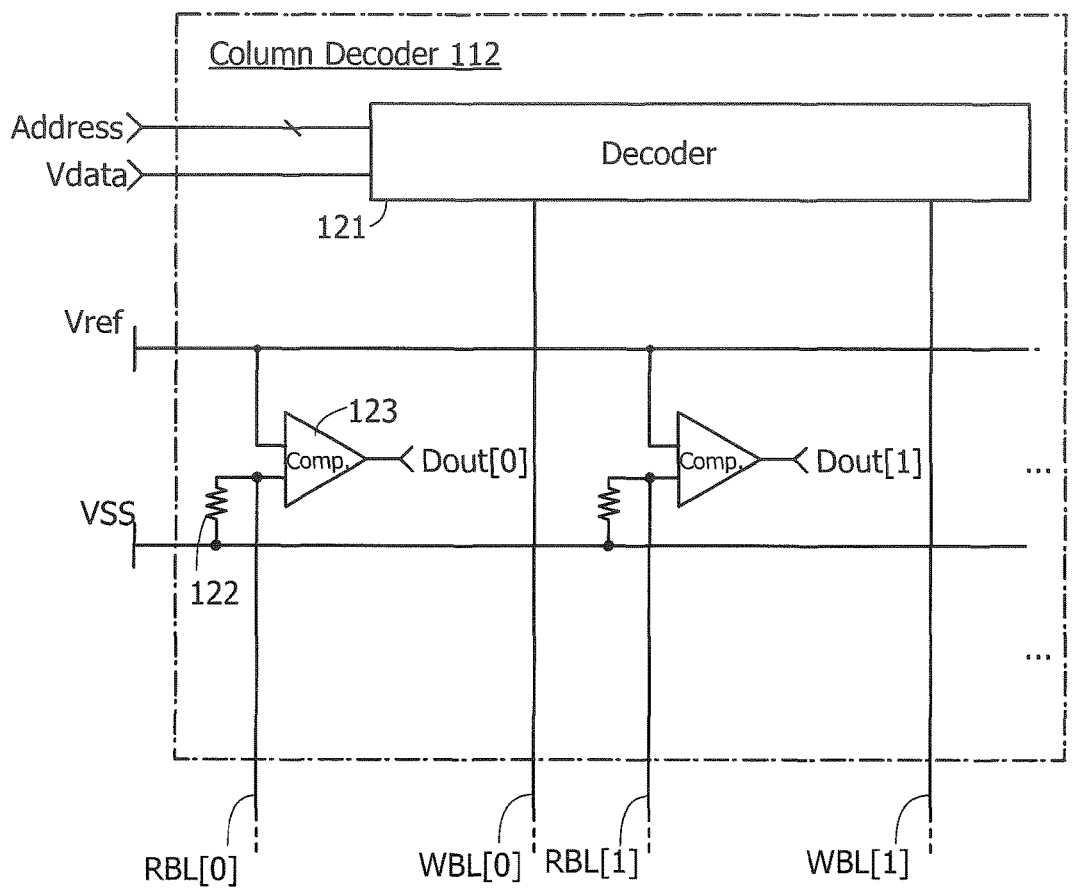
FIGS. 12A and 12B are circuit block diagrams showing one embodiment of the present invention.

FIG. 12A is a block diagram showing a configuration example of the column selection driver 112 which is described in FIG. 10.

The column selection driver 112 shown in FIG. 12A includes a decoder 121, a resistor element 122, and a comparator 123. The resistor element 122 and the comparator 123 are provided in each column. In addition, the output of the decoder 121 is connected to the wiring WBL[0] to [n−1]. In addition, the comparator 123 in the columns are connected to respective wirings RBL[0] to [n−1].

The decoder 121 is a circuit having a function of selecting columns of wirings through which input data is output. Specifically, it is a circuit which receives an address signal Address and a data signal Vdata and outputs the data signal Vdata to any of the columns in accordance with the address signal Address. With the decoder 121, the column selection driver 112 can output the data signal Vdata to a desired column of the wirings WBL[0] to [n−1].

Note that an amplifier may be provided between the decoder 121 and the wirings WBL[0] to [n−1]. With the amplifier, the column selection driver 112 can stably output the data signal Vdata.

Note that a latch circuit which stores the data signal Vdata temporarily may be provided between the decoder 121 and each of the wirings WBL[0] to [n−1]. With the latch circuit, the column selection driver 112 can write the data signal data at a desired timing.

The resistor element 122 is an element having a function of converting currents flowing through the wirings RBL[0] to [n−1] into voltages. With the resistor element 122, the column selection driver 112 can convert currents flowing through the memory cells MC subjected to reading into voltages and can supply them to the comparator 123. Note that the resistor element can be replaced with a transistor to which a bias voltage is applied.

The comparator 123 is a circuit having a function of comparing potential levels of the wirings RBL[0] to [n−1] with a potential level of a reference voltage Vref and outputting a signal Vcomp to wirings Dout[0] to [n−1]. With the comparator 123, the column selection driver 112 can detect a change in the amount of current corresponding to a multilevel data signal held in the memory cell MC and output it as the signal Vcomp. The signal Vcomp is input to a counter for counting the number of pulses of a reading pulse signal at the time of starting data reading.

Figure 12B:
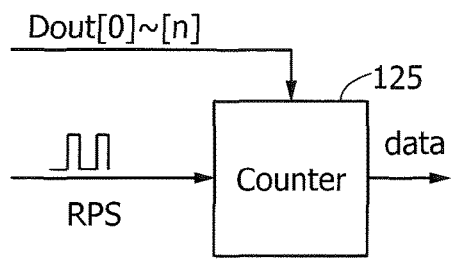

FIG. 12B is a block diagram illustrating a signal including the signal Vcomp which is input to and output from the counter 125. The signal Vcomp obtained in the comparator 123 is supplied to the counter 125 for counting the number of pulses of the reading pulse signal at the time of starting data reading.

The counter 125 starts counting the number of pulses of a pulse signal at the same time as the start of pulse output of the reading pulse signal. The counting number obtained when the counting is stopped by the input of the signal Vcomp corresponds to the multilevel data. With the structure, the multilevel data stored in the memory cell MC can be read.

Note that the counter 125 may be provided in the RAM 110, may be provided outside the RAM 110, or may be provided inside the row selection driver 111 or the column selection driver 112.

This implementation can be implemented in appropriate combination with any of the other implementations and the like.

(Embodiment 3)

In this embodiment, an oxide semiconductor layer that can be used as a semiconductor layer of the transistor with low off-state current described in the foregoing embodiment will be described.

An oxide semiconductor used for a channel formation region in the semiconductor layer of the transistor preferably contains at least indium (In) or zinc (Zn). It is particularly preferable that both In and Zn be contained. It is further preferable that a stabilizer for strongly bonding oxygen be contained in addition to In and Zn. As the stabilizer, at least one of gallium (Ga), tin (Sn), zirconium (Zr), hafnium (Hf), and aluminum (Al) is contained.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In-Al—Ga—Zn-based oxide, In—Sn—Al—Zn-based oxide, In—Sn—Hf—Zn-based oxide, and In—Hf-Al—Zn-based oxide.

For example, an In—Ga—Zn-based oxide with an atomic ratio of In:Ga:Zn=1:1:1, In:Ga:Zn=3:1:2, or In:Ga:Zn=2:1:3 or an oxide with an atomic ratio close to the atomic ratios can be used.

If an oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is sometimes reduced by the dehydration treatment (dehydrogenation treatment). For that reason, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film that is extremely close to an i-type oxide semiconductor film. Note that "substantially intrinsic" means that the oxide semiconductor film contains extremely few (close to zero) carriers derived from a donor and has a carrier density which is $1\times10^{17}/cm^3$ or lower, $1\times10^{16}/cm^3$ or lower, $1\times10^{15}/cm^3$ or lower, $1\times10^{14}/cm^3$ or lower, or $1\times10^{13}/cm^3$ or lower.

The transistor including an i-type or substantially i-type oxide semiconductor film can have extremely favorable off-state current characteristics. For example, the off-state drain current of the transistor including the oxide semiconductor film can be $1\times10^{18}$ A or less, preferably $1\times10^{-21}$ A or less, more preferably $1\times10^{-18}$ A or less at room temperature (approximately 25° C.), or $1\times10^{-15}$ A or less, preferably $1\times10^{-18}$ A or less, more preferably $1\times10^{-21}$ A or less at 85° C. Note that the off state of an n-channel transistor refers to a state where a gate voltage is sufficiently lower than the threshold voltage. Specifically, the transistor is off when the gate voltage is lower than the threshold voltage by 1 V or more, 2 V or more, or 3 V or more.

A structure of the oxide semiconductor film is described below.

An oxide semiconductor film is classified roughly into a single crystal oxide semiconductor film and a non-single-crystal oxide semiconductor film. The non-single-crystal oxide semiconductor film includes any of a CAAC-OS (C-Axis Aligned Crystalline Oxide Semiconductor) film, a polycrystalline oxide semiconductor film, a microcrystalline oxide semiconductor film, an amorphous oxide semiconductor film, and the like.

First, a CAAC-OS film will be described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface, and is arranged parallel to the formation surface or the top surface.

In the high-resolution plan-view TEM image of the CAAC-OS film observed in a direction substantially perpendicular to the sample surface, metal atoms arranged in a triangular or hexagonal configuration are seen in the crystal parts. However, there is no regularity of arrangement of metal atoms between different crystal parts.

FIG. 13a is a high-resolution cross-sectional TEM image of a CAAC-OS film. FIG. 13b is a high-resolution cross-sectional TEM image obtained by enlarging the image of FIG. 13a. In FIG. 13b atomic arrangement is highlighted for easy understanding.

FIG. 13c is local Fourier transform images of regions each surrounded by a circle (the diameter is about 4 nm) between A and O and between O and A' in FIG. 13a. C-axis alignment can be observed in each region in FIG. 13c. The c-axis direction between A and O is different from that between O and A', which indicates that a grain in the region between A and O is different from that between O and A'. In addition, the angle of the c-axis between A and O continuously and gradually changes, for example, 14.3°, 16.6°, and 26.4°. Similarly, the angle of the c-axis between O and A' continuously changes, for example, −18.3°, −17.6°, and −15.9°.

Note that in an electron diffraction pattern of the CAAC-OS film, spots (bright spots) indicating alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 14A).

From the results of the high-resolution cross-sectional TEM image and the high-resolution plan-view TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the high-resolution plan-view TEM image.

A CAAC-OS film is subjected to structural analysis with an X-ray diffraction (XRD: X-Ray Diffraction) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface.

On the other hand, when the CAAC-OS film is analyzed by an in-plane method in which an X-ray is incident on a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of InGaZnO$_4$, six peaks appear. The six peaks are derived from crystal planes equivalent to the (110) plane. In the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a top surface of the CAAC-OS film. Thus, for example, in the case where the shape of the CAAC-OS film is changed by etching or the like, the c-axis might not be necessarily parallel to a normal vector of a formation surface or a normal vector of a top surface of the CAAC-OS film.

Distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added may be altered and the proportion of the c-axis aligned crystal parts in the CAAC-OS film might vary depending on regions.

Note that when the CAAC-OS film with an InGaZnO$_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a polycrystalline oxide semiconductor film is described.

In a high-resolution TEM image of the polycrystalline oxide semiconductor film, crystal grains are observed. In most cases, the crystal grain size in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in the high-resolution TEM image, for example. Moreover, in the high-resolution TEM image of the polycrystalline oxide semiconductor film, a grain boundary may be observed.

The polycrystalline oxide semiconductor film may include a plurality of crystal grains, and alignment of crystals may be different in the plurality of crystal grains. A polycrystalline oxide semiconductor film is subjected to structural analysis with an XRD apparatus. For example, when the polycrystalline oxide semiconductor film including an $InGaZnO_4$ crystal is analyzed by an out-of-plane method, peaks of 2θ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger changes in electrical characteristics and lower reliability than a transistor including a CAAC-OS film in some cases.

Next, a microcrystalline oxide semiconductor film is described.

A microcrystalline oxide semiconductor film has a region where a crystal part is observed in a high resolution TEM image and a region where a crystal part is not clearly observed. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc: nanocrystal). An oxide semiconductor film including nanocrystal is referred to as an nc-OS (nanocrystalline Oxide Semiconductor) film. In a high resolution TEM image, a grain boundary cannot be found clearly in the nc-OS film sometimes for example.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak showing a crystal plane does not appear. A diffraction pattern like a halo pattern appears in a selected-area electron diffraction pattern of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. In a nanobeam electron diffraction pattern of the nc-OS film, regions with high luminance in a circular (ring) pattern are shown in some cases. Furthermore, in a nanobeam electron diffraction pattern of the nc-OS film, a plurality of circumferentially distributed spots are observed in some cases (see FIG. 14B).

The nc-OS film is an oxide semiconductor film that has high regularity as compared to an amorphous oxide semiconductor film. Thus, the nc-OS film has a lower density of defect states than an amorphous oxide semiconductor film. Note that there is no regularity of crystal orientation between different crystal parts in the nc-OS film. Hence, the nc-OS film has a higher density of defect states than the CAAC-OS film.

Thus, the nc-OS film may have a higher carrier density than the CAAC-OS film. The oxide semiconductor film having a high carrier density may have high electron mobility. Thus, a transistor including the nc-OS film may have high field-effect mobility. The nc-OS film has a higher defect state density than the CAAC-OS film, and thus may have a lot of carrier traps. Consequently, a transistor including the nc-OS film has larger changes in electrical characteristics and lower reliability than a transistor including the CAAC-OS film. The nc-OS film can be formed easily as compared to the CAAC-OS film because it can be formed even when a relatively large amount of impurities are included; thus, depending on the purpose, the nc-OS film can be favorably used in some cases. Thus, a semiconductor device including the transistor including the nc-OS film can be manufactured with high productivity in some cases.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak showing a crystal plane does not appear. A halo pattern is shown in an electron diffraction pattern of the amorphous oxide semiconductor film.

Furthermore, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Thus, the amorphous oxide semiconductor film has a much higher carrier density than the nc-OS film in some cases. Therefore, a transistor including the amorphous oxide semiconductor film tends to be normally on. Therefore, in some cases, such an amorphous oxide semiconductor layer can be applied to a transistor that needs to be normally on. Since the amorphous oxide semiconductor film has a high density of defect states, carrier traps might be increased.

Consequently, a transistor including the amorphous oxide semiconductor film has larger changes in electrical characteristics and lower reliability than a transistor including the CAAC-OS film or the nc-OS film.

Next, a single crystal oxide semiconductor film is described.

The single crystal oxide semiconductor film has a lower impurity concentration and a lower density of defect states (few oxygen vacancies). Thus, the carrier density can be decreased. Thus, a transistor including the single crystal oxide semiconductor film is unlikely to be normally on. Moreover, since the single crystal oxide semiconductor film has a lower impurity concentration and a lower density of defect states, carrier traps might be reduced. Thus, the transistor including the single crystal oxide semiconductor film has small changes in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void may be seen. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the amorphous-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Thus, the distance between the adjacent layers is equivalent to the lattice spacing on the (009) plane (also referred to as d value). The value is calculated to be 0.29 nm from crystal structural analysis. Thus, each of the lattice fringes having a distance therebetween of from 0.28 nm to 0.30 nm is regarded as corresponding to the a-b plane of the $InGaZnO_4$ crystal, focusing on the lattice fringes in the high-resolution TEM image. The maximum length in the region in which the lattice fringes are observed is regarded as the size of the crystal parts of the amorphous-like OS film and the nc-OS film. Note that the crystal part whose size is 0.8 nm or larger is selectively evaluated.

Figure 15:
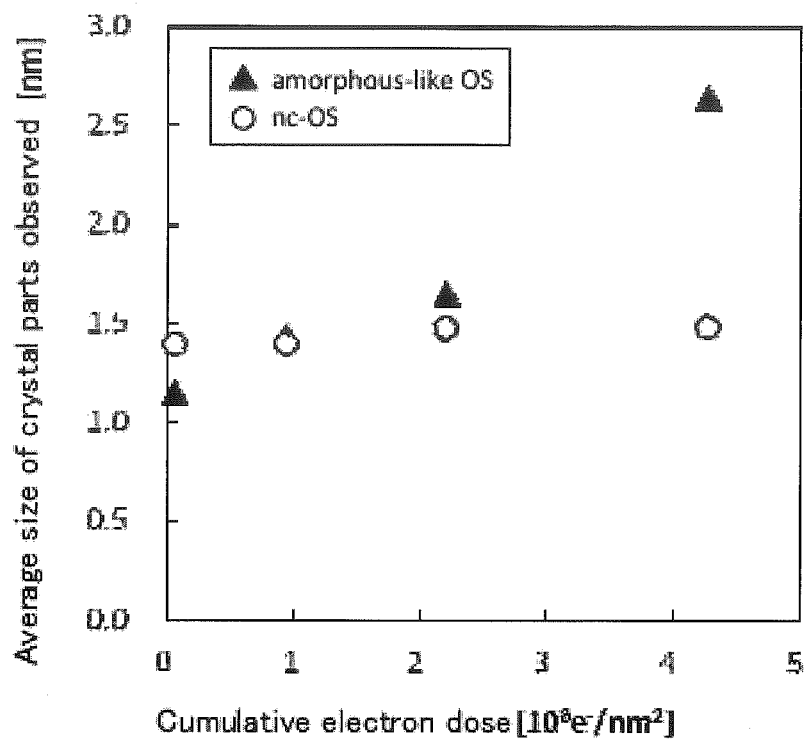
FIG. 15 shows a change in crystal parts by electron beam irradiation.

FIG. 15 shows examination results of change in average size of crystal parts (20-40 points) in the amorphous-like OS film and the nc-OS film using the high-resolution TEM images. As in FIG. 15, the crystal part size in the amorphous-like OS film increases with an increase of the total amount of electron irradiation. Specifically, the crystal part of approximately 1.2 nm at the start of TEM observation grows to a size of approximately 2.6 nm at the total amount of electron irradiation of $4.2\times10^8 e^-/nm^2$. In contrast, the crystal part size in the good-quality nc-OS film shows little change from the start of electron irradiation to the total amount of electron irradiation of $4.2\times10^8 e^-/nm^2$ regardless of the amount of electron irradiation.

Furthermore, in FIG. 15, by linear approximation of the change in the crystal part size in the amorphous-like OS film and the nc-OS film and extrapolation to the total amount of electron irradiation of $0 e^-/nm^2$, the average size of the crystal part is found to be a positive value. This means that the crystal parts exist in the amorphous-like OS film and the nc-OS film before TEM observation.

Note that an oxide semiconductor film may be a stacked-layer film including two or more films of an amorphous oxide semiconductor film, a microcrystalline oxide semiconductor film, and a CAAC-OS film, for example.

In the case where an oxide semiconductor film has a plurality of structures, the structures can be analyzed using nanobeam electron diffraction in some cases.

Figure 14A:
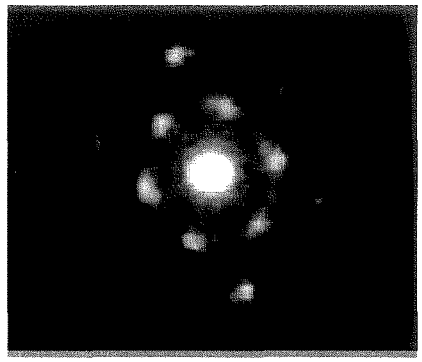
FIGS. 14A to 14D show nanobeam electron diffraction patterns of oxide semiconductor films and an example of a transmission electron diffraction measurement apparatus.
Figure 14B:
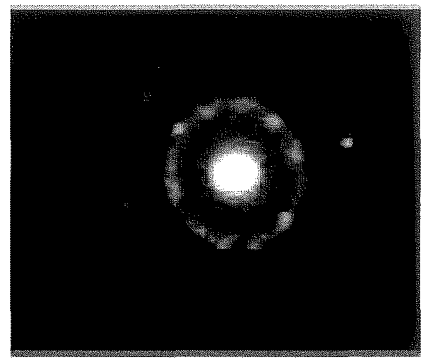
Figure 14C:
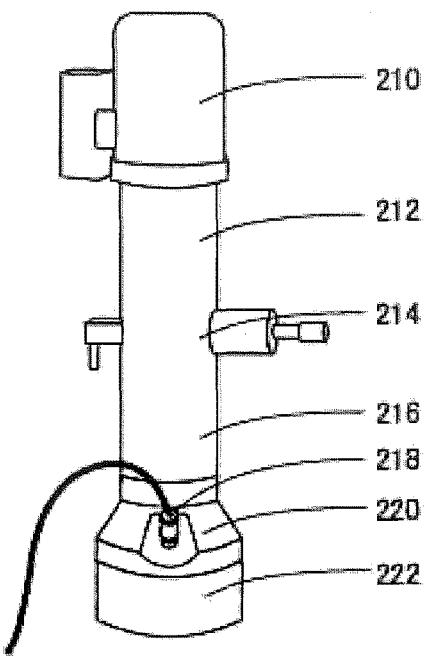

FIG. 14C illustrates a transmission electron diffraction measurement apparatus which includes an electron gun chamber 210, an optical system 212 below the electron gun chamber 210, a sample chamber 214 below the optical system 212, an optical system 216 below the sample chamber 214, an observation chamber 220 below the optical system 216, a camera 218 installed in the observation chamber 220, and a film chamber 222 below the observation chamber 220. The camera 218 is provided to face toward the inside of the observation chamber 220. Note that the film chamber 222 is not necessarily provided.

Figure 14D:
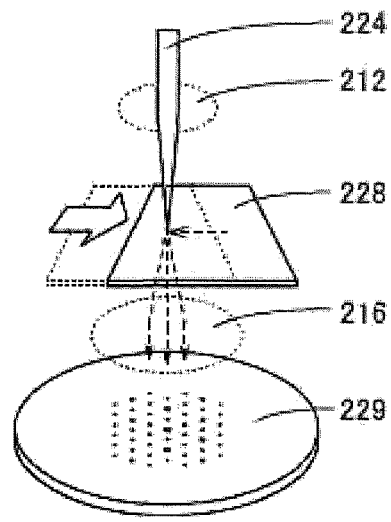

FIG. 14D illustrates an internal structure of the transmission electron diffraction measurement apparatus illustrated in FIG. 14C. In the transmission electron diffraction measurement apparatus, a substance 228 which is positioned in the sample chamber 214 is irradiated with electrons emitted from an electron gun installed in the electron gun chamber 210 through the optical system 212. Electrons passing through the substance 228 are incident on a fluorescent plate 229 provided in the observation chamber 220 through the optical system 216. On the fluorescent plate 229, a pattern corresponding to the intensity of the incident electrons appears, which allows measurement of a transmission electron diffraction pattern.

The camera 218 is installed so as to face the fluorescent plate 229 and can take an image of a pattern appearing on the fluorescent plate 229. An angle formed by a straight line which passes through the center of a lens of the camera 218 and the center of the fluorescent plate 229 and an upper surface of the fluorescent plate 229 is, for example, 15° or more and 80° or less, 30° or more and 75° or less, or 45° or more and 70° or less. As the angle is reduced, distortion of the transmission electron diffraction pattern taken by the camera 218 becomes larger. Note that if the angle is obtained in advance, the distortion of an obtained transmission electron diffraction pattern can be corrected. Note that the film chamber 222 may be provided with the camera 218. For example, the camera 218 may be set in the film chamber 222 so as to be opposite to the incident direction of electrons 224. In this case, a transmission electron diffraction pattern with less distortion can be taken from the rear surface of the fluorescent plate 229.

A holder for fixing the substance 228 that is a sample is provided in the sample chamber 214. The holder transmits electrons passing through the substance 228. The holder may have, for example, a function of moving the substance 228 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 lam. The range is preferably determined to be an optimal range for the structure of the substance 228.

Then, a method for measuring a transmission electron diffraction pattern of a substance by the transmission electron diffraction measurement apparatus described above will be described.

For example, changes in the structure of a substance can be observed by changing the irradiation position of the electrons 224 that are a nanobeam on the substance (or by scanning) as illustrated in FIG. 14D. At this time, when the substance 228 is a CAAC-OS film, a diffraction pattern shown in FIG. 14A is observed. When the substance 228 is an nc-OS film, a diffraction pattern shown in FIG. 14B is observed.

Even when the substance 228 is a CAAC-OS film, a diffraction pattern similar to that of an nc-OS film or the like is partly observed in some cases. Therefore, whether a CAAC-OS film is favorable can be determined by the proportion of a region where a diffraction pattern of a CAAC-OS film is observed in a predetermined area (also referred to as proportion of CAAC). In the case of a high-quality CAAC-OS film, for example, the proportion of CAAC is higher than or equal to 50%, preferably higher than or equal to 80%, further preferably higher than or equal to 90%, still further preferably higher than or equal to 95%. Note that the proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") or subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 16A:
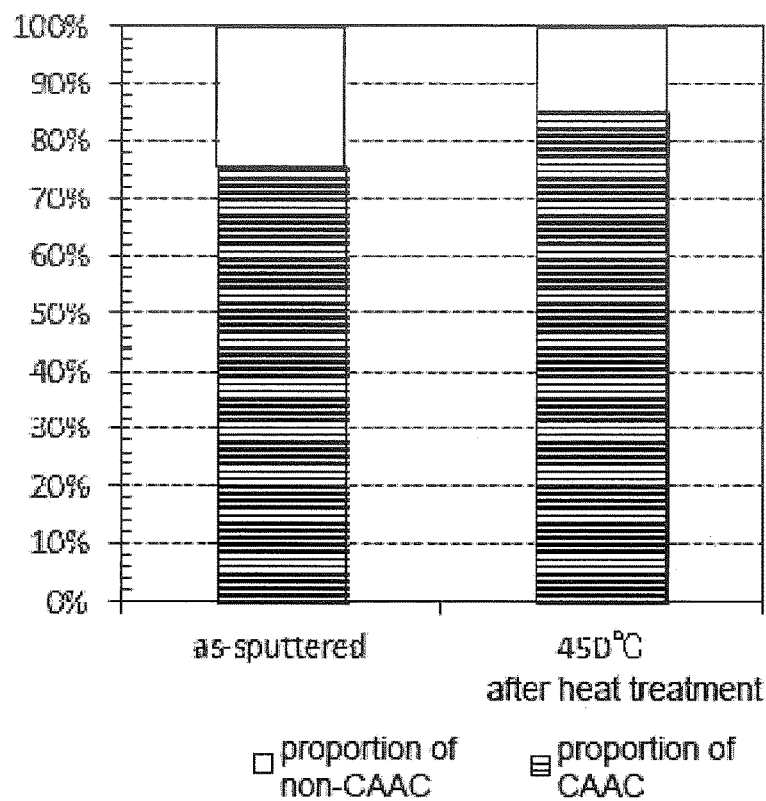
FIGS. 16A to 16C show an example of structural analysis by transmission electron diffraction measurement and high-resolution planar TEM images.

FIG. 16A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 16B:
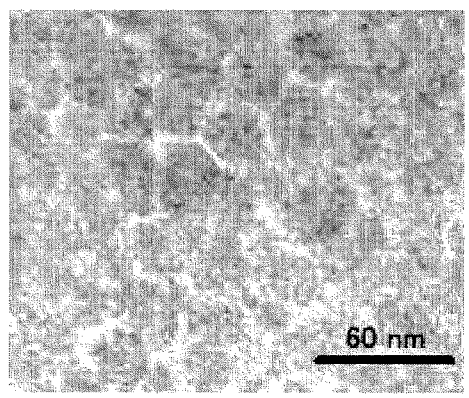
Figure 16C:
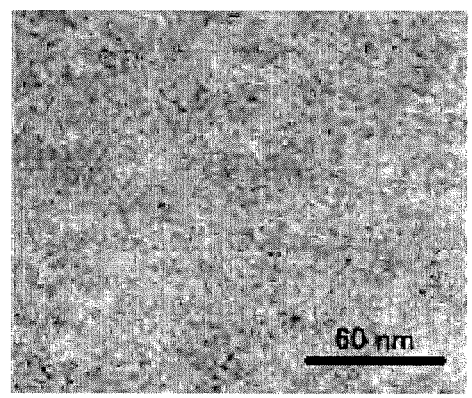

FIGS. 16B and 16C are high-resolution plan-view TEM images of the CAAC-OS film obtained just after the deposition and the CAAC-OS film subjected to the heat treatment at 450° C., respectively. Comparison between FIGS. 16B and 16C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

Note that the structures, methods, and the like described in this embodiment can be used as appropriate in combination with any of the structures, methods, and the like described in the other embodiments.

(Embodiment 4)

Next, deposition models of a CAAC-OS and an nc-OS are described.

Figure 17A:
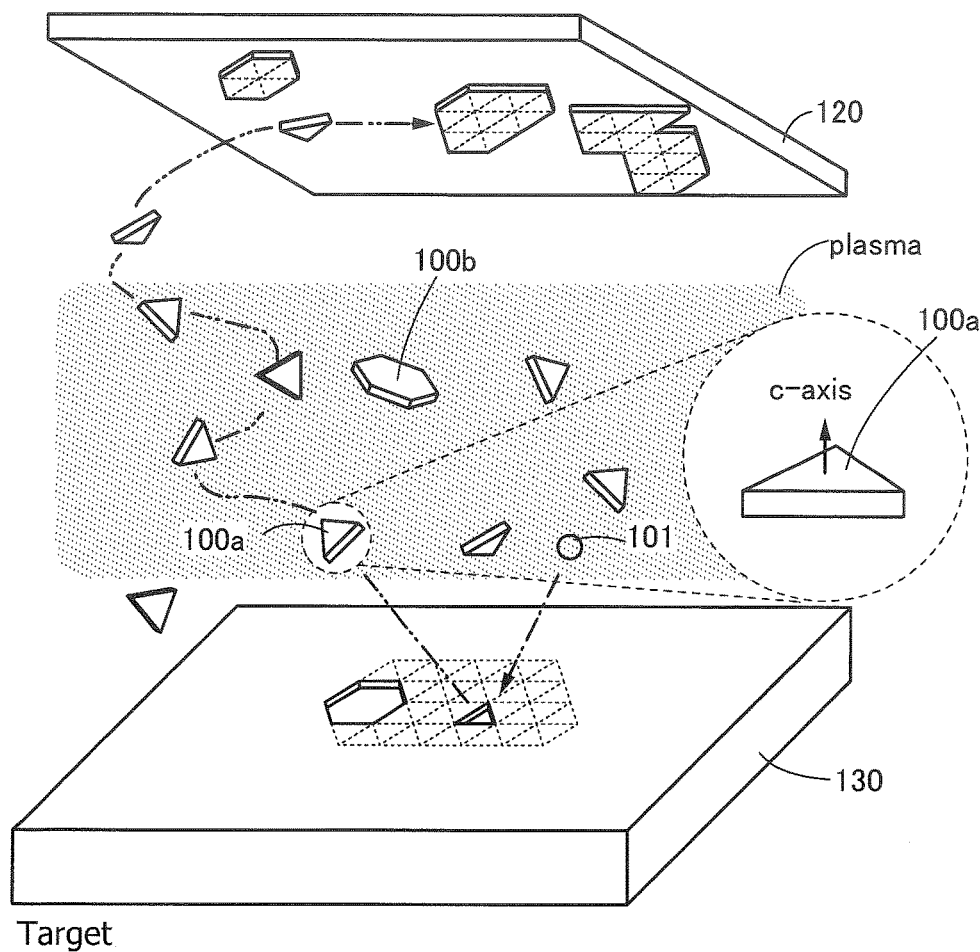
FIGS. 17A to 17C is a schematic view illustrating a CAAC-OS deposition model and cross-sectional views of pellets and a CAAC-OS.

FIG. 17A a schematic view of the inside of a deposition chamber where a CAAC-OS is deposited by a sputtering method.

A target 130 is attached to a backing plate. Under the target 130 and the backing plate, a plurality of magnets is placed. The plurality of magnets generates a magnetic field over the target 130. A sputtering method in which the deposition speed is increased by utilizing a magnetic field of magnets is referred to as a magnetron sputtering method.

The target 130 has a polycrystalline structure in which a cleavage plane exists in at least one crystal grain. Note that the details of the cleavage plane are described later.

A substrate 120 is placed to face the target 130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 50 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 130, and plasma is observed. Note that the magnetic field over the target 130 forms a high-density plasma region. In the high-density plasma region, the deposition gas is ionized, so that an ion 101 is generated. Examples of the ion 101 include an oxygen cation ($O^+$) and an argon cation ($Ar^+$).

The ion 101 is accelerated toward the target 130 by an electric field, and collides with the target 130 eventually. At this time, a pellet 100*a* and a pellet 100*b* which are flat-plate-like (pellet-like) sputtered particles are separated and sputtered from the cleavage plane. Note that structures of the pellet 100*a* and the pellet 100*b* may be distorted by an impact of collision of the ion 101.

The pellet 100*a* is a flat-plate-like (pellet-like) sputtered particle having a triangle plane, e.g., a regular triangle plane. The pellet 100*b* is a flat-plate-like (pellet-like) sputtered particle having a hexagon plane, e.g., regular hexagon plane. Note that flat-plate-like (pellet-like) sputtered particles such as the pellet 100*a* and the pellet 100*b* are collectively called pellets 100. The shape of a flat plane of the pellet 100 is not limited to a triangle or a hexagon. For example, the flat plane may have a shape formed by combining 2 or more and 6 or less triangles. For example, a square (rhombus) is formed by combining two triangles (regular triangles) in some cases.

The thickness of the pellet 100 is determined depending on the kind of deposition gas and the like. The thicknesses of the pellets 100 are preferably uniform; the reason for this is described later. In addition, the sputtered particle preferably has a pellet shape with a small thickness as compared to a dice shape with a large thickness.

Figure 19:
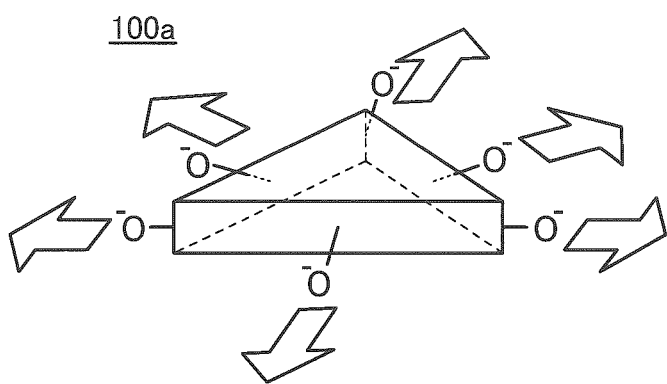
FIG. 19 illustrates a pellet.

The pellet 100 receives electric charge when passing through the plasma, so that side surfaces of the pellet 100 are negatively or positively charged in some cases. The pellet 100 includes an oxygen atom on its side surface, and the oxygen atom may be negatively charged. For example, the case in which the pellet 100*a* includes, on side surfaces, oxygen atoms that are negatively charged is illustrated in FIG. 19. As in this view, when the side surfaces are charged in the same polarity, electric charges repel each other, and accordingly, the pellet 100*a* can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged.

Figure 20:
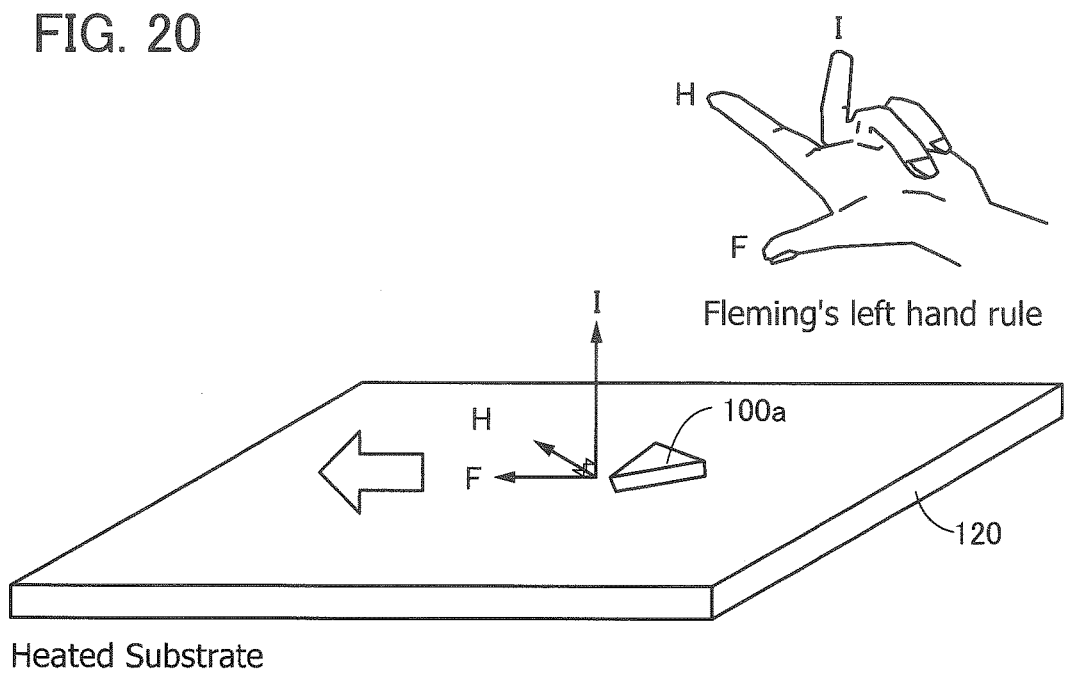
FIG. 20 illustrates force applied to a pellet on a formation surface.

As illustrated in FIGS. 17A, the pellet 100 flies like a kite in plasma and flutters up to the substrate 120. Since the pellets 100 are charged, when one pellet 100 gets close to a region where another pellet 100 has already been deposited, repulsion is generated. Here, above the substrate 120, a magnetic field is generated in a direction parallel to a top surface of the substrate 120. A potential difference is given between the substrate 120 and the target 130, and accordingly, a current flows from the substrate 120 toward the target 130. Thus, the pellet 100 is given a force (Lorentz force) on the top surface of the substrate 120 by an effect of the magnetic field and the current (see FIG. 20). This is explainable with Fleming's left-hand rule. In order to increase a force applied to the pellet 100, it is preferable to provide, around the top surface of the substrate 120, a region where the magnetic field parallel to the top surface of the substrate 120 is 10 G or higher, preferably 20 G or higher, further preferably 30 G or higher, still further preferably 50 G or higher. Alternatively, it is preferable to provide, around the top surface of the substrate 120, a region where the magnetic field parallel to the top surface of the substrate 120 is 1.5 times or more, preferably twice or more, further preferably 3 times or more, still further preferably 5 times or more as high as the magnetic field perpendicular to the top surface of the substrate 120.

Figure 21A:
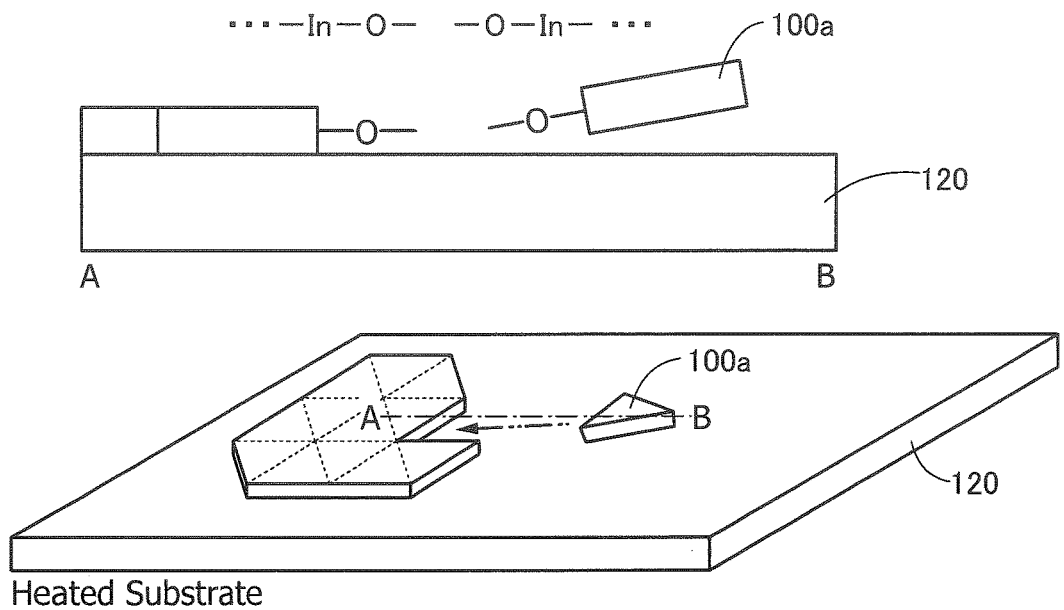
FIGS. 21A and 21B illustrate movement of a pellet on a formation surface.
Figure 21B:
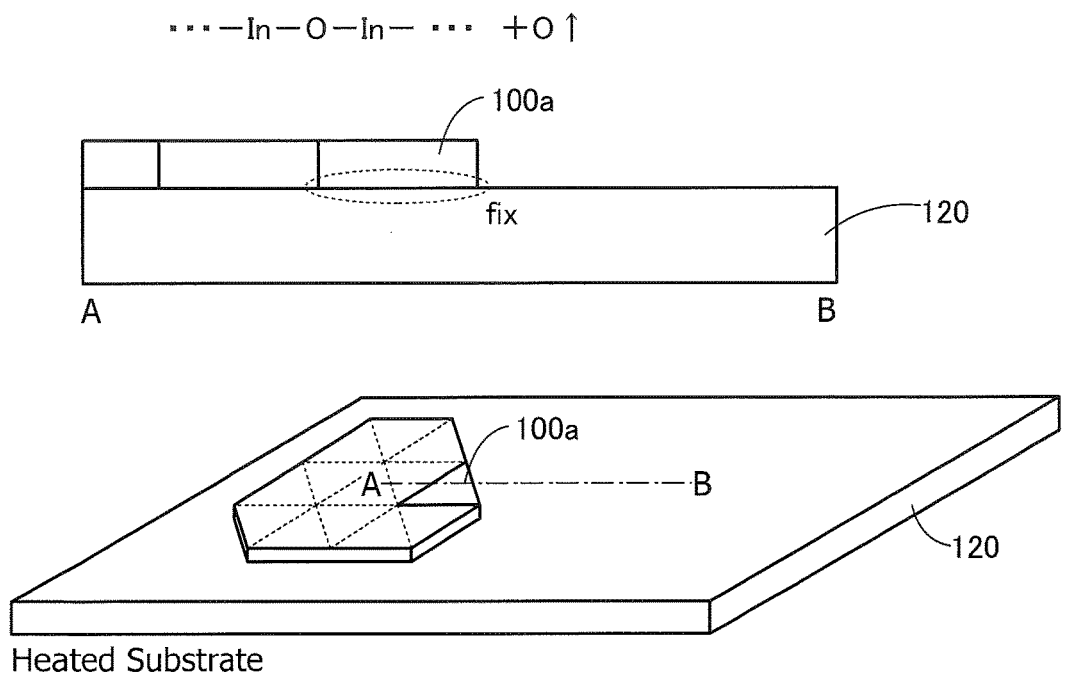

Further, the substrate 120 is heated, and the resistance such as friction between the pellet 100 and the substrate 120 is low. As a result, as illustrated in FIG. 21A, the pellet 100 glides on the top surface of the substrate 120. The glide of the pellet 100 is caused in a state where its flat plane faces the substrate 120. Then, as illustrated in FIG. 21B, when the pellet 100 reaches the side surface of another pellet 100 that has already been deposited, the side surfaces of the pellets 100 are bonded. At this time, the oxygen atom on the side surface of the pellet 100 is released. With the released oxygen atom, an oxygen vacancy in a CAAC-OS is filled in some cases; thus, the CAAC-OS has a low density of defect states.

Further, the pellet 100 is heated over the substrate 120, whereby atoms are rearranged and the structure distortion caused by the collision of the ion 101 can be reduced. The pellet 100 whose structure distortion is reduced is substantially single crystal. Even when the pellets 100 are heated after being bonded, expansion and contraction of the pellet 100 itself hardly occur because the pellet 100 is substantially single crystal. Thus, formation of defects such as a grain boundary due to expansion of a space between the pellets 100 can be prevented, and accordingly, generation of crevasses can be prevented. Further, it is considered that the space is filled with elastic metal atoms and the like that have a function, like a highway, of jointing side surfaces of the pellets 100 which are not aligned with each other. As shown in such a model, the pellets 100 are considered to be deposited on the substrate 120. Thus, a CAAC-OS film can be deposited even when a formation surface does not have a crystal structure, unlike epitaxial growth. For example, even when the top surface (formation surface) of the substrate 120 has an amorphous structure, a CAAC-OS can be deposited.

Figure 17B:
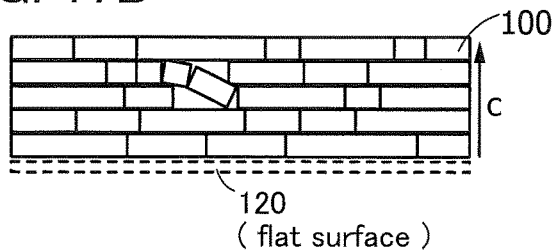

It is also found that, not only on a flat surface, but also on an uneven portion at the formation surface, i.e., the top surface of the substrate 120, the pellets 100 in the CAAC-OS are arranged in accordance with its shape. For example, in the case where the top surface of the substrate 120 is flat at the atomic level, the pellets 100 are arranged so that flat planes parallel to the a-b plane face downwards; thus, a layer with a uniform thickness, flatness, and high crystallinity is formed. By stacking n layers (n is a natural number), the CAAC-OS can be obtained (see FIG. 17B).

Figure 17C:
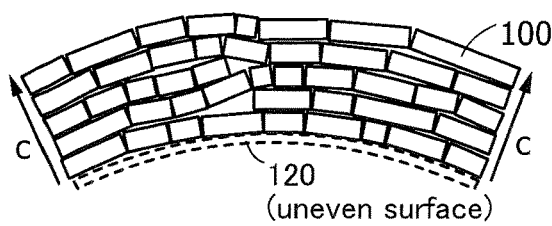

In the case where the top surface of the substrate 120 has unevenness, a CAAC-OS in which n layers (n is a natural number) in each of which the pellets 100 are arranged along the convex surface are stacked is formed. Since the substrate 120 has unevenness, a space is easily generated between the pellets 100 in the CAAC-OS in some cases. Note that owing to intermolecular force, the pellets 100 are arranged so that a space between the pellets is as small as possible even on the uneven surface. Therefore, even when the formation surface has unevenness, a CAAC-OS with high crystallinity can be formed (see FIG. 17C).

As a result, laser crystallization is not needed for formation of a CAAC-OS, and a uniform film can be formed even over a large-sized glass substrate or the like.

Since a CAAC-OS is deposited in accordance with such a model, the sputtered particle preferably has a pellet shape with a small thickness. Note that when the sputtered particles have a dice shape with a large thickness, planes facing the substrate 120 vary; thus, the thicknesses and orientations of the crystals cannot be uniform in some cases.

According to the deposition model described above, a CAAC-OS with high crystallinity can be formed even on a formation surface with an amorphous structure.

Further, formation of a CAAC-OS can be explained by a deposition model including a zinc oxide particle besides the pellet 100.

The zinc oxide particle reaches the substrate 120 before the pellet 100 does because the zinc oxide particle is smaller than the pellet 100 in mass. On the top surface of the substrate 120, crystal growth of the zinc oxide particle preferentially occurs in the horizontal direction, so that a thin zinc oxide layer is formed. The zinc oxide layer has c-axis alignment. Note that c-axes of crystals in the zinc oxide layer are aligned in the direction parallel to a normal vector of the substrate 120. The zinc oxide layer serves as a seed layer that makes a CAAC-OS grow and thus has a function of increasing the crystallinity of the CAAC-OS. The thickness of the zinc oxide layer is greater than or equal to 0.1 nm and less than or equal to 5 nm, mostly greater than or equal to 1 nm and less than or equal to 3 nm. Since the zinc oxide layer is sufficiently thin, hardly any grain boundary is observed.

Thus, in order to deposit a CAAC-OS with high crystallinity, a target containing zinc at a higher proportion than the stoichiometric composition is preferably used.

An nc-OS can be understood with a deposition model illustrated in FIG. 18. Note that a difference between FIG. 18 and FIG. 17A lies only in whether the substrate 120 is heated or not.

Thus, the substrate 120 is not heated, and the resistance such as friction between the pellet 100 and the substrate 120 is high. As a result, the pellets 100 cannot glide on the top surface of the substrate 120 and are stacked randomly, so that an nc-OS can be obtained.

[Cleavage Plane]

A cleavage plane of a target that has been mentioned in the deposition model of the CAAC-OS is described below.

Figure 22A:
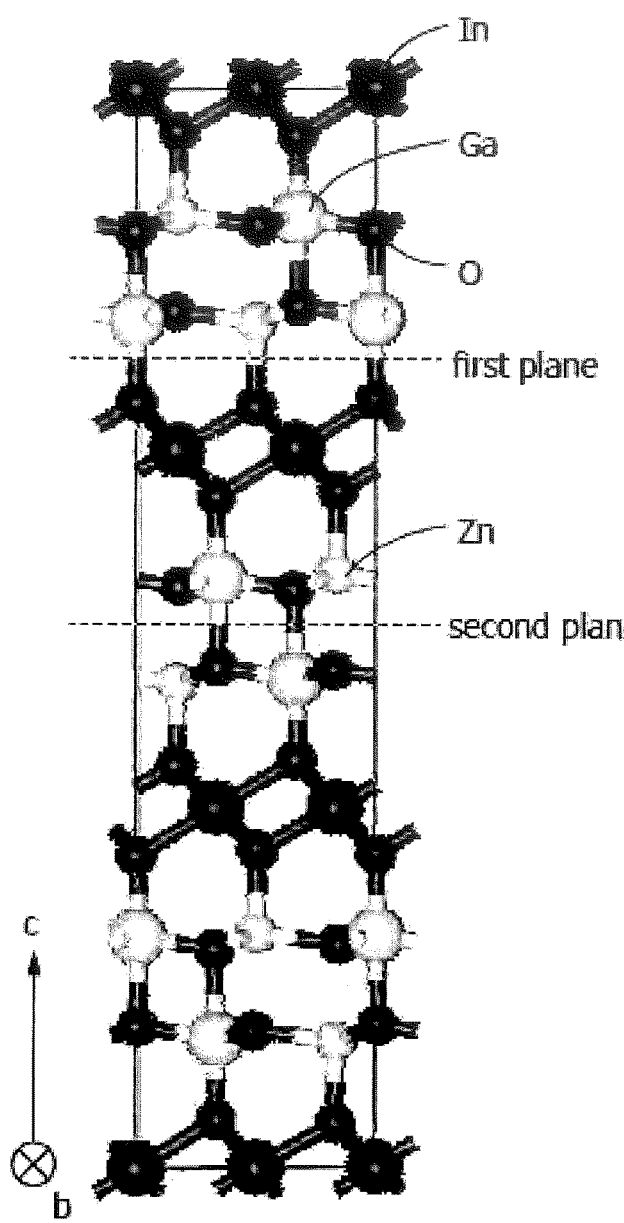
FIGS. 22A and 22B illustrate a crystal of $InGaZnO_4$.
Figure 22B:
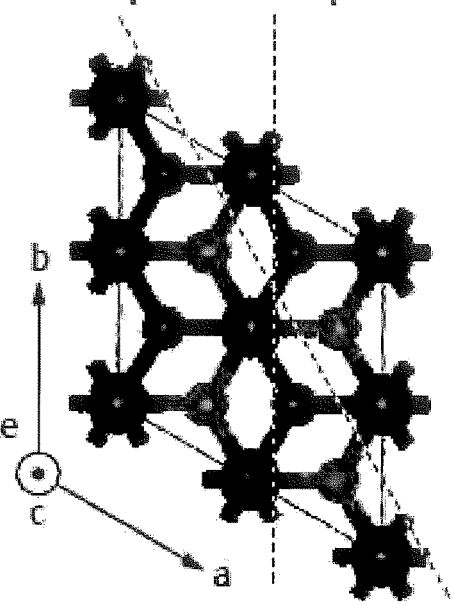

First, a cleavage plane of a target is described with reference to FIGS. 22A and 22B. FIGS. 22A and 22B show a structure of an InGaZnO$_4$ crystal. Note that FIG. 22A shows a structure of the InGaZnO$_4$ crystal observed from a direction parallel to the b-axis when the c-axis is in an upward direction. Further, FIG. 22B shows a structure of the InGaZnO$_4$ crystal observed from a direction parallel to the c-axis.

Energy needed for cleavage at each crystal plane of the InGaZnO$_4$ crystal is calculated by the first principles calculation. Note that a pseudopotential and a program (here, CASTEP) of density functional theory using the plane wave basis are used for the calculation. Note that an ultrasoft pseudopotential is used as the pseudopotential. Further, GGA/PBE is used as the functional. Cut-off energy is 400 eV.

Energy of a structure in an initial state is obtained after structural optimization including a cell size is performed. Further, energy of a structure after the cleavage at each plane is obtained after structural optimization of atomic arrangement is performed in a state where the cell size is fixed.

On the basis of the structure of the InGaZnO$_4$ crystal shown in FIGS. 22A and 22B, a structure cleaved at any one of a first plane, a second plane, a third plane, and a fourth plane is formed and subjected to structural optimization calculation in which the cell size is fixed. Here, the first plane is a crystal plane between a Ga—Zn—O layer and an In—O layer and is parallel to the (001) plane (or the a-b plane) (see FIG. 22A). The second plane is a crystal plane between a Ga—Zn—O layer and a Ga—Zn—O layer and is parallel to the (001) plane (or the a-b plane) (see FIG. 22A). The third plane is a crystal plane parallel to the (110) plane (see FIG. 22B). The fourth plane is a crystal plane parallel to the (100) plane (or the b-c plane) (see FIG. 22B).

Under the above conditions, the energy of the structure at each plane after the cleavage is calculated. Next, a difference between the energy of the structure after the cleavage and the energy of the structure in the initial state is divided by the area of the cleavage plane; thus, cleavage energy which serves as a measure of easiness of cleavage at each plane is calculated. Note that the energy of a structure indicates energy obtained in such a manner that electronic kinetic energy of electrons included in the structure and interactions between atoms included in the structure, between the atom and the electron, and between the electrons are considered.

As calculation results, the cleavage energy of the first plane is 2.60 J/m$^2$, that of the second plane is 0.68 J/m$^2$, that of the third plane is 2.18 J/m$^2$, and that of the fourth plane is 2.12 J/m$^2$ (see Table 1).

TABLE 1

| | Cleavage energy [J/m$^2$] |
|---|---|
| First plane | 2.60 |
| Second plane | 0.68 |
| Third plane | 2.18 |
| Fourth plane | 2.12 |

From the calculations, in the structure of the InGaZnO$_4$ crystal shown in FIGS. 22A and 22B, the cleavage energy at the second plane is the lowest. In other words, along a plane between a Ga—Zn—O layer and a Ga—Zn—O layer, cleavage is caused most easily (cleavage plane). Therefore, in this specification, the cleavage plane indicates the second plane, which is a plane where cleavage is caused most easily.

Since the cleavage plane is the second plane between a Ga—Zn—O layer and a Ga—Zn—O layer, the InGaZnO$_4$ crystals in FIG. 22A can be separated at two planes equivalent to the second plane. Therefore, when an ion or the like collides with a target, a wafer-like unit (we call this a pellet) which is cleaved at a plane with the lowest cleavage energy is separated off as the minimum unit. In that case, a pellet of InGaZnO$_4$ includes three layers: a Ga—Zn—O layer, an In—O layer, and a Ga—Zn—O layer.

The cleavage energies of the third plane (crystal plane parallel to the (110) plane) and the fourth plane (crystal plane parallel to the (100) plane (or the b-c plane)) are lower than that of the first plane (crystal plane between the Ga—Zn—O layer and the In—O layer and crystal plane parallel to the (001) plane (or the a-b plane)), which suggests that most of the flat planes of the pellets have triangle shapes or hexagonal shapes.

Next, classical molecular dynamics calculation is conducted to examine a cleavage plane, assuming that an InGaZnO$_4$ crystal having a homologous structure is used as a target and the target is sputtered using argon (Ar) or oxygen (O). FIG. 23A shows a cross-sectional structure of an InGaZnO$_4$ crystal (2688 atoms) used for the calculation, and FIG. 23B shows a top structure thereof. Note that a fixed layer in FIG. 23A is a layer which prevents the positions of the atoms from moving. A temperature control layer in FIG. 23A is a layer whose temperature is fixed at a constant temperature (300 K).

For the classical molecular dynamics calculation, Materials Explorer 5.0 manufactured by Fujitsu Limited. is used. Note that the initial temperature, the cell size, the time step size, and the number of steps are set to be 300 K, constant, 0.01 fs, and 1000 million, respectively. In calculation, an atom to which an energy of 300 eV is applied enters a cell from a direction perpendicular to the a-b plane of the InGaZnO$_4$ crystal under the above conditions.

FIG. 24A shows an atomic arrangement when 99.9 picoseconds have passed after argon collides with the cell including the InGaZnO$_4$ crystal in FIGS. 23A and 23B. FIG. 24B shows an atomic arrangement when 99.9 picoseconds (psec) have passed after oxygen enters the cell. Note that in FIGS. 24A and 24B, part of the fixed layer in FIG. 23A is omitted.

According to FIG. 24A, between the enter of argon to the cell and 99.9 picoseconds later, a crack is formed from the cleavage plane corresponding to the second plane shown in FIG. 22A. Thus, in the case where argon collides with the InGaZnO$_4$ crystal and the uppermost surface is the second plane (the zero-th), a large crack is found to be formed in the second plane (the second).

On the other hand, according to FIG. 24B, between the enter of oxygen to the cell and 99.9 picoseconds later, a crack is found to be formed from the cleavage plane corresponding to the second plane in FIG. 22A. Note that in the case where oxygen collides with the cell, a large crack is found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a flat-plate-like sputtered particle (pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a manner that a defect caused by the damage reacts with oxygen.

Here, a difference in size of the pellet depending on atoms which are made to collide is studied.

Figure 25A:
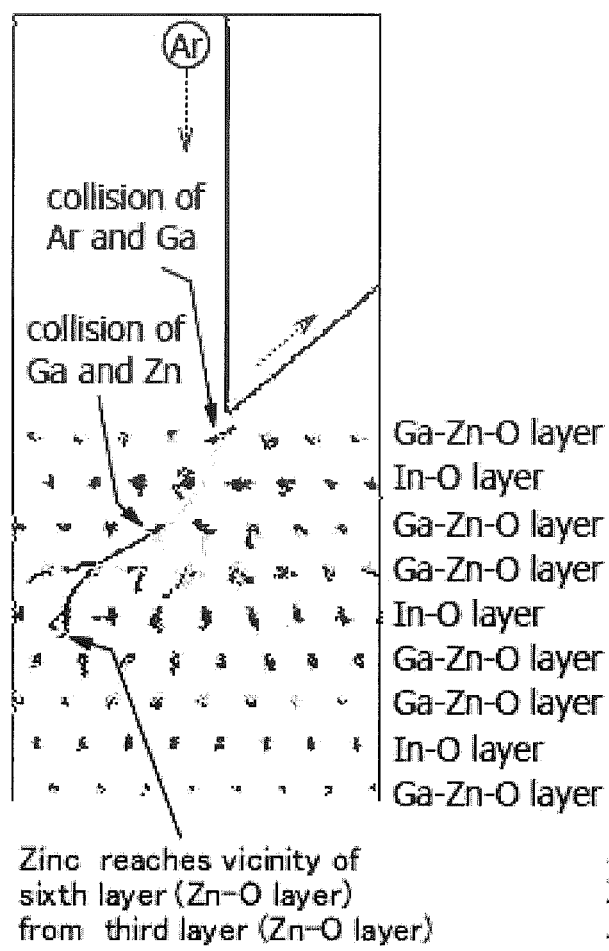
FIGS. 25A and 25B show trajectories of atoms after collision of atoms.

FIG. 25A shows trajectories of the atoms from 0 picoseconds to 0.3 picoseconds after argon enters the cell including the InGaZnO$_4$ crystal in FIGS. 23A and 23B. Accordingly, FIG. 25A corresponds to a period from FIGS. 23A and 23B to FIG. 24A.

According to FIG. 25A, when argon collides with gallium (Ga) of the first layer (Ga—Zn—O layer), the gallium collides with zinc (Zn) of the third layer (Ga—Zn—O layer) and then, the zinc reaches the vicinity of the sixth layer (Ga—Zn—O layer). Note that the argon which collides with the gallium is sputtered to the outside. Accordingly, in the case where argon collides with the target including the InGaZnO$_4$ crystal, a crack is thought to be formed in the second plane (the second) in FIG. 23A.

Figure 25B:
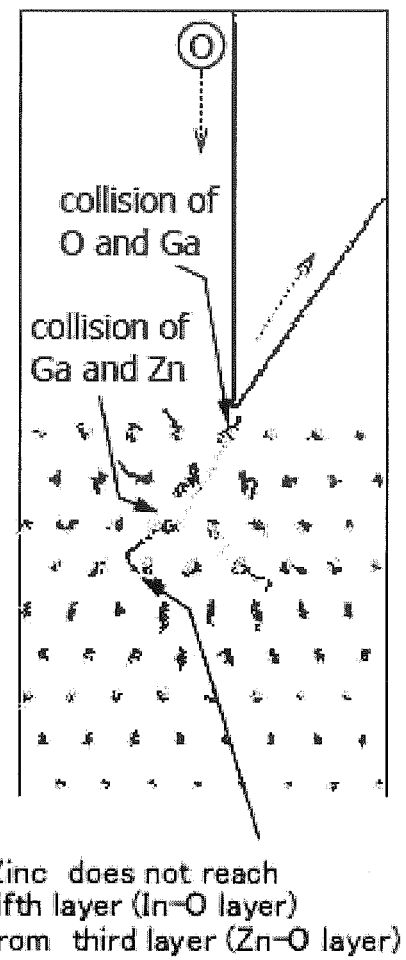

FIG. 25B shows trajectories of the atoms from 0 picoseconds to 0.3 picoseconds after oxygen enters the cell including the InGaZnO$_4$ crystal in FIGS. 23A and 23B. Accordingly, FIG. 25B corresponds to a period from FIGS. 23A and 23B to FIG. 24A.

On the other hand, according to FIG. 25B, when oxygen collides with gallium (Ga) of the first layer (Ga—Zn—O layer), the gallium collides with zinc (Zn) of the third layer (Ga—Zn—O layer) and then, the zinc does not reach the fifth layer (In—O layer). Note that the oxygen which collides with the gallium is sputtered to the outside. Accordingly, in the case where oxygen collides with the target including the InGaZnO$_4$ crystal, a crack is thought to be formed in the second plane (the first) in FIG. 23A.

This calculation also shows that the InGaZnO$_4$ crystal with which an atom (ion) collides is separated from the cleavage plane.

In addition, a difference in depth of a crack is examined in view of conservation laws. The conservation law of energy and the conservation law of momentum can be represented by the following formula (1) and the following formula (2). Here, E represents energy of argon or oxygen before collision (300 eV), $m_A$ represents mass of argon or oxygen, $v_A$ represents the speed of argon or oxygen before collision, $v'_A$ represents the speed of argon or oxygen after collision, $m_{Ga}$ represents mass of gallium, $v_{Ga}$ represents the speed of gallium before collision, and $v'_{Ga}$ represents the speed of gallium after collision.

[Formula 1]

$$E = \tfrac{1}{2} m_A v_A^2 + \tfrac{1}{2} m_{Ga} v_{Ga}^2 \quad (1)$$

[Formula 2]

$$m_A v_A + m_{Ga} v_{Ga} = m_A v'_A + m_{Ga} v'_{Ga} \quad (2)$$

On the assumption that collision of argon or oxygen is elastic collision, the relationship among $v_A$, $v'_A$, $v_{Ga}$, and $v'_{Ga}$ can be represented by the following formula (3).

[Formula 3]

$$v'_A - v'_{Ga} = -(v_A - v_{Ga}) \quad (3)$$

From the formulae (1), (2), and (3), when $v_{Ga}$ is 0, the speed of gallium $v'_{Ga}$ after collision of argon or oxygen can be represented by the following formula (4).

[Formula 4]

$$v'_{Ga} = \frac{\sqrt{m_A}}{m_A + m_{Ga}} \cdot 2\sqrt{2E} \quad (4)$$

In Formula (4), mass of argon or oxygen is substituted into $m_A$, and the speeds of gallium after collision of the atoms are compared. In the case where argon and oxygen have the same energy before collision, the speed of gallium in the case where argon collides with gallium was found to be 1.24 times the speed of gallium in the case where oxygen collides with gallium. Thus, the energy of gallium in the case where argon collides with gallium is higher than that in the case where oxygen collides with gallium by the square of the speed.

The speed (energy) of gallium after collision in the case where argon collides with gallium is found to be higher than that in the case where oxygen collides with gallium. Accordingly, it is considered that a crack is formed at a deeper position in the case where argon collides with gallium than in the case where oxygen collides with gallium.

The above calculation shows that when sputtering is performed using a target including the InGaZnO$_4$ crystal having a homologous structure, separation occurs from the cleavage plane to form a pellet. In contrast, when a region of a target having no cleavage plane is sputtered, a pellet is not formed, and a sputtered particle which has an atomic-level size and is finer than a pellet is formed. Since the sputtered particle is smaller than the pellet, the sputtered particle is thought to be removed through a vacuum pump connected to a sputtering apparatus. Therefore, a model in which particles with a variety of sizes and shapes fly to a substrate and are deposited hardly applies to the case where sputtering is performed using a target including the InGaZnO$_4$ crystal having a homologous structure. The model illustrated in FIG. 17A, for example, in which sputtered pellets are deposited to form a CAAC-OS is reasonable.

The CAAC-OS deposited in such a manner has a density substantially equal to that of a single crystal OS. For example, the density of the single crystal OS having a homologous structure of InGaZnO$_4$ is 6.36 g/cm$^3$, and the density of the CAAC-OS having substantially the same atomic ratio is approximately 6.3 g/cm$^3$.

Figure 26A:
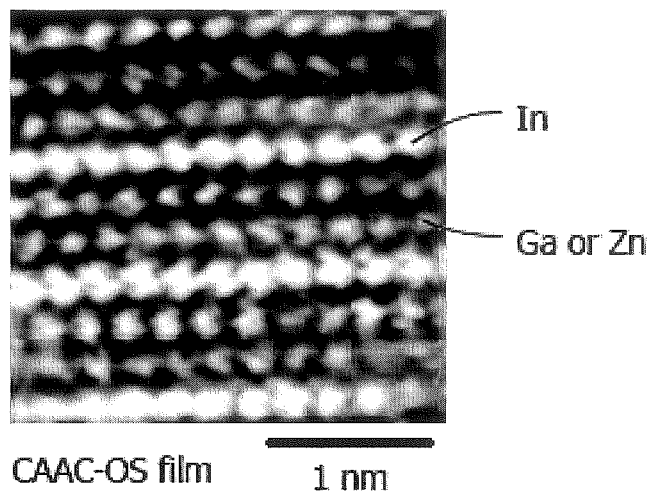
FIGS. 26A and 26B are cross-sectional HAADF-STEM images of a CAAC-OS and a target.
Figure 26B:
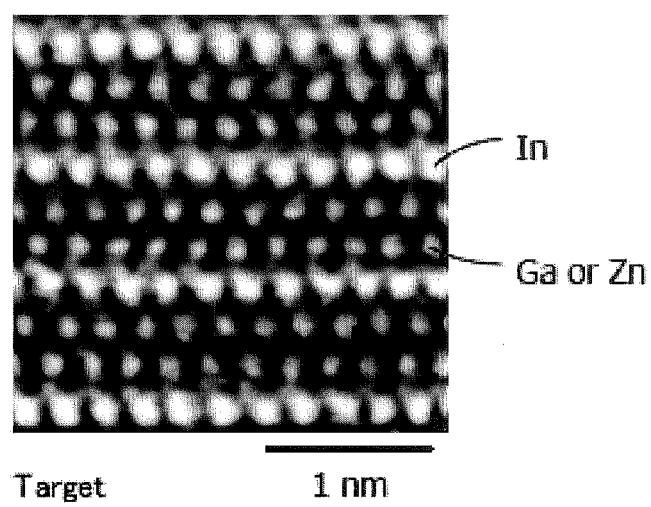

FIGS. 26A and 26B show atomic arrangements of cross sections of an In—Ga—Zn oxide (see FIG. 26A) that is a CAAC-OS deposited by a sputtering method and a target thereof (see FIG. 26B). For observation of the atomic arrangement, a high-angle annular dark field scanning transmission electron microscopy (HAADF-STEM) is used. In the case of observation by HAADF-STEM, the intensity of an image of each atom is proportional to the square of its atomic number. Therefore, Zn (atomic number: 30) and Ga (atomic number: 31), whose atomic numbers are close to each other, are hardly distinguished from each other. A Hitachi scanning transmission electron microscope HD-2700 is used for the HAADF-STEM.

When FIG. 26A and FIG. 26B are compared, it is found that the CAAC-OS and the target each have a homologous structure and their arrangements of atoms correspond to each other. Thus, as illustrated in the deposition model in FIG. 17A, for example, the crystal structure of the target is transferred, whereby a CAAC-OS is formed.

Note that the structures, methods, and the like described in this embodiment can be used as appropriate in combination with any of the structures, methods, and the like described in the other embodiments.

(Embodiment 5)

In this embodiment, a cross-sectional structure of a transistor included in a semiconductor device of one embodiment of the disclosed invention will be described with reference to drawings.

<Schematic Views of Cross-sectional Structure>

First, schematic views of a cross-sectional structure of a semiconductor device of one embodiment of the invention will be described with reference to FIGS. 27A and 27B.

Transistors included in the semiconductor device of one embodiment of the present invention are constituted of Si transistors and OS transistors. For example, the semiconductor device has a cross-sectional structure in which a layer including Si transistors and a layer including OS transistors are stacked. Each of the layers includes a plurality of transistors including semiconductor layers of the same material.

Figure 27A:
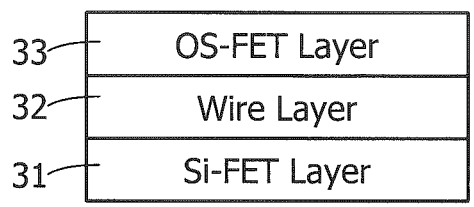
FIGS. 27A and 27B are schematic cross-sectional views illustrating one embodiment of the present invention.

The semiconductor device of one embodiment of the present invention can be formed by, for example as illustrated in FIG. 27A, stacking a layer 31 including Si transistors (represented as Si-FET Layer in the drawing), a layer 32 in which a wiring is provided (represented as Wire Layer in the drawing), and a layer 33 including OS transistors (represented as OS-FET Layer in the drawing) in this order.

In the schematic view of the cross-sectional structure in FIG. 27A, the layer 31 including Si transistors includes Si transistors formed on a single crystal silicon substrate. Note that the Si transistors may be transistors including a thin semiconductor film of silicon, germanium, or the like in an amorphous, microcrystalline, polycrystalline, or single crystal state.

The layer 33 including OS transistors in the schematic view of the cross-sectional structure in FIG. 27A includes OS transistors formed over a planarized insulating surface.

The layer 32 in which a wiring is provided in the schematic view of the cross-sectional structure in FIG. 27A includes a wiring for electrically connecting transistors in the layer 31 including Si transistors and/or the layer 33 including OS transistors or includes a wiring for supplying a potential to the transistors. Although the layer 32 in which a wiring is provided is illustrated as a single layer in FIG. 27A, it may include a plurality of stacked layers.

Furthermore, although the layer 33 including OS transistors is illustrated as a single layer in the schematic view of the cross-sectional structure in FIG. 27A, it may include a plurality of stacked layers. In the case of stacking a plurality of layers, the schematic view of the cross sectional structure is as illustrated in FIG. 27B.

Figure 27B:
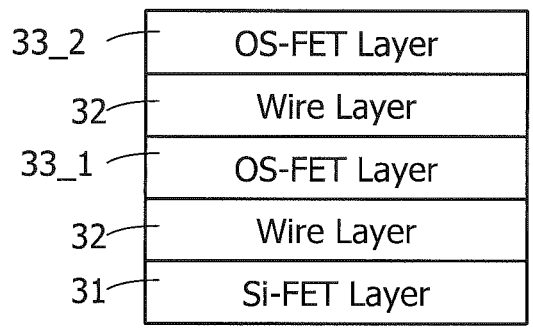

In FIG. 27B, a two-layer structure including a layer 33_1 including OS transistors and a layer 33_2 including OS transistors is illustrated. In the schematic view of the cross-sectional structure in FIG. 27B, the layer 33_1 including OS transistors and the layer 33_2 including OS transistors include OS transistors each formed over a planarized insulating surface. Although the example of stacking two layers is illustrated in FIG. 27B, the number of stacked layers is not limited to two. The layer 32 in which a wiring is provided can be provided between the layer 33_1 including OS transistors and the layer 33_2 including OS transistors. With this structure, OS transistors can be electrically connected to each other.

The transistors 11 to 13 described in FIG. 1 in Embodiment 1 are OS transistors and the transistor 14 is a Si transistor. In the case where the transistors in FIG. 1 are provided in layers in FIGS. 27A and 27B, the transistor 14 is provided in the layer 31 including Si transistors and the transistors 11 to 13 are provided in the layers 33, 33_1, and 33_2 including OS transistors. Stacking the layer including OS transistors and the layer including Si transistors as illustrated in FIGS. 27A and 27B enables a reduction in the circuit area of a memory cell, that is, the chip area of the semiconductor device.

<Cross-sectional Structure of Layer Including Si transistors and Layer in which Wiring is Provided>

Figure 28:
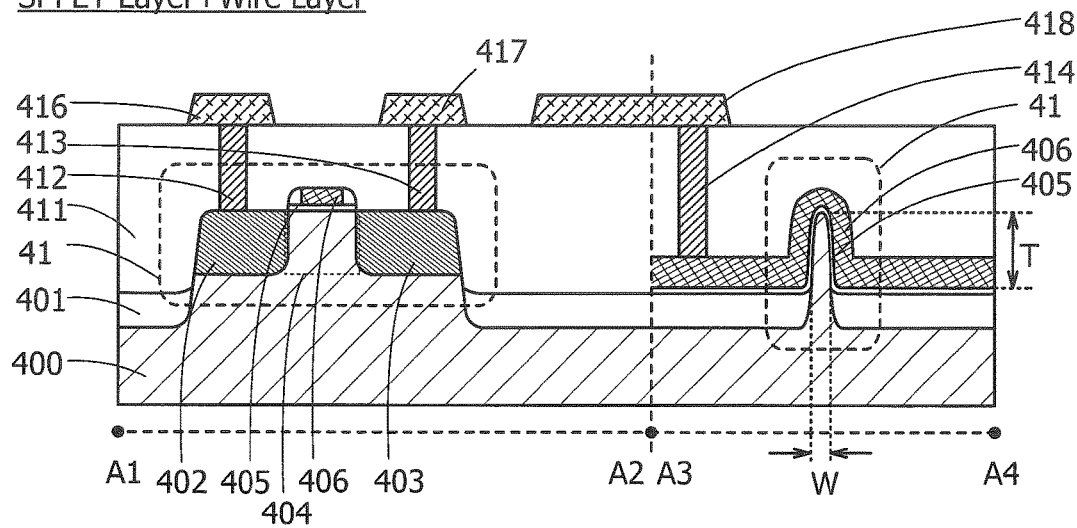
FIG. 28 is a cross-sectional view illustrating one embodiment of the present invention.

Next, FIG. 28 illustrates an example of a cross-sectional structure of the layer 31 including Si transistors and the layer 32 in which a wiring is provided which are described with reference to FIGS. 27A and 27B. In FIG. 28, a cross-sectional structure of a transistor 41 included in the layer 31 including Si transistors is illustrated. The cross-sectional structure of the transistor 14 in FIG. 1 can be applied to the transistors illustrated in Embodiment 1, for example.

In FIG. 28, a region along dashed line A1-A2 shows a structure of the transistor 41 in the channel length direction, and a region along dashed line A3-A4 shows a structure of the transistor 41 in the channel width direction.

In FIG. 28, a substrate 400 where the transistor 41 is formed can be, for example, a silicon substrate, a germanium substrate, or a silicon germanium substrate. In FIG. 28, a single crystal silicon substrate is used as the substrate 400.

The transistor 41 is electrically isolated by an element isolation method. As the element isolation method, a trench isolation method (a shallow trench isolation (STI) method) or the like can be used. FIG. 28 illustrates an example where the trench isolation method is used to electrically isolate the transistor 41. Specifically, in FIG. 28, the transistor 41 is electrically isolated by element isolation using an element isolation region 401 formed in such a manner that an insulator including silicon oxide or the like is buried in a trench formed in the substrate 400 by etching or the like and then the insulator is partly removed by etching or the like.

In a projection of the substrate 400 that exists in a region other than the trench, an impurity region 402 and an impurity region 403 of the transistor 41 and a channel formation region 404 placed between the impurity regions 402 and 403 are provided. Furthermore, the transistor 41 includes an insulating film 405 covering the channel formation region 404 and a gate electrode 406 that overlaps with the channel formation region 404 with the insulating film 405 provided therebetween.

In the transistor 41, a side portion and an upper portion of the projection in the channel formation region 404 overlap with the gate electrode 406 with the insulating film 405 positioned therebetween, so that carriers flow in a wide area including the side portion and the upper portion of the channel formation region 404. Therefore, an area over the substrate occupied by the transistor 41 can be reduced, and the number of transferred carriers in the transistor 41 can be increased. As a result, the on-state current and field-effect mobility of the transistor 41 are increased. Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the transistor 41 can be further increased and the field-effect mobility of the transistor 41 can be further increased.

Note that when the transistor 41 is formed using a bulk semiconductor substrate, the aspect ratio is preferably 0.5 or more, further preferably 1 or more.

An insulating film 411 is provided over the transistor 41. Openings are formed in the insulating film 411. Conductive films 412 and 413 that are electrically connected to the impurity regions 402 and 403, respectively, and a conductive film 414 that is electrically connected to the gate electrode 406 are formed in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

Note that the layer 32 in which a wiring is provided illustrated in FIGS. 27A and 27B corresponds to conductive layers 416, 417, and 418 in FIG. 28. The layer 32 in which a wiring is provided can be stacked by forming an insulating film, an opening in the insulating film, and a conductive film in a region including the opening, in this order.

<Cross-sectional Structure of Layer Including OS transistors>

Figure 29A:
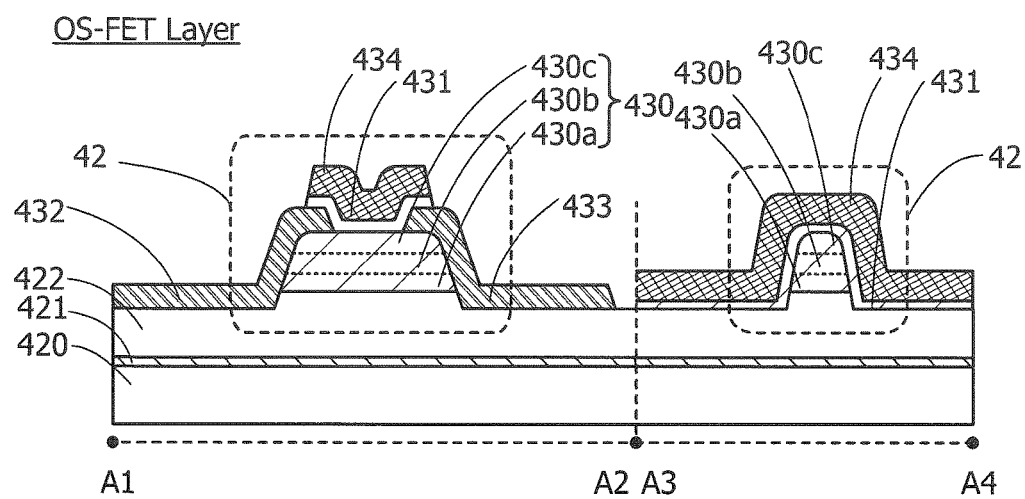
FIGS. 29A and 29B are cross-sectional views illustrating one embodiment of the present invention.
Figure 29B:
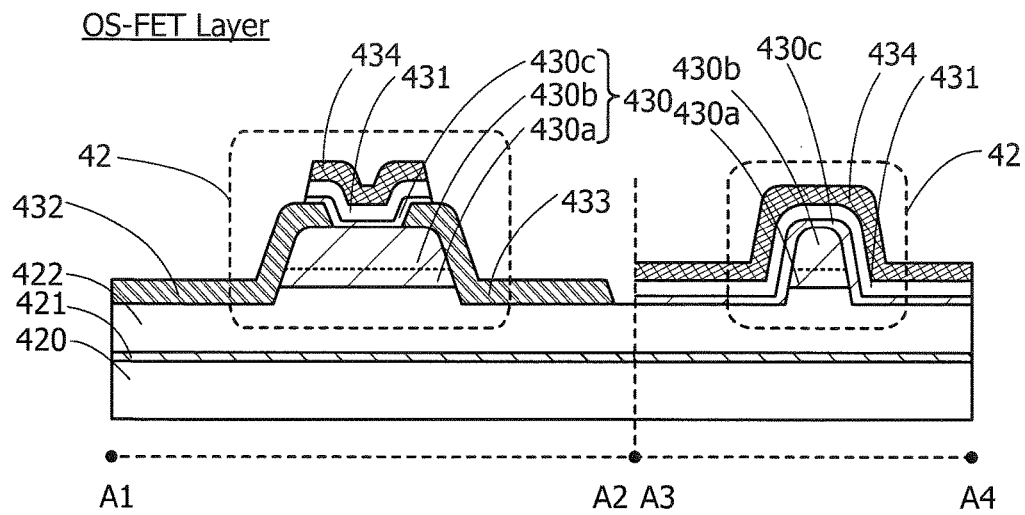

Next, FIGS. 29A and 29B illustrates an example of a cross-sectional structure of the layer 33 including OS transistors described with reference to FIGS. 27A and 27B. In FIGS. 29A and 29B, cross-sectional structures of a transistor 42 included in the layer 33 including OS transistors is illustrated. The cross-sectional structures of the transistor 42 in FIGS. 29A and 29B can be applied to the transistors described in the other embodiments, for example.

In FIGS. 29A and 29B, in a manner similar to that of FIG. 28, a region along dashed line A1-A2 shows a structure of the transistor 42 in the channel length direction, and a region along dashed line A3-A4 shows a structure of the transistor 42 in the channel width direction.

An insulating film 421 having a blocking effect of preventing diffusion of oxygen, hydrogen, and water is provided over an insulating film 420 that is provided over the layer 32 in which a wiring is provided described with reference to FIGS. 27A and 27B. As the insulating film 421 has higher density and becomes denser or has a fewer dangling bonds and becomes more chemically stable, the insulating film 421 has a higher blocking effect. The insulating film 421 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421, and the transistor 42 is provided over the insulating film 422.

The transistor 42 includes, over the insulating film 422, a semiconductor film 430 including an oxide semiconductor, conductive films 432 and 433 functioning as source and drain electrodes and electrically connected to the semiconductor film 430, a gate insulating film 431 covering the semiconductor film 430, and a gate electrode 434 overlapping with the semiconductor film 430 with the gate insulating film 431 positioned therebetween.

Note that in FIG. 29A, the transistor 42 includes at least the gate electrode 434 on one side of the semiconductor film 430, and may further include a gate electrode overlapping with the semiconductor film 430 with the insulating film 422 positioned therebetween.

In the case where the transistor 42 has a pair of gate electrodes, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 29A, the transistor 42 has a single-gate structure where one channel formation region corresponding to one gate electrode 434 is provided. However, the transistor 42 may have a multi-gate structure where a plurality of electrically connected gate electrodes are provided so that a plurality of channel formation regions are included in one active layer.

FIG. 29A illustrates an example in which the semiconductor film 430 included in the transistor 42 includes oxide semiconductor films 430a to 430c that are stacked in this order over the insulating film 422. Note that in one embodiment of the present invention, the semiconductor film 430 of the transistor 42 may be formed using a single-layer metal oxide film.

In the case where the oxide semiconductor film 430b is an In-M-Zn oxide film (M is Ga, Y, Zr, La, Ce, or Nd) and a target having the atomic ratio of metal elements of InM:Zn=$x_1$:$y_1$:$z_1$ is used for forming the oxide semiconductor film 430b, $x_1/y_1$ is preferably greater than or equal to $1/3$ and less than or equal to 6, further preferably greater than or equal to 1 and less than or equal to 6, and $z_1/y_1$ is preferably greater than or equal to $1/3$ and less than or equal to 6, further preferably greater than or equal to 1 and less than or equal to 6. Note that when $z_1/y_1$ is greater than or equal to 1 and less than or equal to 6, a CAAC-OS film as the oxide semiconductor film 430b is easily formed. Typical examples of the atomic ratio of the metal elements of the target are In:M:Zn=1:1:1 and In:M:Zn=3:1:2.

Note that in the case where the oxide semiconductor film 430a and the oxide semiconductor film 430c are an In-M-Zn oxide film (M represents Ga, Y, Zr, La, Ce, or Nd) and a target having the atomic ratio of metal elements of InM:Zn=$x_2$:$y_2$:$z_2$ is used for forming the oxide semiconductor films 430a and 430c, $x_2/y_2$ is preferably less than $x_1/y_1$, and $z_2/y_2$ is preferably greater than or equal to $1/3$ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 430a and 430c. Typical examples of the atomic ratio of the metal elements of the target are In:M:Zn=1:3:2, In:M:Zn=1:3:4, In:M:Zn=1:3:6, and the like.

The insulating film 422 preferably has a function of supplying part of oxygen to the oxide semiconductor films 430a to 430c by heating. It is preferable that the number of defects in the insulating film 422 be small, and typically the spin density of g=2.001 due to a dangling bond of silicon be lower than or equal to $1 \times 10^{18}$ spins/cm$^3$. The spin density is measured by electron spin resonance (ESR) spectroscopy.

The insulating film 422, which has a function of supplying part of the oxygen to the oxide semiconductor films 430a to 430c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 422 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor 42 illustrated in FIG. 29A, the gate electrode 434 overlaps with end portions of the oxide semiconductor film 430b including a channel region that do not overlap with the conductive films 432 and 433, i.e., end portions of the oxide semiconductor film 430b that are in a region different from a region where the conductive films 432 and 433 are located. When the end portions of the oxide semiconductor film 430b are exposed to plasma by etching for forming the end portions, a chlorine radical, a fluorine radical, or other radicals generated from an etching gas are easily bonded to a metal element contained in an oxide semiconductor. For this reason, in the end portions of the oxide semiconductor film, oxygen bonded to the metal element is easily eliminated, so that an oxygen vacancy is easily formed; thus, the oxide semiconductor film easily has n-type conductivity. However, an electric field applied to the end portions can be controlled by controlling the potential of the gate electrode 434 because the end portions of the oxide semiconductor film 430b that do not overlap with the conductive films 432 and 433 overlap with the gate electrode 434 in the transistor 42 illustrated in FIG. 29A. Consequently, current that flows between the conductive films 432 and 433 through the end portions of the oxide semiconductor film 430b can be controlled by the potential applied to the gate electrode 434. Such a structure of the transistor 42 is referred to as a surrounded channel (s-channel) structure.

With the s-channel structure, specifically, when a potential at which the transistor 42 is turned off is supplied to the gate electrode 434, the amount of off-state current that flows between the conductive films 432 and 433 through the end portions can be reduced. For this reason, in the transistor 42, even when the distance between the conductive films 432 and 433 at the end portions of the oxide semiconductor film 430b is reduced as a result of reducing the channel length to obtain high on-state current, the transistor 42 can have low off-state current. Consequently, with the short channel length, the transistor 42 can have high on-state current when in an on state and low off-state current when in an off state.

With the s-channel structure, specifically, when a potential at which the transistor 42 is turned on is supplied to the gate electrode 434, the amount of current that flows between the conductive films 432 and 433 through the end portions of the oxide semiconductor film 430b can be increased. The current contributes to an increase in the field-effect mobility and the on-state current of the transistor 42. When the end portions of the oxide semiconductor film 430b overlap with the gate electrode 434, carriers flow in a wide region of the oxide semiconductor film 430b without being limited to a region in the vicinity of the interface between the oxide semiconductor film 430b and the gate insulating film 431, which results in an increase in carrier mobility the transistor 42. As a result, the on-state current of the transistor 42 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is an index of current drive capability and the apparent field-effect mobility of a saturation region of the transistor.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

Note that the channel width refers to, for example, the length of a portion where a source and a drain face each other in a region where a semiconductor (or a portion where a current flows in a semiconductor when a transistor is on) and a gate electrode overlap with each other, or a region where a channel is formed, in the plan view. In one transistor, channel widths in all regions are not necessarily the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, without accurate information on the shape of a semiconductor, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from the value obtained by calculation using an effective channel width is obtained in some cases.

In the description with FIG. 29A, the structure in which the semiconductor film 430 included in the transistor 42 includes the oxide semiconductor films 430a to 430c stacked in this order is used as an example. As another structure, a structure illustrated in FIG. 29B may also be employed for the semiconductor film 430. As illustrated in FIG. 29B, the oxide semiconductor film 430c included in the semiconductor film 430 may be provided over the conductive films 432 and 433 and overlap with the gate insulating film 431.

<Cross-sectional Structure of Stack Including Layer including Si transistors and Layer including OS Transistors>

Figure 30:
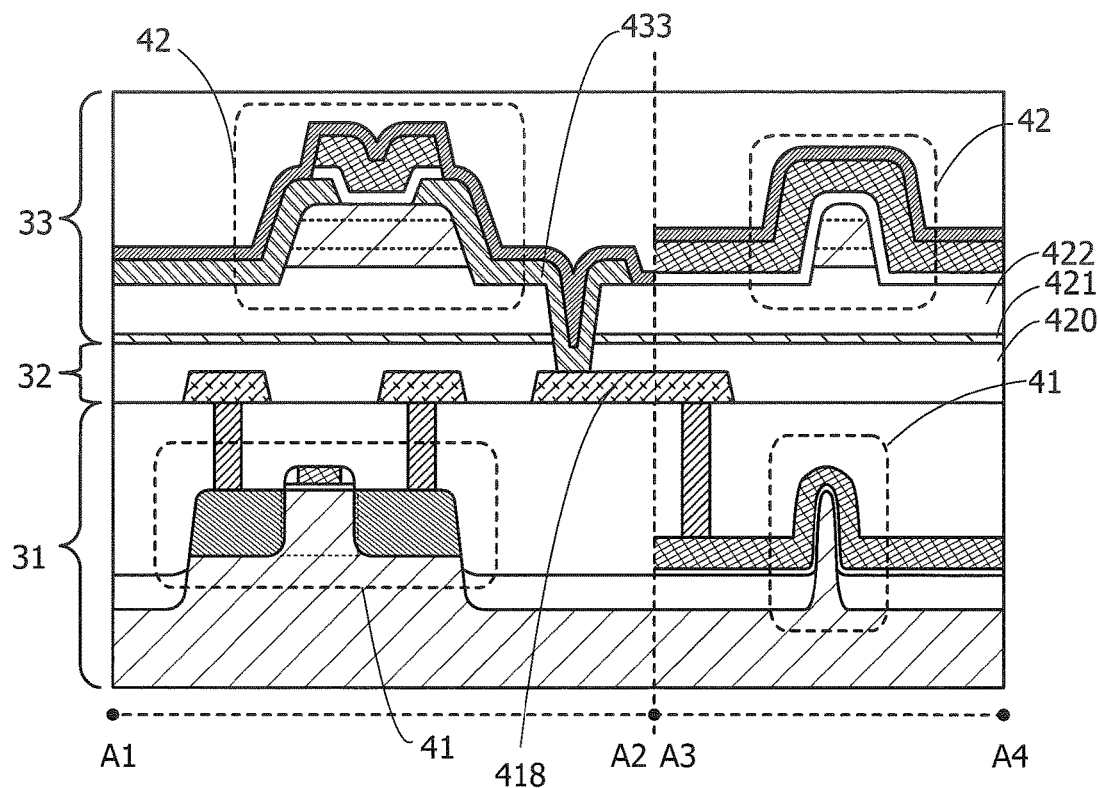
FIG. 30 is a cross-sectional view illustrating one embodiment of the present invention.
Figure 31:
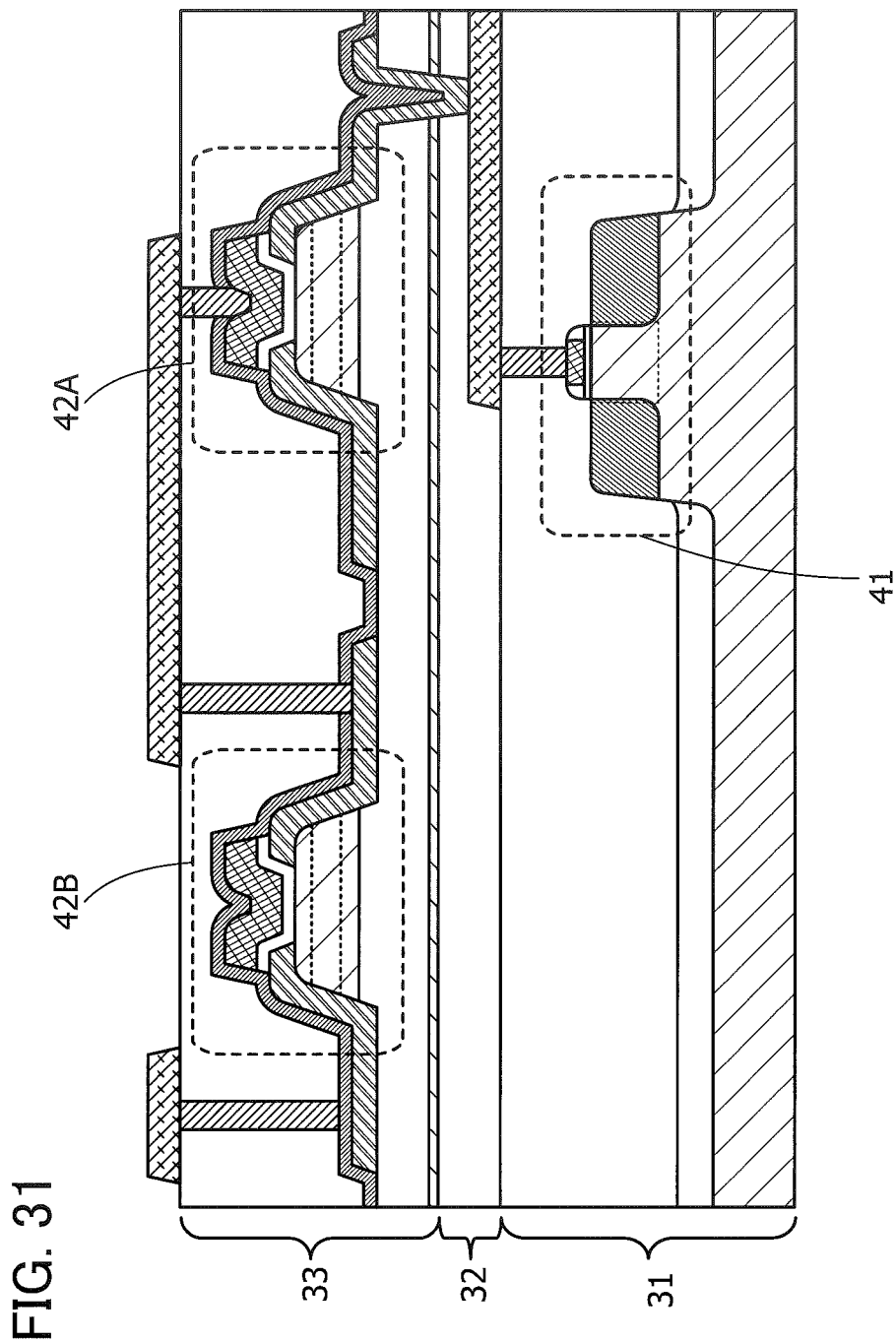
FIG. 31 is a cross-sectional view illustrating one embodiment of the present invention.
Figure 32:
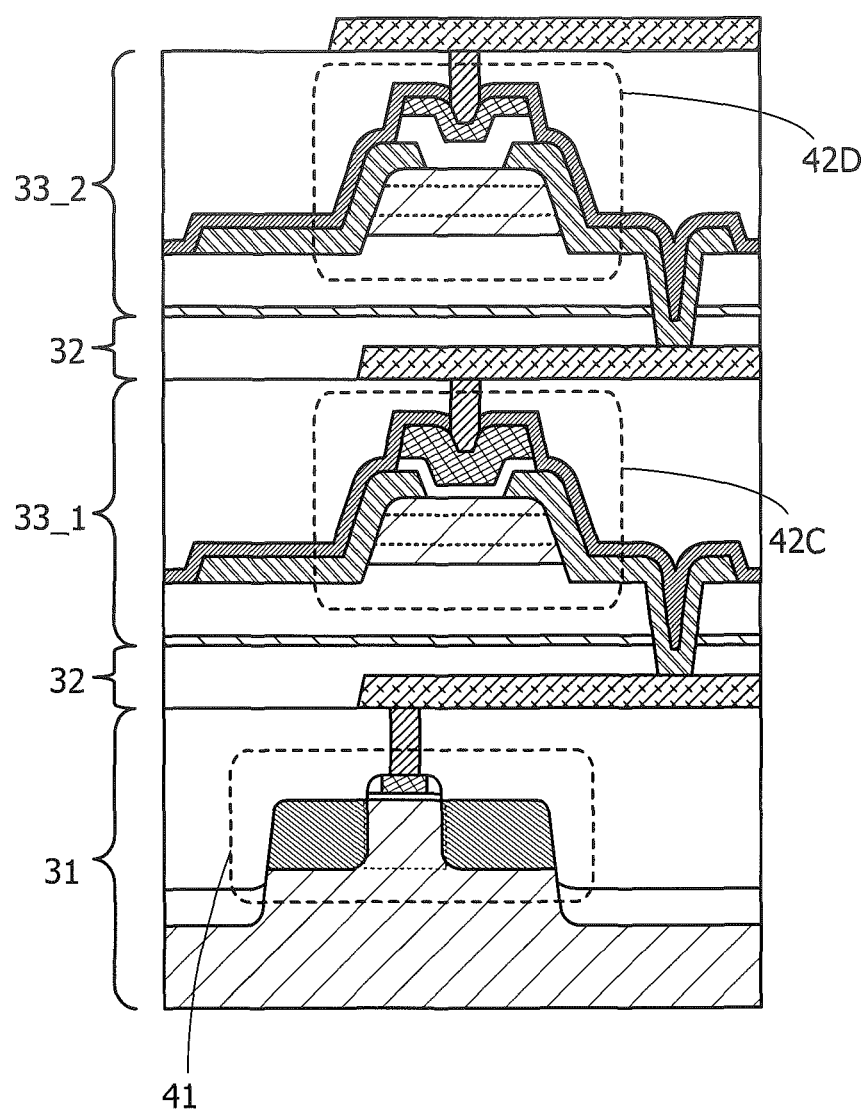
FIG. 32 is a cross-sectional view illustrating one embodiment of the present invention.

Next, FIGS. 30 to 32 illustrate an example of a cross-sectional structure in the case of stacking the layer including Si transistors and the layer in which a wiring is provided, which are described with FIG. 28, and the layer 33 including OS transistors described with FIG. 29A.

FIG. 30 illustrates an example of a cross-sectional structure illustrated in the schematic view of FIG. 27A.

In FIG. 30, in a manner similar to that of FIG. 28 and FIG. 29A, a region along dashed line A1-A2 shows a structure of the transistors 41 and 42 in the channel length direction, and a region along dashed line A3-A4 shows a structure of the transistors 41 and 42 in the channel width direction.

Note that in one embodiment of the present invention, as shown in FIG. 30, the channel length direction of the transistor 41 and the channel length direction of the transistor 42 may not be necessarily consistent with each other.

In FIG. 30, for electrical connection between the transistor 41 and the transistor 42, an opening is provided in the insulating films 420 to 422. The conductive film 433 provided in the opening is connected to the conductive film 418 in the opening.

In the cross-sectional structure illustrated in FIG. 30, as described for FIG. 27A, the transistor 42 including a channel formation region in an oxide semiconductor film is formed over the transistor 41 including a channel formation region in a single crystal silicon substrate. With the structure illustrated in FIG. 30, the channel formation region of the transistor 42 can overlap with the channel formation region of the transistor 41. Accordingly, a semiconductor device including a memory cell with such a structure can have a reduced layout area.

In the case where a plurality of transistors 42 are provided in the layer 33 including OS transistors, the transistors 42 may be provided in the same layer or different layers.

For example, in the case where the transistors 42 are provided in the same layer in the layer 33 including OS transistors, the structure illustrated in FIG. 31 can be formed. In the case where the transistors 42 are provided in different layers in the layer 33 including OS transistors, the layer 33_1 including OS transistors and the layer 33_2 including OS transistors can be separately provided so as to be stacked with the layer 32 in which a wiring is provided placed therebetween. This structure is illustrated in FIG. 69.

In the case of the cross-sectional structure illustrated in FIG. 31, even when the number of OS transistors is increased, only one layer, which is the layer 33 including OS transistors, is required; accordingly, the number of stacked layers can be reduced. In FIG. 31, a transistor 42A and a transistor 42B can be formed at once, for example. Accordingly, the number of steps for manufacturing a semiconductor device can be reduced.

Note that FIG. 31 illustrates a structure of the transistors 41, 42A, and 42B in the channel length direction. The structure in the channel width direction thereof is similar to that illustrated in FIG. 30, and the aforementioned structure can be referred to.

By applying the cross-sectional structure of FIG. 31 to the transistors of Embodiment 1, the transistors 42A and 42B can be manufactured as the transistors 11 and 12. Furthermore, the transistor 13 can also be manufactured similarly. Thus, manufacturing cost of the semiconductor devices can be reduced.

Moreover, with the cross-sectional structure illustrated in FIG. 32, even when the number of OS transistors is increased, the layer 33_1 including OS transistors and the layer 33_2 including OS transistors are separately provided in a plurality of layers; accordingly, an increase in circuit area can be prevented. Therefore, the chip area of a semiconductor device can be reduced.

FIG. 32 illustrates a structure of the transistor 41, a transistor 42C, and a transistor 42D in the channel length direction. The structure in the channel width direction thereof is similar to that illustrated in FIG. 30, and the aforementioned structure can be referred to.

In the cross-sectional structure illustrated in FIG. 32, OS transistors included in the layers 33_1 and 33_2 which include OS transistors in different layers can have different film thicknesses, film qualities, and the like from each other. Thus, transistors with different characteristics can be formed separately. For example, transistors having high switching characteristics owing to reduced thicknesses of a gate insulating films and transistors having high voltage resistance owing to increased thicknesses of gate insulating films can be stacked. Accordingly, the semiconductor device with high performance can be achieved.

For example, the transistors 42C and 42D illustrated in FIG. 32 are transistors corresponding to the OS transistors such as the transistor 11, 12, or 13 among the transistors included in the memory cell explained in Embodiment 1. The transistor 12 is a transistor required of high voltage resistance because high voltage is applied to the gate, and the transistors 11 and 13 are transistors required of switching characteristics because pulse signals are supplied.

In the cross-sectional structure illustrated in FIG. 32, a gate insulating film of the transistor 42C is thin, and a gate insulating film of the transistor 42D is thick. Thus, the transistor 42C with high switching characteristics and the transistor 42D with high voltage resistance can be stacked in the cross-sectional structure illustrated in FIG. 32.

When the structure of the cross-sectional structure of FIG. 32 is applied to each transistor in Embodiment 1, the transistor 42C can be formed as each of the transistors 11 and 13 and the transistor 42D can be separately formed as the transistor 12. Thus, high performance of a semiconductor device including a memory cell can be achieved.

Note that the structures, methods, and the like described in this embodiment can be used as appropriate in combination with any of the structures, methods, and the like described in the other embodiments.

(Embodiment 6)

Although the conductive film and the semiconductor film described in the above embodiments can be formed by sputtering, they may be formed by another method, for example, a thermal CVD method. Examples of a thermal CVD method include metal organic chemical vapor deposition (MOCVD) and atomic layer deposition (ALD).

A thermal CVD method has an advantage that no defect due to plasma damage is generated because it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of a substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For instance, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on the surface of a substrate to form a first single atom layer, and then, the second source gas is introduced to react with the first single atom layer. As a result, a second single atom layer is stacked over the first single atom layer, so that a thin film is formed. The sequence of the gas introduction is repeated multiple times until a desired thickness is obtained, whereby a thin film with excellent step coverage can be formed. The thickness of the thin film can be adjusted by the number of repetitions of the sequence of the gas introduction; therefore, an ALD method makes it possible to accurately adjust a thickness and thus is suitable for manufacturing a minute FET.

The conductive film and the semiconductor film described in the above embodiments can be formed by thermal CVD such as MOCVD or ALD. For example, trimethylindium, trimethylgallium, and dimethylzinc are used to form an InGaZnOx (X>0) film. Note that the chemical formula of trimethylindium is $(CH_3)_3In$. The chemical formula of trimethylgallium is $(CH_3)_3Ga$. The chemical formula of dimethylzinc is $(CH_3)_2Zn$. Without limitation to the above combination, triethylgallium (chemical formula: $(C_2H_5)_3Ga$) can be used instead of trimethylgallium, and diethylzinc (chemical formula: $(C_2H_5)_2Zn$) can be used instead of diethylzinc.

For example, when a tungsten film is formed with a deposition apparatus using ALD, a $WF_6$ gas and a $B_2H_6$ gas are sequentially introduced multiple times to form an initial tungsten film, and then a $WF_6$ gas and an $H_2$ gas are introduced at a time, so that a tungsten film is formed. Note that a $SiH_4$ gas may be used instead of a $B_2H_6$ gas.

When an oxide semiconductor film, for example, an InGaZnOx (X>0) film is formed with a deposition apparatus using ALD, an $In(CH_3)_3$ gas and an $O_3$ gas are sequentially introduced multiple times to form an InO layer, a $Ga(CH_3)_3$ gas and an $O_3$ gas are introduced at a time to form a Ga—O layer, and then a $Zn(CH_3)_2$ gas and an $O_3$ gas are introduced at a time to form a ZnO layer. Note that the order of these layers is not limited to this example. A mixed compound layer such as an $InGaO_2$ layer, an $InZnO_2$ layer, a GaInO layer, a ZnInO layer, or a GaZnO layer, may be formed by mixing of these gases. Although an $H_2O$ gas obtained by bubbling with an inert gas such as Ar may be used instead of an $O_3$ gas, it is preferable to use an $O_3$ gas, which does not contain H. Furthermore, an $In(C_2H_5)_3$ gas may be used instead of an $In(CH_3)_3$ gas. A $Ga(C_2H_5)_3$ gas may be used instead of a $Ga(CH_3)_3$ gas. Moreover, a $Zn(CH_3)_2$ gas may be used.

The structure described above in this embodiment can be combined as appropriate with any of the structures described in the other embodiments.

(Embodiment 7)

In this embodiment, examples of using the semiconductor device described in the foregoing embodiment in an electronic component and an electronic device including the electronic component will be described with reference to FIGS. 33A and 33B and FIGS. 34A to 34E.

Figure 33A:
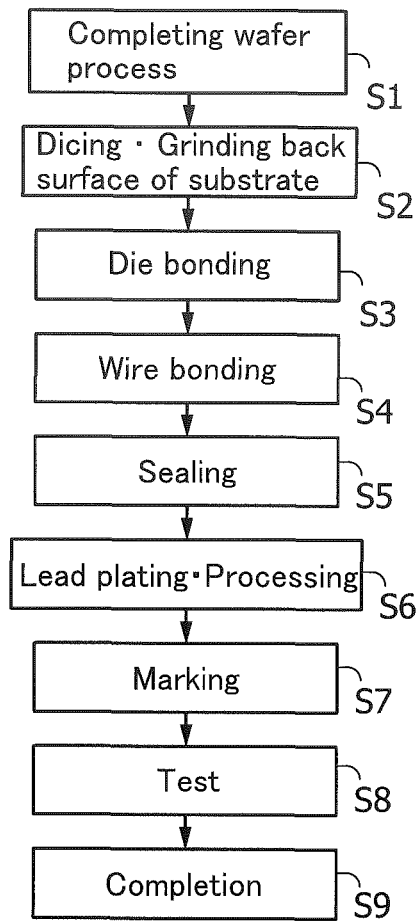
FIGS. 33A and 33B are a flowchart showing manufacturing steps of a semiconductor device and a perspective schematic view of the semiconductor device.

FIG. 33A shows an example where the semiconductor device described in the foregoing embodiment is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

A semiconductor device including the transistors illustrated in FIG. 28 to FIG. 32 of Embodiment 5 is completed by integrating detachable components on a printed circuit board through the assembly process (post-process).

The post-process can be completed through steps shown in FIG. 33A. Specifically, after an element substrate obtained in the preceding process is completed (Step 51), a back surface of the substrate is ground (Step S2). The substrate is thinned in this step to reduce warpage or the like of the substrate in the preceding process and to reduce the size of the component itself.

A dicing step of grinding the back surface of the substrate and separating the substrate into a plurality of chips is performed. Then, a die bonding step of individually picking up separate chips to be mounted on and bonded to a lead frame is performed (Step S3). In this die bonding step, the chip is bonded to the lead frame by an appropriate method depending on a product, for example, bonding with a resin or a tape. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, so that the mounted circuit portion and wire can be protected from external mechanical force and deterioration of characteristics due to moisture or dust can be reduced.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The electronic component described above includes the semiconductor device of the foregoing embodiment. Therefore, the electronic component can include the semiconductor device that can store multilevel data. Accordingly, the electronic component has improved storage capacity.

Figure 33B:
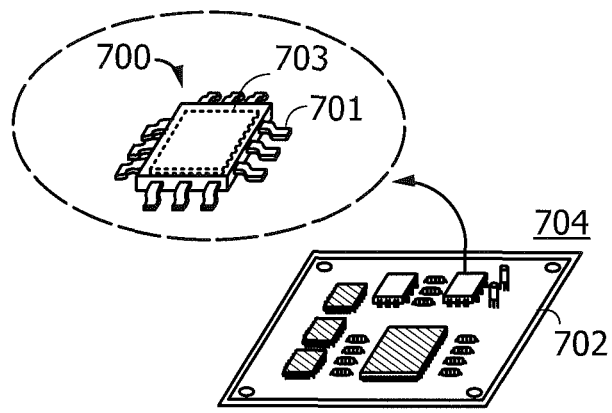

FIG. 33B is a perspective schematic diagram of a completed electronic component. FIG. 33B shows a perspective schematic diagram of a quad flat package (QFP) as an example of the electronic component. An electronic component 700 illustrated in FIG. 33B includes a lead 701 and a semiconductor device 703. The electronic component 700 in FIG. 33B is, for example, mounted on a printed circuit board 702. A plurality of electronic components 700 are used in combination and electrically connected to each other over the printed wiring board 702; thus, a substrate on which the electronic components are mounted (a circuit board 704) is completed. The completed circuit board 704 is provided in an electronic device or the like.

Next, the description is made on applications of the above electronic component to electronic devices such as a computer, a portable information appliance (including a mobile phone, a portable game machine, and an audio reproducing device), electronic paper, a television device (also referred to as television or television receiver), and a digital video camera.

Figure 34A:
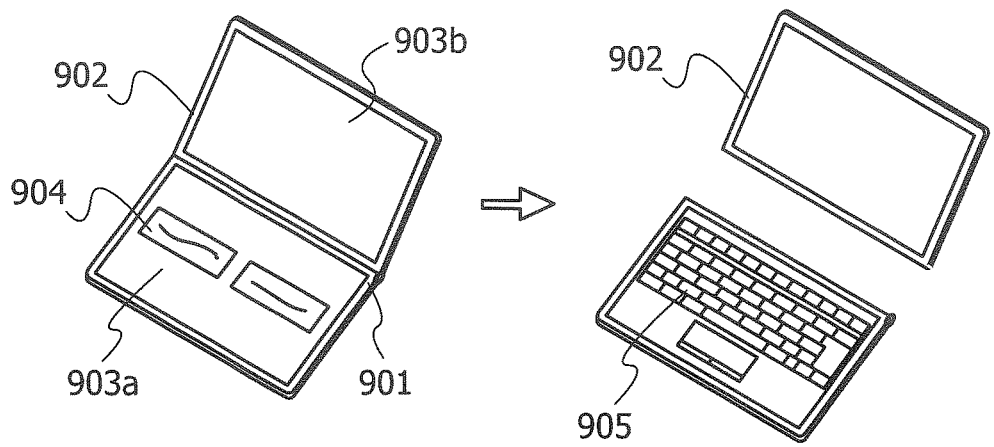
FIGS. 34A to 34E each illustrate an electronic device including a semiconductor device.

FIG. 34A illustrates a portable information appliance that includes a housing 901, a housing 902, a first display portion 903a, a second display portion 903b, and the like. At least one of the housings 901 and 902 includes the circuit board including the semiconductor device of the foregoing embodiment. Thus, it is possible to obtain a portable information appliance with improved storage capacity.

Note that the first display portion 903a is a panel having a touch input function, and for example, as illustrated in the left of FIG. 33A, which of "touch input" and "keyboard input" is performed can be selected with a selection button 904 displayed on the first display portion 903a. Since selection buttons with a variety of sizes can be displayed, the information appliance can be easily used by people of any generation. For example, when "keyboard input" is selected, a keyboard 905 is displayed on the first display portion 903a as illustrated in the right of FIG. 33A. Thus, letters can be input quickly by key input as in the case of using a conventional information appliance, for example.

One of the first display portion 903a and the second display portion 903b can be detached from the portable information appliance as shown in the right of FIG. 33A. Providing the second display portion 903b with a touch input function makes the information appliance convenient to carry because the weight can be further reduced and the information appliance can be operated with one hand while the other hand supports the housing 902.

The portable information appliance in FIG. 34A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance illustrated in FIG. 34A may transmit and receive data wirelessly. Through wireless communication, desired book data or the like can be purchased and downloaded from an e-book server.

In addition, the housing 902 illustrated in FIG. 34A may be equipped with an antenna, a microphone function, or a wireless communication function to be used as a mobile phone.

Figure 34B:
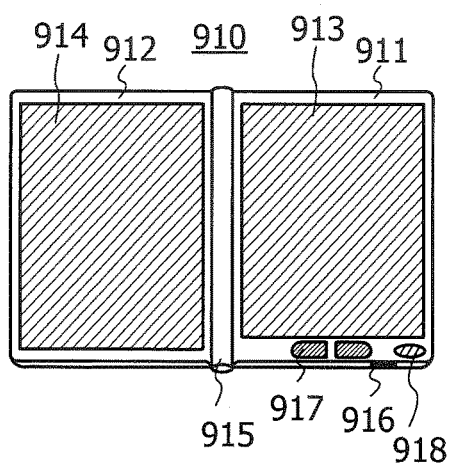

FIG. 34B illustrates an e-book reader 910 in which electronic paper is incorporated. The e-book reader 910 has two housings of a housing 911 and a housing 912. The housing 911 and the housing 912 are provided with a display portion 913 and a display portion 914, respectively. The housings 911 and 912 are connected by a hinge 915 and can be opened or closed with the hinge 915 as an axis. The housing 911 is provided with a power switch 916, an operation key 917, a speaker 918, and the like. The circuit board including the semiconductor device of the foregoing embodiment is provided in at least one of the housings 911 and 912. Consequently, it is possible to obtain an e-book reader with improved storage capacity.

Figure 34C:
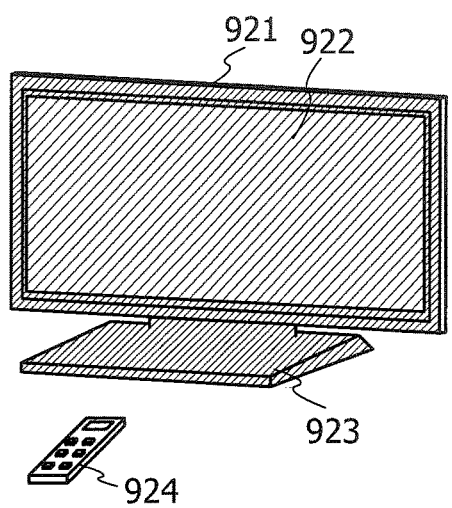

FIG. 34C illustrates a television device including a housing 921, a display portion 922, a stand 923, and the like. The television device 920 can be operated with a switch of the housing 921 and a separate remote controller 924. The circuit board including the semiconductor device of the foregoing embodiment is mounted on the housing 921 and the remote controller 924. Thus, it is possible to obtain a television device with improved storage capacity.

Figure 34D:
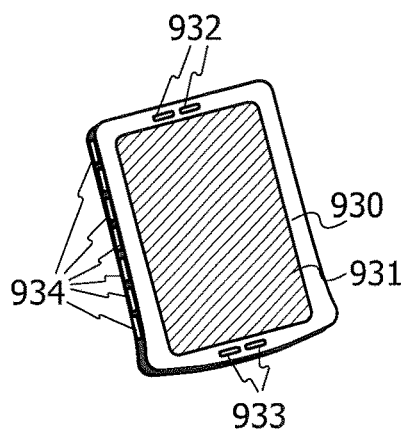

FIG. 34D illustrates a smartphone in which a main body 930 is provided with a display portion 931, a speaker 932, a microphone 933, operation buttons 934, and the like. The circuit board including the semiconductor device of the foregoing embodiment is provided in the main body 930. Thus, it is possible to obtain a smartphone with improved storage capacity.

Figure 34E:
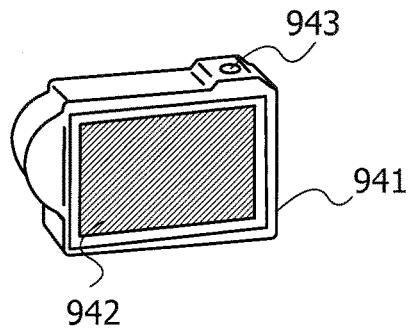

FIG. 34E illustrates a digital camera including a main body 941, a display portion 942, an operation switch 943, and the like. The circuit board including the semiconductor device of the foregoing embodiment is provided in the main body 941. Thus, it is possible to obtain a digital camera with improved storage capacity.

As described above, the electronic devices shown in this embodiment incorporate the circuit board including the semiconductor device of the foregoing embodiment. Consequently, it is possible to obtain the electronic devices with improved storage capacity.

Reference Numerals

11: transistor, 12: transistor, 13: transistor, 14: transistor, 15: transistor, 21: capacitor, 31: layer including Si transistor, 32: layer in which wiring is provided, 33: layer including OS transistor, 33_1: layer including OS transistor, 33_2: layer including OS transistor, 41: transistor, 42: transistor, 42A: transistor, 42B: transistor, 42C: transistor, 42D: transistor, 100: pellet, 100a: pellet, 100b: pellet, 101: ion, 110: RAM, 111: row selection driver, 112: column selection driver, 113: decoder, 114: read write control circuit, 120: substrate, 121: decoder, 122: resistor, 123: comparator, 125: counter, 130: target, 210: electron gun chamber, 212: optical system, 214: sample chamber, 216: optical system, 218: camera, 220: observation chamber, 222: film chamber, 224: electron, 228: substance, 229: fluorescent plate, 310e: conductive film, 316b: conductive film, 319: conductive film, 400: substrate, 401: element isolation region, 402: impurity region, 403: impurity region, 404: channel formation region, 405: insulating film, 406: gate electrode, 411: insulating film, 412: conductive film, 413: conductive film, 414: conductive film, 416: conductive film, 417: conductive film, 418: conductive film, 420: insulating film, 421: insulating film, 422: insulating film, 430: semiconductor film, 430a: oxide semiconductor film, 430b: oxide semiconductor film, 430c: oxide semiconductor film, 431: gate insulating film, 432: conductive film, 433: conductive film, 434: gate electrode, 700: electronic component, 701: lead, 702: printed circuit board, 703: semiconductor device, 704: circuit board, 901: housing, 902: housing, 903a: display portion, 903b: display portion, 904: selection button, 905: keyboard, 910: e-book reader, 911: housing, 912: housing, 913: display portion, 914: display portion, 915: hinge, 916: power supply source, 917: operation key, 918: speaker, 920: television device, 921: housing, 922: display portion, 923: stand, 924: separate remote controller, 930: main body, 931: display portion, 932: speaker, 933: microphone, 934: operation button, 941: main body, 942: display portion, 943: operation switch.

The invention claimed is:

1. A semiconductor device comprising:
a first transistor;
a second transistor;
a third transistor;
a fourth transistor; and
a capacitor,
wherein a gate of the first transistor is electrically connected to a first wiring,
wherein one of a source and a drain of the first transistor is electrically connected to a second wiring,
wherein a gate of the second transistor is electrically connected to the other of the source and the drain of the first transistor,
wherein one of a source and a drain of the second transistor is electrically connected to a third wiring,
wherein a gate of the third transistor is electrically connected to a fourth wiring,
wherein one of a source and a drain of the third transistor is electrically connected to the other of the source and the drain of the second transistor,
wherein the other of the source and the drain of the third transistor is electrically connected to a fifth wiring,
wherein a gate of the fourth transistor is electrically connected to the other of the source and the drain of the second transistor,
wherein one of a source and a drain of the fourth transistor is electrically connected to a sixth wiring,
wherein the other of the source and the drain of the fourth transistor is electrically connected to a seventh wiring,
wherein one electrode of the capacitor is electrically connected to the gate of the second transistor,
wherein the other electrode of the capacitor is electrically connected to an eighth wiring,
wherein the first wiring is configured to transmit a first signal,
wherein the second wiring is configured to transmit a second signal,
wherein the third wiring is configured to transmit a first potential,
wherein the fourth wiring is configured to transmit a third signal,
wherein the fifth wiring is configured to transmit a second potential,
wherein the sixth wiring is configured to supply current in accordance with a potential of the gate of the fourth transistor,
wherein the seventh wiring is configured to supply current in accordance with a potential of the gate of the fourth transistor,
wherein the eighth wiring is configured to transmit a fourth signal,
wherein the first signal is configured to bring the first transistor into a conduction state to supply a potential of the second signal to the gate of the second transistor,
wherein the first signal is configured to bring the first transistor into a non-conduction state so that the potential of the second signal is held in the gate of the second transistor,
wherein the fourth signal is configured to lower a potential of the gate of the second transistor and changing the conduction state of the second transistor to supply the first potential to the gate of the fourth transistor,
wherein the third signal is configured to bring the third transistor into the conduction state to supply the second potential to the gate of the fourth transistor,
wherein a semiconductor layer of each of the first transistor, the second transistor, and the third transistor includes an oxide semiconductor, and
wherein a semiconductor layer of the fourth transistor includes silicon.

2. The semiconductor device according to claim 1, wherein a channel region of each of the first transistor, the second transistor, and the third transistor includes a region overlapping with a channel region of the fourth transistor.

3. The semiconductor device according to claim 1, wherein the fourth transistor is a p-channel transistor.

4. The semiconductor device according to of claim 1, wherein a thickness of a gate insulating film of the first transistor and the second transistor is greater than a thickness of a gate insulating film of the third transistor.

5. An electronic component comprising:
the semiconductor device according to of claim 1; and
a lead electrically connected to the semiconductor device.

6. An electronic device comprising:
the electronic component according to claim 5; and
a display device.

7. A semiconductor comprising:
a first transistor;
a second transistor;
a third transistor;
a fourth transistor;
a fifth transistor; and
a capacitor,
wherein a gate of the first transistor is electrically connected to a first wiring,
wherein one of a source and a drain of the first transistor is electrically connected to a second wiring, wherein a gate of the second transistor is electrically connected to the other of the source and the drain of the first transistor, wherein one of a source and a drain of the second transistor is electrically connected to a third wiring, wherein a gate of the third transistor is electrically connected to a fourth wiring, wherein one of a source and a drain of the third transistor is electrically connected to the other of the source and the drain of the second transistor, wherein the other of the source and the drain of the third transistor is electrically connected to a fifth wiring, wherein a gate of the fourth transistor is electrically connected to the other of the source and the drain of the second transistor, wherein one of a source and a drain of the fourth transistor is electrically connected to a sixth wiring, wherein one electrode of the capacitor is electrically connected to the gate of the second transistor, wherein the other electrode of the capacitor is electrically connected to an eighth wiring, wherein a gate of the fifth transistor is electrically connected to a ninth wiring, wherein one of a source and a drain of the fifth transistor is electrically connected to the other of the source and the drain of the fourth transistor, wherein the other of the source and the drain of the fifth transistor is electrically connected to a seventh wiring, wherein the first wiring is configured to transmit a first signal, wherein the second wiring is configured to transmit a second signal, wherein the third wiring is configured to transmit a first potential, wherein the fourth wiring is configured to transmit a third signal, wherein the fifth wiring is configured to transmit a second potential, wherein the sixth wiring is configured to supply current in accordance with a potential of the gate of the fourth transistor and a conduction state of the fifth transistor, wherein the seventh wiring is configured to supply current in accordance with a potential of the gate of the fourth transistor and a conduction state of the fifth transistor, wherein the eighth wiring is configured to transmit a fourth signal, wherein the ninth wiring is configured to transmit a fifth signal, wherein the first signal is configured to bring the first transistor into a conduction state to supply a potential of the second signal to the gate of the second transistor, wherein the first signal is configured to bring the first transistor into a non-conduction state so that the potential of the second signal is held in the gate of the second transistor, wherein the fourth signal is configured to lower a potential of the gate of the second transistor and changing the conduction state of the second transistor to supply the first potential to the gate of the fourth transistor, wherein the third signal is configured to bring the third transistor into the conduction state to supply the second potential to the gate of the fourth transistor, wherein the fifth signal is configured to bring the fifth transistor into the conduction state to control current flowing through the fourth transistor and the fifth transistor, wherein a semiconductor layer of each of the first transistor, the second transistor, and the third transistor includes an oxide semiconductor, and wherein a semiconductor layer of each of the fourth transistor and the fifth transistor includes silicon.

8. The semiconductor device according to claim 7, wherein a channel region of each of the first transistor, the second transistor, and the third transistor includes a region overlapping with a channel region of each of the fourth transistor and the fifth transistor.

9. The semiconductor device according to claim 7, wherein the fourth transistor and the fifth transistor are p-channel transistors.

10. The semiconductor device according to of claim 7, wherein a thickness of a gate insulating film of the first transistor and the second transistor is greater than a thickness of a gate insulating film of the third transistor.

11. An electronic component comprising:
the semiconductor device according to of claim 7; and
a lead electrically connected to the semiconductor device.

12. An electronic device comprising:
the electronic component according to claim 11; and
a display device.

* * * * *